United States Patent [19]
Joko et al.

[11] Patent Number: 5,939,861
[45] Date of Patent: Aug. 17, 1999

[54] CONTROL SYSTEM FOR ON-VEHICLE BATTERY

[75] Inventors: Isao Joko, Hino; Tetsuo Koike, Hachiouji; Koichi Yamaguchi, Machida; Atsushi Masuda, Kiyose; Kunitoshi Shimizu, Tachikawa, all of Japan

[73] Assignee: Hino Jidosha Kogyo Kabushiki Kaisha, Hino, Japan

[21] Appl. No.: 09/012,644

[22] Filed: Jan. 23, 1998

Related U.S. Application Data

[63] Continuation of application No. PCT/JP97/01728, May 23, 1997.

[30] Foreign Application Priority Data

| | | | |
|---|---|---|---|
| May 24, 1996 | [JP] | Japan | 8-130333 |
| Jun. 7, 1996 | [JP] | Japan | 8-146108 |
| Jun. 14, 1996 | [JP] | Japan | 8-154344 |
| Jun. 14, 1996 | [JP] | Japan | 8-154374 |
| Jun. 17, 1996 | [JP] | Japan | 8-155700 |

[51] Int. Cl.$^6$ .................................................. H02J 7/00
[52] U.S. Cl. .................... 320/122; 320/119; 320/149; 290/40 R; 322/17
[58] Field of Search ......................... 320/122, 132, 320/119, 149, DIG. 34; 290/19, 40 R; 322/17–37

[56] References Cited

U.S. PATENT DOCUMENTS

| | | | |
|---|---|---|---|
| 4,536,697 | 8/1985 | Johnston et al. | 322/14 |
| 5,053,632 | 10/1991 | Suzuki et al. . | |
| 5,283,470 | 2/1994 | Hadley et al. | 290/45 |
| 5,371,682 | 12/1994 | Levine et al. | 364/483 |
| 5,539,318 | 7/1996 | Sasaki | 324/428 |
| 5,563,491 | 10/1996 | Tseng | 320/109 |
| 5,606,242 | 2/1997 | Hull et al. | 320/106 |
| 5,623,194 | 4/1997 | Boll et al. | 320/137 |
| 5,677,615 | 10/1997 | Takano et al. | 320/152 |
| 5,703,464 | 12/1997 | Karunasiri et al. | 320/125 |
| 5,703,469 | 12/1997 | Kinoshita | 340/636 |
| 5,751,137 | 5/1998 | Kiuchi et al. | 322/14 |
| 5,765,656 | 6/1998 | Weaver | 180/65.3 |
| 5,786,640 | 7/1998 | Sakai et al. | 290/17 |

FOREIGN PATENT DOCUMENTS

| | | |
|---|---|---|
| 60-245402 | 12/1985 | Japan . |
| 3-115478 | 11/1991 | Japan . |
| 4-368401 | 12/1992 | Japan . |
| 5-219608 | 8/1993 | Japan . |
| 6-283210 | 10/1994 | Japan . |
| 7-169510 | 7/1995 | Japan . |
| 7-230830 | 8/1995 | Japan . |
| 7-312804 | 11/1995 | Japan . |

*Primary Examiner*—Peter S. Wong
*Assistant Examiner*—Gregory J. Toatley, Jr.
*Attorney, Agent, or Firm*—Pillsbury Madison & Sutro LLP

[57] ABSTRACT

Charging and discharging of a battery are controlled while observing the state of the battery, thereby improving its efficiency and increasing battery service life. A program control circuit acquires vehicle speed from a vehicle speed sensor and the rotational speed of the internal combustion engine from a rotation sensor. The program control circuit controls an inverter which performs AC-to-DC or DC-to-AC conversion between a motor-generator coupled to the internal combustion engine and a battery mounted on the vehicle. At the same time, the program control circuit acquires the charging and discharging current (i) of the battery, which is detected by a current sensor, and calculates the time integral I of the charging and discharging current (i). The circuit controls the charging current to the battery during regenerative braking, and the discharge current when the vehicle is being driven, in accordance with a function of the time integral I. The overall life of the battery can be lengthened, and the energy lost by the brakes can be most effectively regenerated. Moreover, even if there is variability in the characteristics of the unit cells, its increase can be held in check. In addition, battery costs can be reduced and maintenance simplified.

15 Claims, 37 Drawing Sheets

CONTROL SYSTEM FOR ON-VEHICLE BATTERY

This is a continuation of International Appln. No. PCT/JP97/01728 filed May 23, 1997.

TECHNICAL FIELD

The present invention can be utilised for an electric vehicle which uses an electric motor for driving power. It relates to controlling the charging and discharging of a rechargeable vehicle-mounted battery, to displaying the state of the battery, and to displaying information relating to the battery replacement time. The present invention has been developed for a hybrid car which makes combined use of an internal combustion engine and an electric motor for driving power, and it can be widely utilised in vehicles in which a rechargeable battery is mounted and which utilise the energy of this battery for running.

BACKGROUND TECHNOLOGY

The present assignee developed, and now manufactures and sells, a hybrid car called the HIMR which makes combined use of an internal combustion engine and an electric motor. In this vehicle, a three-phase alternating current squirrel-cage induction machine is coupled to the crankshaft of an internal combustion engine as a motor-generator, a large battery is mounted on the vehicle. This battery and squirrel-cage induction machine are connected by a bidirectional inverter, and the inverter is controlled by a program control circuit (see WO88/06107).

With this system, when the vehicle accelerates, the rotating magnetic field applied to the squirrel-cage induction machine is controlled so that the squirrel-cage induction machine constitutes an electric motor, and when the vehicle decelerates, the rotating magnetic field applied to the squirrel-cage induction machine is controlled so that the squirrel-cage induction machine constitutes a generator. The control performed by this system is such that when the squirrel-cage induction machine is utilized as an electric motor, the battery discharges, and when it is used as a generator, the battery charges. In other words, this system is controlled to provide regenerative braking.

This system has been mounted on large buses and has attracted favourable comment in application to buses on urban routes and to buses operating in regions where it is essential to keep pollution extremely low. In recent years, pollution from the exhaust of vehicle with internal combustion engines has become a major problem, vehicles prices have risen, and fuel has become quite expensive. This has lead to the discussion of the possibility that most vehicles being run in urban areas will become electric vehicles.

The HIMR described above is arranged used to provide a battery compartment in the vehicle, and to use batteries with a terminal voltage of 12V as unit cells. Such batteries are mass produced and therefore inexpensive to procure. Twenty-five are mounted in the battery compartment and connected electrically in series to give an overall terminal voltage of 25×12V=300V. This arrangement is utilized as a battery for supplying energy for running the vehicle.

The term "unit cell" here signifies the unit which, when a multiplicity are connected in series, comprises the battery for supplying energy to run the vehicle. For example, although in the case of a lead storage battery the chemical properties dictate that the terminal voltage of the smallest unit cell is 2V, a commercial battery generally comprises a plurality of these 2V cells connected in series and housed in one casing. For example, in the case of a lead storage battery, the terminal voltage of the unit cell can be 2V, 4V, 6V, 12V, 24V and so forth. For other kinds of battery, the terminal voltage of the unit cell is determined by the chemical properties of the cell and by the number of cells connected in series.

The present applicant has filed an International Patent Application (see PCT/JP96/00966 and WO96/32651) relating to the monitoring of unit cells.

The present inventors have been able to obtain a large number of records relating to the running and maintenance of the above-mentioned HIMR vehicles. Because batteries gradually deteriorate with repeated charging and discharging, they have to be replaced after a certain time. However, in the prior art the life of a battery was not taken into consideration in the control of charging and discharging. In other words, hitherto the control of charging and discharging of the batteries of an electric vehicle has been performed in accordance with the running conditions of the vehicle, but without communicating the present state of the battery to the control system and taking the state of the battery into consideration.

This will now be explained in greater detail. If it is supposed for example that the standard terminal voltage of a battery is 300V as described above, then there is a danger of damage to the battery if the terminal voltage exceeds a prescribed limit (e.g., 380V) during charging under regenerative braking. Hitherto, therefore, control has been performed to ensure that this limit is not exceeded. However, this limit is actually the safety margin for when the battery is well charged, whereas when it is not well charged, the battery can be efficiently charged at an even higher terminal voltage. This means that when the brake pedal is depressed and the vehicle is being braked, energy which would otherwise end up being dissipated as frictional heat of the brake shoes can be utilised as energy for recharging the battery by further regenerative braking.

In a hybrid vehicle, a similar situation applies when the accelerator pedal is depressed and the vehicle is accelerating. Namely, during acceleration the required torque is apportioned between the internal combustion engine and the electric motor, but it is anticipated that it will be possible to have a control system whereby, for a given amount of accelerator pedal displacement (i.e., for a given torque requirement), if the battery is well charged, the burden on the internal combustion engine is reduced by increasing the discharge current, whereas if the battery is not well charged, the burden on the battery is reduced and the burden on the internal combustion engine is increased.

More detailed observations have shown that if for example twenty-five unit cells connected in series are discharged, energy is not released uniformly from all twenty-five unit cells. Furthermore, when charging, not all the unit cells charged equally. This is easily understood in terms of electrical characteristics by assuming that the internal resistance (R) of the individual unit cells is not equal. Because the unit cells are connected in series, the current (I) will be equal, but during charging and discharging the charging or discharging energy per unit time (I2R) will not be equal. A unit cell with a higher internal resistance will have a higher terminal voltage during charging than other unit cells, and conversely will have a lower terminal voltage than other unit cells during discharge. If in practice the unit cells are assumed to be uniform and are all repeatedly charged and discharged at a standard or rated voltage, a cell with a high internal resistance will end up being insufficiently charged during charging, with the result that this unit cell alone will undergo accelerated deterioration. Despite being charged and discharged on the basis of series connection, a unit cell with a high internal resistance will also acquire an elevated cell temperature, with the result that its characteristics will differ from those of other unit cells, and again this unit cell will end up deteriorating before other unit cells.

In other words, it has been discovered that an important factor for extending battery life is to determine the maximum value of the charging current or the maximum value of the discharge current not just in accordance with the state of the overall battery but also in accordance with the state of individual unit cells.

The inventor has carried out various trials such as housing unit cells from the same production lot in one battery compartment. It was discovered that even if the characteristics of the unit cells are uniform in a new vehicle, when the vehicle has been used for a long period of time they exhibit variability, and non-uniform deterioration accelerates. In general it is not individual unit cells of a battery which are replaced, but rather all the unit cells are replaced simultaneously. It is therefore evident that employing uniform conditions to control the entire battery is a cause of shortened battery life. Moreover, the use and subsequent disposal of large numbers of batteries will constitute a new source of pollution.

In the International Patent Application noted above (PCT/JP96/00966), by providing each unit cell comprising a high-voltage battery with a detection unit incorporating a detection sensor, the amount of charging could be monitored for individual unit cells and the deterioration of a unit cell could be discovered at an early stage. However, given the large number of unit cells to which the detection unit has to be fitted, the inventor has made further studies of the structure whereby the detection unit is mounted, with a view to making the mounting operation more efficient.

Hitherto, the state of charging of the battery mounted in the hybrid car described above or in an electric vehicle has been observed by means of:

1) terminal voltage of the battery,
2) battery voltage×current×time,
3) specific gravity of the electrolyte, whereupon the state of charging (whether well charged or not well charged) has been displayed.

As mentioned above, by providing each unit cell comprising a high-voltage battery with a detection unit incorporating a detection sensor, the amount of charging can be monitored for each unit cell and the state of charging of a unit cell can be confirmed. Nevertheless, this arrangement is limited to monitoring the state of charging. Namely, as in the case of refuelling it gives the user a yardstick for judging whether or not it is necessary to charge the battery which supplies the driving energy, and for judging what distance can still be travelled without charging, but it is not an arrangement which can tell whether a unit cell which has been charged under normal conditions will be capable of withstanding future use. In other words, it does not observe the life of the battery as such.

This point will be explained from a different angle. Simply monitoring the terminal voltage leads to the possibility that despite a battery being in a charged state, that battery could actually have deteriorated, in which case its charging capacity (ampere×hour) could in fact be small. In other words, the distance which the vehicle could actually travel once the battery was charged might be short, which could lead to a situation in which the vehicle is stranded on the road and unable to travel any further.

The driver has to leave the driving seat and open an inspection door in order to discover the state of charging of the battery. Such a confirmatory operation is inconvenient, and it is preferable for the state of charging of the battery to be displayed at the driving seat.

A battery deteriorates gradually with repeated charging and discharging, and therefore has to be replaced after a certain time. A careful study of maintenance records has shown that even for buses operating on routes involving relatively uniform driving conditions, battery life is by no means uniform and has a large variability. It was also noticed that although charging and discharging were carried out on a large number of series-connected unit cells, each unit cell exhibited individual characteristics. In other words, despite the unit cells being connected in series, charging and discharging were not carried out uniformly.

Against such a background, it is an object of the present invention to control the charging and discharging current of cells while observing the state of cells, so as to improve the charging and discharging efficiency and increase the specification life of the cells. It is a further object of the present invention to lengthen the overall life of a battery. It is yet another object of the present invention to regenerate as much as possible of the energy lost by the brakes. It is another object of the present invention to provide a control system capable of performing control in such manner that, when a multiplicity of unit cells are used in series electrical connection, any variability in the characteristics of these unit cells is not increased by long-term use, and cell deterioration is uniform. It is a further object of the present invention to lower the cost of a battery for an electric vehicle. It is yet another object of the present invention to simplify battery maintenance.

A further object of the present invention is to provide a vehicle-mounted battery to which detection units can be fitted easily and securely. Yet another object of the present invention is to provide a vehicle-mounted battery such that less time is required to fit or remove the detection units. It is a further object of the present invention to provide a vehicle-mounted battery wherein a detection unit is set into the casing of a unit cell, and the connection and disconnection of connection cables is more convenient. It is a further object of the present invention to provide means whereby, when a cell is replaced, the detection unit is not discarded along with the cell, but can be further utilised.

It is a further object of the present invention to provide means capable of displaying at the driver's seat a charging warning and the residual amount of charging, and additionally capable of displaying at the driver's seat, in broad subdivisions, the replacement time of the battery itself. It is yet another object of the present invention to provide means whereby the time or distance over which travel is possible before battery replacement can be estimated by constantly monitoring, at the driver's seat, the replacement time of the battery. It is a further object of the present invention to provide means whereby it is possible to avoid a situation of the sort where the time for battery replacement has been missed and the vehicle suddenly stops running while still on the road. It is another object of the present invention to provide means whereby cells can receive frequent maintenance and battery life as a whole can be extended. It is yet another object of the present invention to decrease the proportion of discarded cells and thereby abate pollution.

SUMMARY OF THE INVENTION

A first aspect of the present invention is characterised in that it sets a maximum value for the charging current or a maximum value for the discharge current in accordance with the charging and discharging state of each unit cell mounted on a vehicle, and performs charging control according to this value.

Namely, it is characterised in that it has a motor-generator coupled to the drive shaft of a vehicle, a battery mounted on this vehicle, an inverter provided between this battery and the motor-generator, said inverter transmitting energy in both directions, and inverter control means for controlling this inverter; and has a battery sensor for detecting the state of the battery, including the aforementioned charging and discharging current (i) of the battery; and has a program control circuit comprising means for calculating the time integral of the charging and discharging current (i):

$$I = \int i\, dt + C$$

(where C is the integration constant corresponding to the initial amount of charging), and means which controls the charging current to the battery during regenerative braking and the discharge current when the vehicle is being driven, in accordance with a function of the time integral.

The motor-generator is preferably a polyphase alternating current rotating machine and has a speed sensor for detecting the speed at which the vehicle is travelling, and a rotation sensor for detecting the speed of rotation of the motor-generator. The inverter control means preferably comprises means for sending a control output to the inverter in accordance with the outputs of the speed sensor and the rotation sensor, and in accordance with driver-operated inputs. The battery sensor preferably comprises means for detecting the temperature ($\theta$) of the battery. The aforementioned function of the integral is preferably $\eta I$ where $\eta$ is the charging efficiency of the battery, and this efficiency $\eta$ is preferably a function $\eta(\theta)$ of the aforementioned temperature.

It is also preferable to comprise, between the battery sensor and the program control circuit, an interface circuit for transmitting information output from this sensor by means of a radio signal. Furthermore, it is preferable for the battery sensor to comprise means for detecting the terminal voltages of the unit cells individually, and for the program control circuit to comprise means for controlling the charging current during regenerative braking in accordance with these terminal voltages, and means for controlling the discharge current during driving of the vehicle in accordance with these terminal voltages.

The inverter control means receives the following detection signals: from the speed sensor, the speed at which the vehicle is travelling; from the rotation sensor, the speed of rotation of the internal combustion engine; and from a current sensor, the charging and discharging current (i) of the battery; and controls the inverter in accordance with driver-operated input. The inverter performs AC to DC conversion or DC to AC conversion between the battery mounted in the vehicle and the motor-generator coupled to the internal combustion engine.

In the course of this control of charging and discharging, the program control circuit calculates the time integral I of the charging and discharging current (i) and controls the charging current to the battery during regenerative braking and the discharge current when the vehicle is being driven, in accordance with a function of this time integral I.

In the case of an electric vehicle, if the time integral I calculated for the discharge current (i) has exceeded a prescribed value, the electrical energy generated by braking is largely regenerated by the battery (as shown for example by the oblique lines in FIG. 42 (*a*)). If the time integral I calculated for the discharge current (i) does not exceed a prescribed value, the battery will be nearly charged and therefore the electrical energy generated by braking is regenerated subject to the restriction that over-charging is avoided (as shown for example by the oblique lines in FIG. 42(*b*)).

In the case of a hybrid vehicle (HIMR), if the time integral I calculated for the charging current (i) has exceeded a prescribed value (the battery is charged), electrical energy which has been regenerated and stored is supplied to the motor-generator and a large proportion of the driving torque is contributed by the motor-generator as an electric motor (as shown for example by the oblique lines in FIG. 43(*a*)). If the time integral I calculated for the charging current (i) does not exceed a prescribed value, the supply of electrical energy to the motor-generator is restricted (as when there has been insufficient charging as shown for example in FIG. 43 (*b*)).

By thus constantly observing the state of charging and discharging of the battery and controlling its charging and discharging in accordance with this state, battery life can be increased, as much as possible of the energy lost by the brakes can be regenerated, and it is possible to prevent any variability among the unit cells increasing with long-term use.

Because the characteristics of a battery vary with temperature, if a battery sensor comprising means for detecting battery temperature ($\theta$) is provided, the charging efficiency $\eta$ of the battery can be given as a function of temperature ($\eta(\theta)$), so that the time integral I for the charging and discharging current (i) can be used as control information $\eta I$ which includes the influence of temperature change. This enables the charging and discharging control to be performed more accurately and precisely.

By equipping the battery sensor provided for each unit cell with a radio transmitter, and by providing a radio receiver for receiving electromagnetic waves from these transmitters, battery-related information detected by the battery sensors can be transmitted by radio signals. If the battery sensors detect the terminal voltage of the unit cells individually and transmit this information by radio waves, the program control circuit can receive this information via the radio receiver and can control the charging current during regenerative braking, and the discharge current when the vehicle is being driven, in accordance with the detected terminal voltages.

The distinguishing feature of a second aspect of the present invention is a construction whereby the fitting of the battery sensor and interface circuit to a unit cell can be performed securely by a simple operation.

Namely, it is characterised in that at least part of the battery sensor and interface circuit is constituted as one unit set into the casing of the battery, and this unit is constituted so as to be freely attachable to, and removable from, the battery casing.

A space for accommodating the battery information detecting battery sensor and the interface circuit is provided in part of the top surface of the battery casing. A pair of holding fixtures connected electrically to the positive and negative terminals of the unit cell respectively are set into this space in the casing. The terminals of the battery sensor are held by being fitted into these holding fixtures.

By accommodating a detection sensor in one unit, providing an interface circuit in this unit, and transmitting the output of the detection sensor to the interface circuit by a radio signal, the detected battery information can be extracted without electrical wiring and this information can be made known in the battery compartment or at the driver's seat.

This can be implemented by for example providing a radio transmitter in a unit, providing a radio receiver for receiving radio waves from each radio transmitter, and displaying on an indicator the battery-related information received by the radio receiver.

A third aspect of the present invention is characterised in that it displays a charging warning relating to, and the residual amount of charging of, a vehicle-mounted battery, observes the deterioration of the battery (i.e., battery life), and displays information relating to when the battery replacement time.

Namely, it is characterised in that a display means relating to at least a charging warning, the residual amount of charging, and the battery replacement time, is connected to the output of the program control circuit.

Standard charging and discharging volt-ampere characteristics and a plurality of charging and discharging volt-ampere characteristics corresponding to degrees of deterioration are preferably stored in advance in a memory means of the program control circuit, and the program control circuit preferably comprises means which refers to the characteristics stored in this memory means and calculates information relating to battery deterioration.

The degree of deterioration of a battery can be found by monitoring the terminal voltage and the discharge current or charging current. In the case of the relation between terminal voltage and discharge current, as shown on the right-hand side of FIG. 16, if the voltage at which charging is required has been set to a first preset value $V_1$, the discharge current will be $I_{10}$ if the discharge characteristic is normal ($S_{10}$), but the discharge current will be $I_{13}$ ($I_{13}<I_{10}$) when battery replacement is required and the discharge characteristic is as shown by the broken line ($S_{13}$). In the case of the relation between terminal voltage and charging current, as shown on the left-hand side of the same figure, if the voltage at which charging is completed has been set to a second preset value $V_2$, the charging current will be $I_{20}$ if the charging characteristic is normal ($S_{20}$), but the charging current will be $I_{23}$ ($I_{23}<I_{20}$) when battery replacement is required and the charging characteristic is as shown by the broken line. Thus charging and discharging characteristics vary in accordance with the degree of deterioration, and at a given terminal voltage the discharge current and charging current decrease as deterioration proceeds.

The program control circuit receives, during charging and discharging, battery voltage and current information of this kind and calculates the degree of deterioration. This is displayed on a display means, subdivided into a charging warning and information relating to the residual amount of charging and the battery replacement time.

The aforementioned standard charging and discharging volt-ampere characteristics and plurality of charging and discharging volt-ampere characteristics corresponding to the degree of deterioration are stored in advance in the memory means of the program control circuit. Given voltage and current values acquired by measurement, the program control circuit can refer to the characteristics stored in the memory circuit and calculate the battery deterioration information. The voltage information is detected by a battery sensor fitted to cells or to each unit cell comprising the battery, and the program control circuit receives this detection output.

The interface circuit between the battery sensor which detects the voltage information and the program control circuit can comprise means for transmitting the information output by this sensor by means of a radio signal. For example, by providing each unit cell with a radio transmitter and by providing a radio receiver for receiving electromagnetic waves from these transmitters, battery information detected by the battery sensors can be transmitted by means of a radio signal even if the display means is distant from the location where the battery is housed.

The display means can be provided at the driver's seat, and can comprise means for indicating, in broad subdivisions, when the battery is in a state in which:
 (1) it is charged,
 (2) it is being used normally,
 (3) charging is advisable,
 (4) charging is necessary.

The display means can also comprise means for indicating, in broad subdivisions, when the battery is in a state in which:
 (1) there is no deterioration,
 (2) inspection is recommended,
 (3) battery replacement is recommended,
 (4) battery replacement is necessary.

The state in which inspection is recommended can be indicated when it is detected that deterioration has occurred in some of the unit cells. Thus, by not only indicating the state of charging of the battery but also indicating, in subdivided manner at the driver's seat, the state of deterioration of the battery, or in other words, whether the battery is in a state where charging would enable its continued use, or whether it is in a state where deterioration has exceeded a limit and replacement is required, the driver can immediately take action in accordance with this information and can avoid a situation of the sort where, due to having missed the time for charging or for battery replacement, the vehicle ends up coming to a stop while on the road. Moreover, because cells can receive frequent maintenance and battery life as a whole can be extended, the proportion of cells which are discarded can be decreased and pollution abated.

A fourth aspect of the present invention is characterised in that it observes the state (i.e., the life) of the cells mounted in a vehicle and displays at the driver's seat, in broad subdivisions, information relating to their replacement time.

Namely, it is characterised in that it has a display unit at the driver's seat, and the aforementioned display means has at least two subdivisions, the first subdivision being means for indicating that the battery is in good condition, and the second subdivision being means for indicating that the battery is in a condition in which it should be replaced.

An intermediate subdivision is preferably provided between the first subdivision and the second subdivision, and in addition to these subdivisions there is preferably provided a lighting display means for showing that the degree of battery deterioration is large.

This display is different from hitherto known displays which, as mentioned above, indicate whether or not a battery is charged, whether charging is necessary, and so forth. It is a device which indicates to the driver how much rechargeable battery life remains, i.e., how much longer the battery can be repeatedly charged and discharged.

The degree of deterioration of a battery can be found by monitoring the terminal voltage and the discharge current or charging current. Taking the discharge characteristics shown on the right-hand side of the aforementioned FIG. 16 as an example, the discharge characteristic of a new battery is $S_{10}$, but becomes $S_{11}$ and then $S_{12}$ as deterioration proceeds, and becomes $S_{13}$ when battery life is up and replacement is necessary. In addition, looking at the relation between terminal voltage and discharge current, as shown on the right-hand side of FIG. 16, if the voltage at which charging is required has been set to a first preset value $V_1$, the discharge current will be $I_{10}$ if the normal discharge characteristic is as shown by $S_{10}$, but when replacement is required as shown by the broken line, the discharge characteristic will be $S_{13}$ and the discharge current corresponding to the first preset value V1 will be $I_{13}$ ($I_{13}<I_{10}$). As shown on the left-hand side of FIG. 16, the charging characteristic of a new battery is $S_{20}$, but becomes $S_{21}$ and then $S_{22}$ as the battery deteriorates, and becomes $S_{23}$ when replacement is necessary. In the case of the relation between terminal voltage and charging current, as shown on the left-hand side of the same figure, if the voltage at which charging is completed has been set to a second preset value $V_2$, the charging current will be $I_{20}$ when there is a new battery and the normal charging characteristic is $S_{20}$, but the charging current will be $I_{23}$ ($I_{23}<I_{20}$) when battery replacement is required, as shown by the broken line (i.e., when the service life of the battery is almost up). Thus charging and discharging characteristics vary in accordance with the degree of deterioration, and at a given terminal voltage the discharge current and charging current decrease as deterioration proceeds.

Battery charging characteristics and (or) discharge characteristics as exemplified in FIG. 16 are stored in advance in the memory means of the program control circuit. Voltage and current information are then measured during charging (i.e., during regenerative braking) or during discharge (i.e., when the vehicle is being driven by the electric motor) of the same sort of battery, and this information is sent to the program control circuit where it is compared with the charging characteristics or discharging characteristics stored in the memory means. This enables the degree of deterioration of the battery to be calculated and then displayed at the driver's seat on a display means as a charging warning and as information relating to the residual amount of charging and the battery replacement time.

As previously mentioned, this display preferably indicates, in broad subdivisions, states in which:

(1) there is no deterioration,
(2) inspection is recommended,
(3) battery replacement is recommended,
(4) battery replacement is necessary.

Of these, the indication that "battery replacement is necessary" is a warning indicating that the battery has deteriorated to a large extent and is in a dangerous condition. It is therefore preferable in this case to cause a lamp to light.

This display of the state of battery deterioration can be displayed alongside the charging and discharging display which shows that the time has come to charge the battery (this corresponds to a fuel gauge which shows the amount of fuel left in the fuel tank).

A fifth aspect of the present invention is characterised in that charging is controlled on an individual basis, and a cell which has reached a stipulated voltage at the completion of charging is connected to an adjacent cell by a current by-pass path and thereby released from being charged.

Namely, it is characterised in that it provides, for each unit cell, a current by-pass path and a switching circuit which selects either this current by-pass path or the unit cell, a measuring circuit which measures the terminal voltage of the unit cell, and a switching control circuit which individually controls the switching circuit in accordance with information output from this measuring circuit.

The switching circuit preferably comprises a semiconductor switching element, and the switching control circuit is preferably provided individually for each unit cell. The measuring circuit, the switching circuit, the by-pass path and the switching control circuit are preferably packaged in a single unit, and connection fixtures for connecting to the positive and negative terminals of the unit cell are preferably provided. The measuring circuit preferably has circuit means for sending output information which subdivides the terminal voltage of the unit cell into a plurality n of levels. The measuring circuit also preferably has display means for displaying on the surface of the aforementioned unit the output information which has been subdivided into a plurality n of levels. In general, 2 is a suitable value for n.

By this means, when charging a plurality of series-connected unit cells, a unit cell can be individually released from being charged by causing the appropriate individually provided current by-pass path to close. Consequently, as mentioned above, even when there is variability in the characteristics of the unit cells and the charging time is different for each cell, each unit cell with its different characteristics can be appropriately charged by releasing it from being charged as soon as its charging is completed.

An alternative configuration is to provide one receiver and, for this receiver, an interface circuit which acquires the aforementioned output information from each unit cell. With this configuration, because information relating to a plurality of unit cells can be acquired at one place, the overall situation can be monitored. Consequently, the state of a plurality of unit cells can be controlled at one place in a centralised manner.

The receiver can be fitted to the body of the vehicle, and the interface circuit can comprise means for transmission by radio signals. This can serve to increase the degree of freedom with which the unit cells can be disposed, without laying wiring to each of the plurality of unit cells for receiving the aforementioned output information. The interface circuit in this case can for example be a radio transmitter.

An alternative configuration is to provide the program control circuit with means for processing the output information of each unit cell received by the receiver. This enables the state of a plurality of unit cells to be controlled in centralised manner in one place. If data analysis is performed by the program control circuit, a variety of useful information can be displayed: for example, the state of charging or discharging, and the state of deterioration of the battery.

DETAILED DESCRIPTION

Embodiments of the present invention will now be explained with reference to the drawings.

First Embodiment

Figure 1:
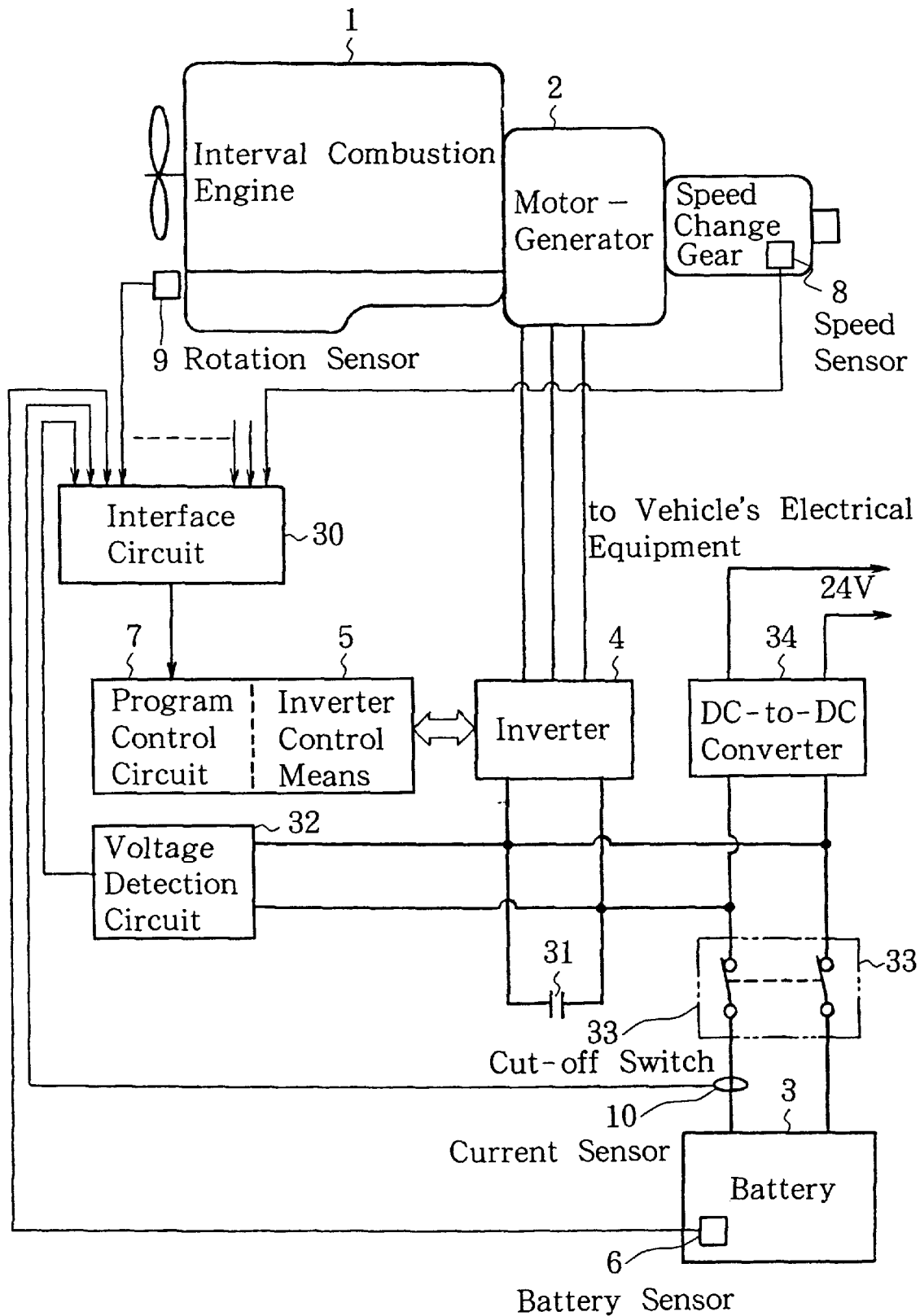
FIG. 1 is a block diagram showing the configuration of the essential parts of a first embodiment of the present invention.

FIG. 1 is a block diagram showing the configuration of the essential parts of a first embodiment of the present invention.

A first embodiment of the present invention comprises motor-generator 2 coupled to the drive shaft of internal combustion engine 1 mounted in a vehicle, battery 3 mounted on this vehicle, inverter 4 provided between this battery 3 and motor-generator 2 and capable of transmitting energy in both directions, and inverter control means 5 for controlling this inverter 4. This first embodiment of the present invention also has battery sensor 6 for detecting the state of battery 3, including the charging and discharging current (i) of battery 3, and there are also provided means for calculating the time integral I of the charging and discharging current (i).

$$I = \int i\, dt + C$$

where C is the integration constant corresponding to the initial amount of charging, and program control circuit 7 which controls the charging current to battery 3 during regenerative braking and the discharge current when the vehicle is being driven, in accordance with a function of this time integral.

Motor-generator 2 is a polyphase alternating current rotating machine and has speed sensor 8 for detecting the speed at which the vehicle is travelling, and rotation sensor 9 for detecting the speed of rotation of motor-generator 2. Inverter control means 5 comprises means for sending a control output to inverter 4 in accordance with the outputs of speed sensor 8 and rotation sensor 9, and in accordance with driver-operated inputs.

Battery sensor 6 comprises means for detecting the temperature (θ) of the battery, and the aforementioned function of the integral is ηI where η is the charging efficiency of the battery, and this efficiency η is a function η(θ) of the aforementioned temperature.

Capacitor 31 is connected to the output side of inverter 4, and voltage detection circuit 32 for detecting the output voltage of inverter 4 is connected to battery 3. DC-to-DC converter 34 is connected to battery 3 by way of cut-off switch 33. Battery sensor 6 incorporates a temperature detector (a thermistor) and is stuck onto the casing of one of the multiplicity of unit cells.

Battery sensor 6, speed sensor 8, rotation sensor 9, current sensor 10 and voltage detection circuit 32 are connected to program control circuit 7 via interface circuit 30. Although omitted from FIG. 1, an acceleration sensor, gear position sensor, brake sensor, generator temperature sensor and clutch sensor are connected to this program control circuit 7.

Figure 2:
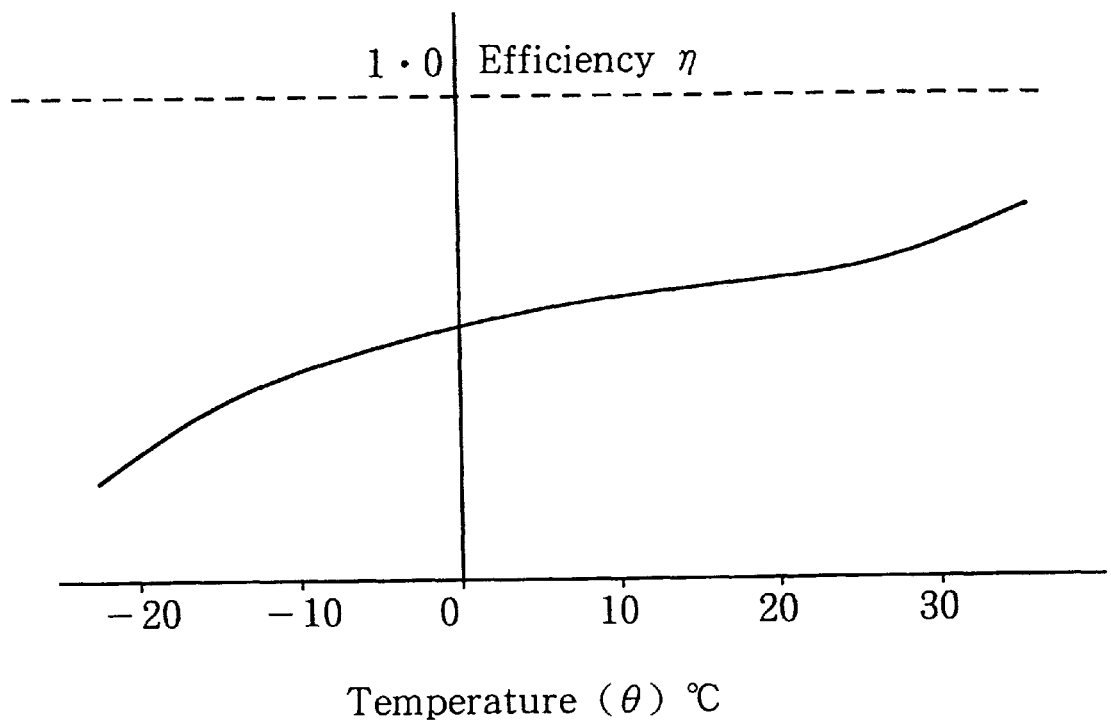
FIG. 2 shows the charging efficiency pertaining to a first embodiment of the present invention.

FIG. 2 shows the charging efficiency pertaining to a first embodiment of the present invention. The charging efficiency η of battery 3 varies with temperature as shown in this figure, becoming lower with decreasing temperature and higher as the temperature rises. Consequently, even if the same charging current is supplied to battery 3 over a given period of time, the amount of charging of the battery will vary according to the temperature at any particular time. In the present invention, the cell temperature of one of the multiplicity (e.g., twenty-five) of series-connected unit cells is obtained, this is regarded as the temperature of the high-voltage battery as a whole, and the charging current during regenerative braking and discharge current when the vehicle is being driven are controlled in accordance with the value ηI, which is the charging efficiency η at that temperature multiplied by the time integral I calculated for the charging current (i).

An explanation will now be given of the operation of this first embodiment of the present invention constituted in this manner.

Figure 3:
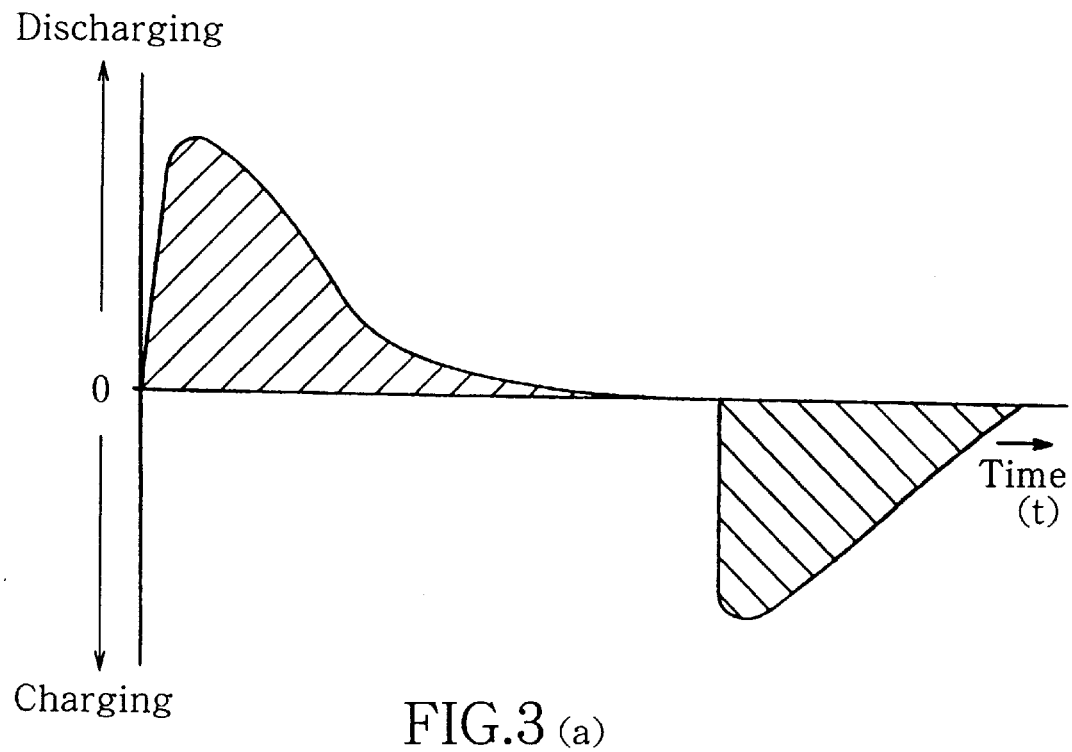
FIG. 3(*a*) serves to explain the situation where a battery is discharging in accordance with a first embodiment of the present invention, while FIG. 3(*b*) serves to explain changes in the amount of charging.
Figure 3:
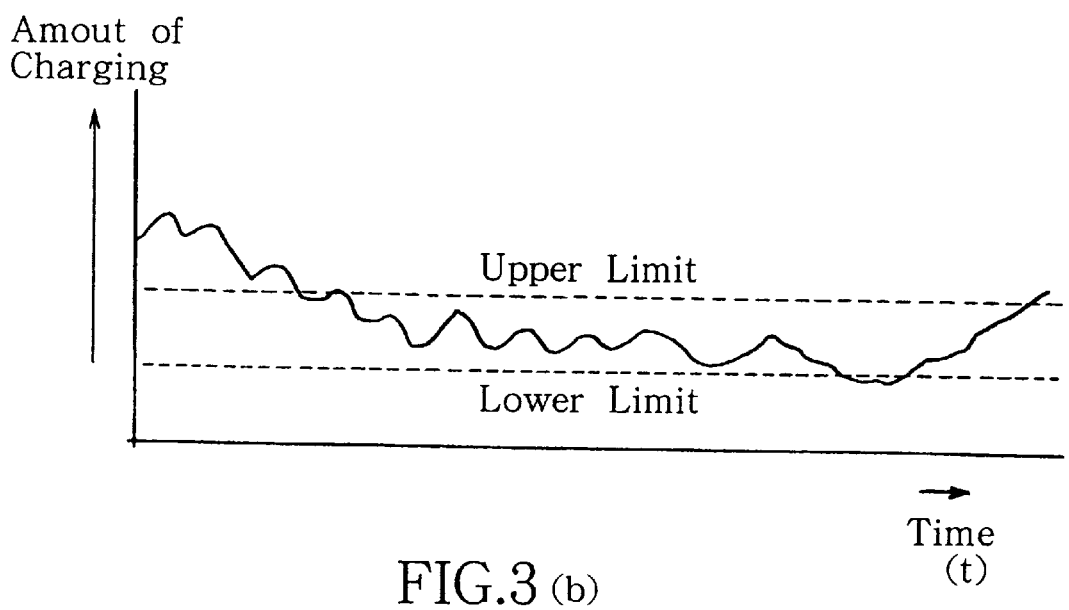

While the vehicle is travelling, discharge from battery 3 and charging of battery 3 are continually performed in the manner shown in FIG. 3(a), and the amount of charging of battery 3 varies with time as shown in FIG. 3(b).

Usually, when generating a braking force in the rotating system, program control circuit 7 generates a control signal for inverter 4 to give to the stator of motor-generator 2 a rotating magnetic field the speed of which is smaller than (e.g., 97%, a slip of −3%) the actual rotation speed of the rotor of motor-generator 2 as detected by rotation sensor 9. Under these circumstances motor-generator 2 operates as a generator and the generated electrical energy is converted to DC energy by inverter 4 and supplied to battery 3 as a charging current.

When giving a driving force to the rotating system, program control circuit 7 generates a control signal for inverter 4 to give to the stator of motor-generator 2 a rotating magnetic field the speed of which is larger than (e.g., 102%, a slip of +2%) the actual rotation speed of the rotor of motor-generator 2 as detected by rotation sensor 9. Under these circumstances a DC current is extracted from battery 3, converted to a polyphase alternating current by inverter 4, and supplied to motor-generator 2, which in its capacity as an electric motor gives an auxiliary driving force to internal combustion engine 1.

A distinguishing feature of the present invention is that during charging and discharging control of this sort, the charging and discharging current is controlled while observing the state of battery 3. Namely, program control circuit 7 obtains the discharge current (i) of battery 3 detected by current sensor 10, the temperature of battery 3 detected by battery sensor 6, and the terminal voltage (V) detected by voltage detection circuit 32, and calculates the time integral I of the charging and discharging current (i) of battery 3:

$$I = \int i\, dt + C \text{ (ampere-hours)}$$

C is an integration constant corresponding to the initial amount of charging. The charged energy is:

$$I \times V \text{ (watt-hours)}.$$

The supply of charging current to battery 3 during regenerative braking, and the supply of discharge current to motor-generator 2 when the vehicle is being driven, are controlled in accordance with the value ηI, which is obtained by multiplying this time integral I by battery efficiency η, which is a function of battery temperature. This control is performed so that the supply of charging current and the supply of discharge current are within the permitted range stipulated for the amount of charging. Namely, as shown in FIG. 3(b), when the amount of charging of battery 3 exceeds the upper limit of the permitted range, overcharging occurs and therefore charging is restricted, and when the amount of charging falls below the lower limit of the permitted range, the discharge to motor-generator 2 is restricted.

The deterioration of the unit cells comprising the battery varies individually. Accordingly, a battery sensor is provided for each unit cell, the charging and discharging current (i) is detected for each unit cell, and its time integral I is calculated, whereupon the charging current to the battery during regenerative braking and the discharge current when the vehicle is being driven can be controlled in accordance with a function of this time integral I.

Figure 4:
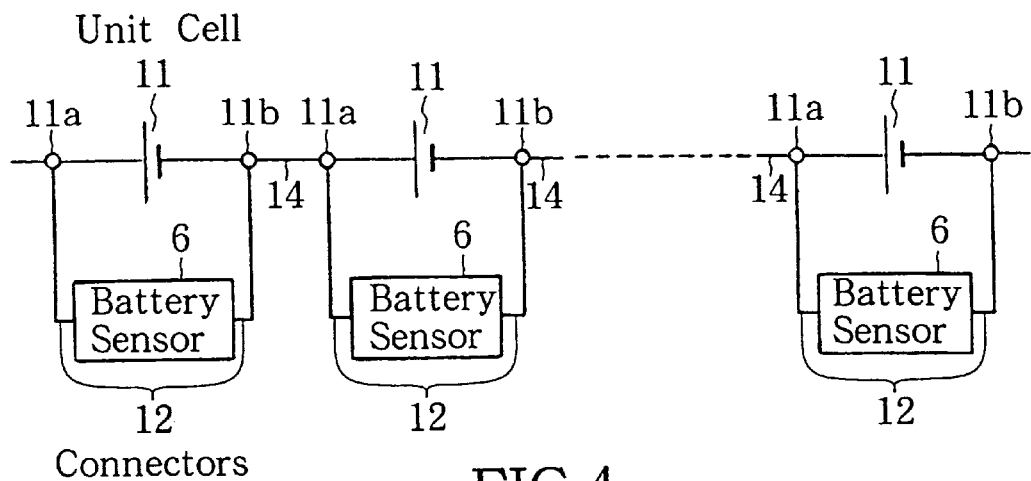
FIG. 4 is a block diagram showing a configuration where a battery sensor has been provided for each unit cell in a first embodiment of the present invention.
Figure 5:
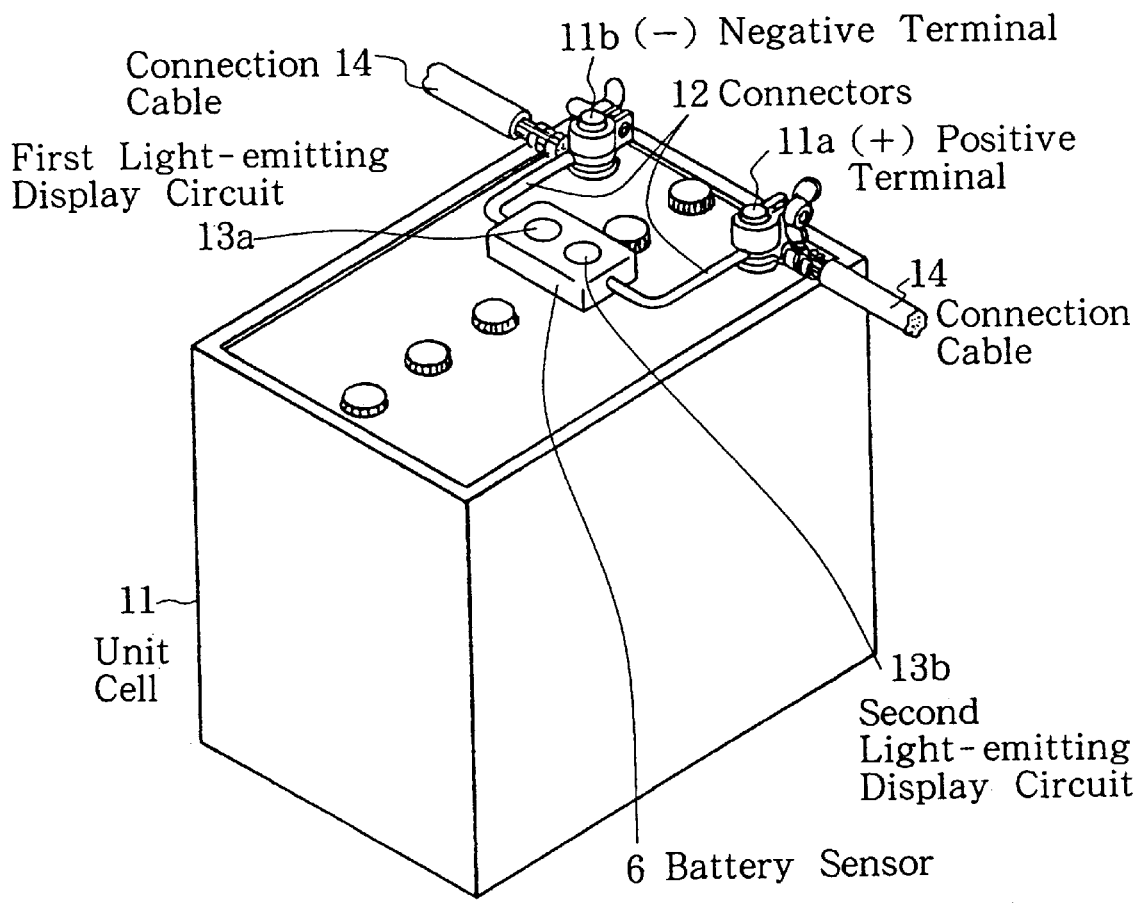
FIG. 5 is a perspective view showing a configuration where a battery sensor has been provided for each unit cell in a first embodiment of the present invention.

An explanation will now be given of an embodiment in which a battery sensor has been provided for each unit cell. FIG. 4 is a block diagram showing a configuration where a battery sensor has been provided for each unit cell in the first embodiment of the present invention, while FIG. 5 is a perspective view showing the configuration of a unit cell when a battery sensor has been provided for each unit cell in the first embodiment of the present invention.

In this example, a multiplicity n (where n is 25) of 12V unit cells 11 is connected in series and a battery sensor 6 is connected between the positive terminal 11a and the negative terminal 11b of each unit cell 11 by way of a pair of connectors 12. The positive terminal 11a and negative terminal 11b of each unit cell 11 are connected by connection cables 14.

Each batter sensor 6 is provided with the previously mentioned means for detecting battery temperature θ, and a light-emitting display circuit. This latter comprises first light-emitting display circuit 13a which indicates by emitting light when the voltage between positive terminal 11a and negative terminal 11b is at or less than a first preset value $V_1$, and second light-emitting display circuit 13b which indicates by emitting light of a different colour from first light-emitting display circuit 13a when said voltage exceeds a second preset value $V_2$.

Figure 6:
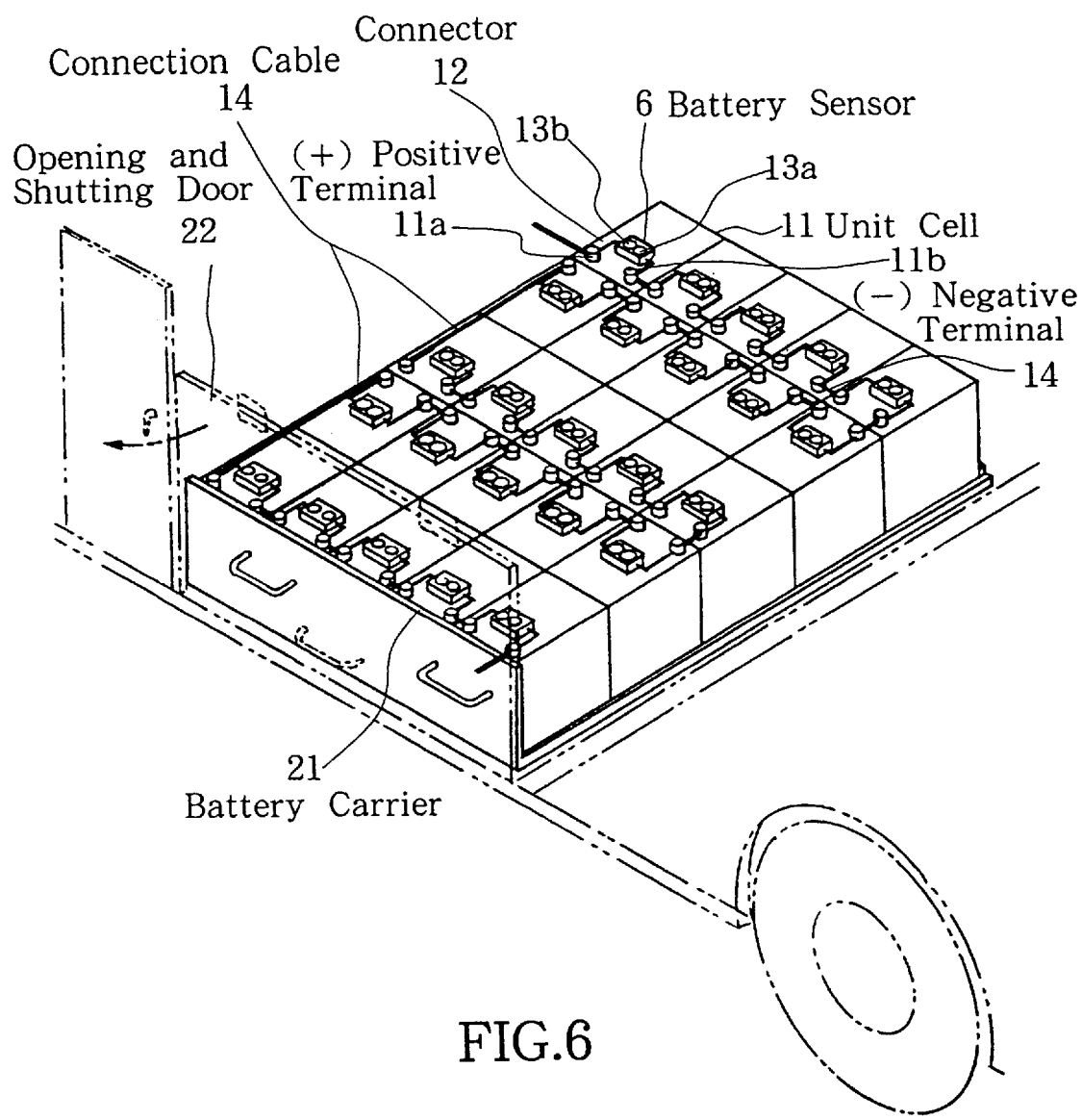
FIG. 6 is a perspective view showing the high-voltage battery in the first embodiment of the present invention after it has been mounted.

FIG. 6 is a perspective view showing the high-voltage battery in the first embodiment of the present invention after it has been mounted. Unit cells 11 as described above are held in battery carrier 21 inside a battery compartment which is provided in the lower part of the centre of the vehicle body, and are screened from outside by door 22 which can open and shut.

In this example, program control circuit 7 acquires detection outputs from each unit cell 11, calculates the time integral I of the charging and discharging current (i) detected by current sensor 10, and controls the charging and discharging current in accordance with a function of this time integral I, which includes the charging efficiency η which is dependent on the temperature of the unit cell 11.

At the same time, program control circuit 7 displays the state of charging of each unit cell 11 by causing first light-emitting display circuit 13a to light up red when the terminal voltage of that unit cell 11 falls to or below the first preset value $V_1$, taking this as an indication of insufficient charging, and by causing second light-emitting display circuit 13b to light up green when the terminal voltage exceeds the second preset value $V_2$, taking this as an indication that the unit cell is in a charged state.

As explained above, the present invention controls the charging and discharging of the battery which supplies energy for driving a vehicle, and concurrently observes the state of the battery. The present invention can thereby improve battery efficiency and increase battery service life. It is also capable of regenerating as much as possible of the energy lost by the brakes, and when there is variability of unit cell characteristics it can prevent this variability increasing due to long-term battery use. It can also decrease the cost of a vehicle-mounted battery, and can simplify battery maintenance.

Second Embodiment

Figure 7:
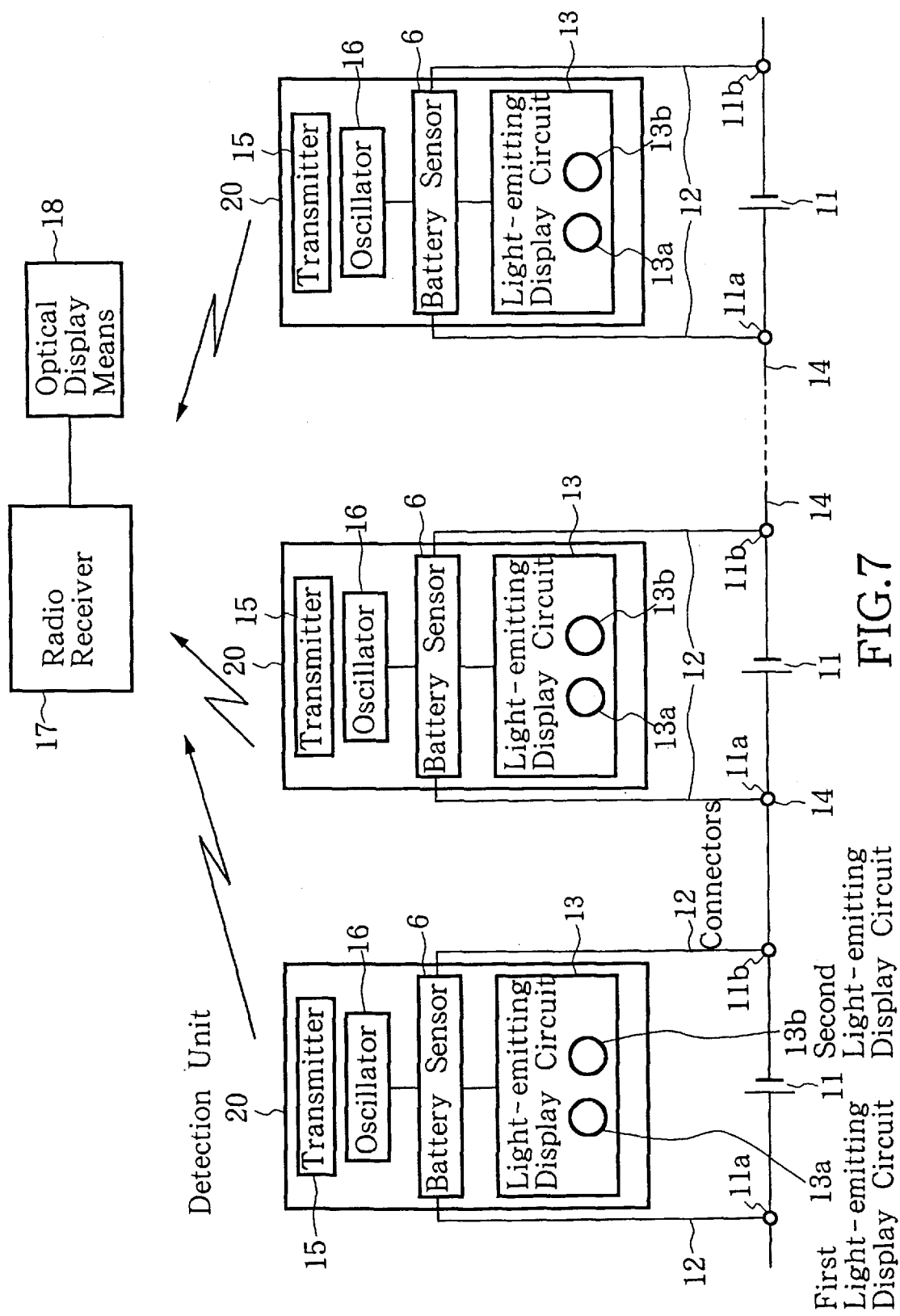
FIG. 7 is a block diagram showing the essential parts of a second embodiment of the present invention.

FIG. 7 is a block diagram showing the configuration of the essential parts of a second embodiment of the present invention.

According to this second embodiment, interface circuit 30 between battery sensor 6 and program control circuit 7 in the first embodiment comprises means for using a radio signal to transmit the information output from that sensor; battery sensor 6 comprises means for detecting the terminal voltage of unit cells 11 individually; and program control circuit 7 comprises means for controlling the charging current during regenerative braking in accordance with this terminal voltage, and means for controlling the discharge current when the vehicle is being driven in accordance with this terminal voltage.

Each unit cell 11 is provided with transmitter 15 as means for transmitting by means of a radio signal, and there is provided radio receiver 17 which receives the electromagnetic waves propagating through space after being emitted from these transmitters 15, and which demodulates the outputs detected by battery sensors 6.

Transmitter 15 and battery sensor 6 are contained in one detection unit 20, and this detection unit 20 also comprises oscillator 16 for emitting into space an electromagnetic wave which has been modulated in accordance with the detection output of battery sensor 6, and light-emitting display circuit 13 which indicates, in accordance with the detection output of battery sensor 6, whether unit cell 11 is in an abnormal or normal condition. As in the first embodiment, light-emitting display circuit 13 comprises first light-emitting display circuit 13a and second light-emitting display circuit 13b. Optical display means 18 is connected to radio receiver 17 and displays its demodulated output.

Figure 8:
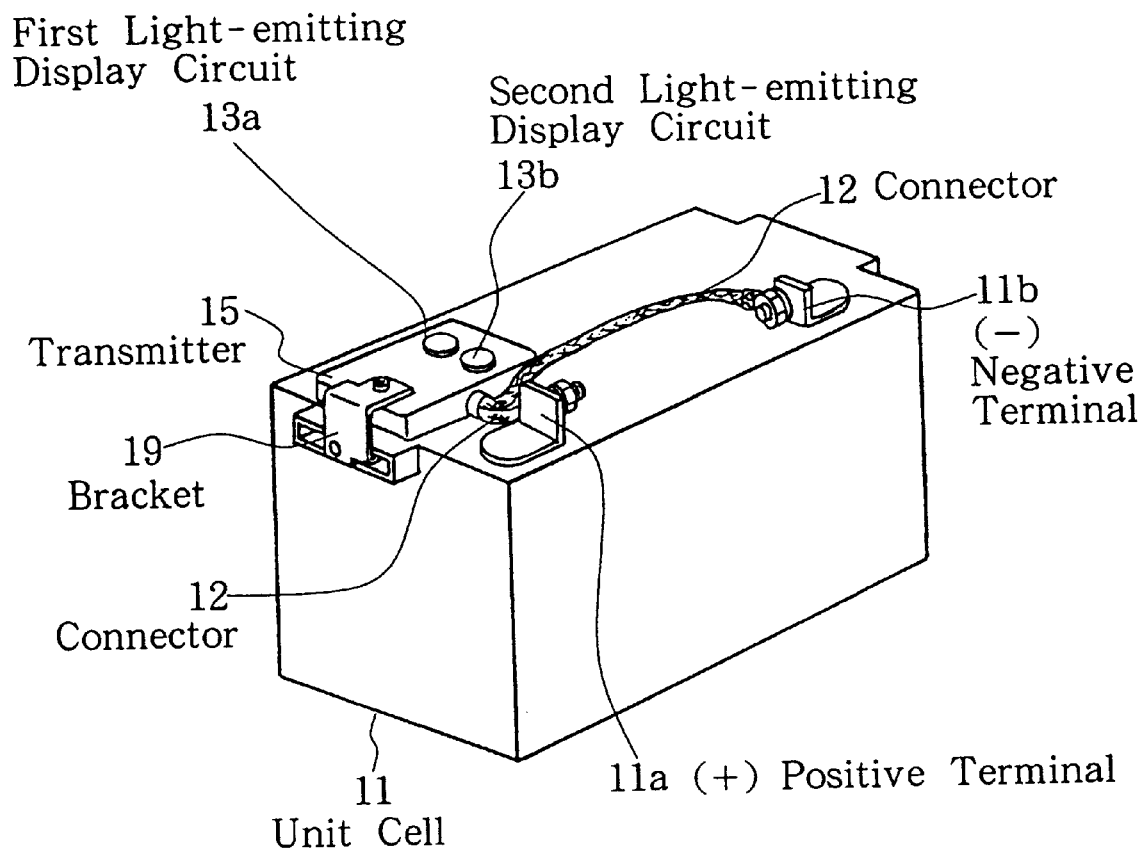
FIG. 8 is a perspective view showing the configuration of a unit cell pertaining to a second embodiment of the present invention.

FIG. 8 is a perspective view showing the configuration of a unit cell pertaining to a second embodiment of the present invention. Transmitter 15 is removably and reattachably fitted to unit cell 11 by means of bracket 19. Oscillator 16 inside transmitter 15 comprises means which stops the generation of electromagnetic waves when the voltage between positive terminal 11a and negative terminal 11b exceeds a preset value, and starts the generation of electromagnetic waves when this voltage has fallen to or below a preset value.

Figure 9:
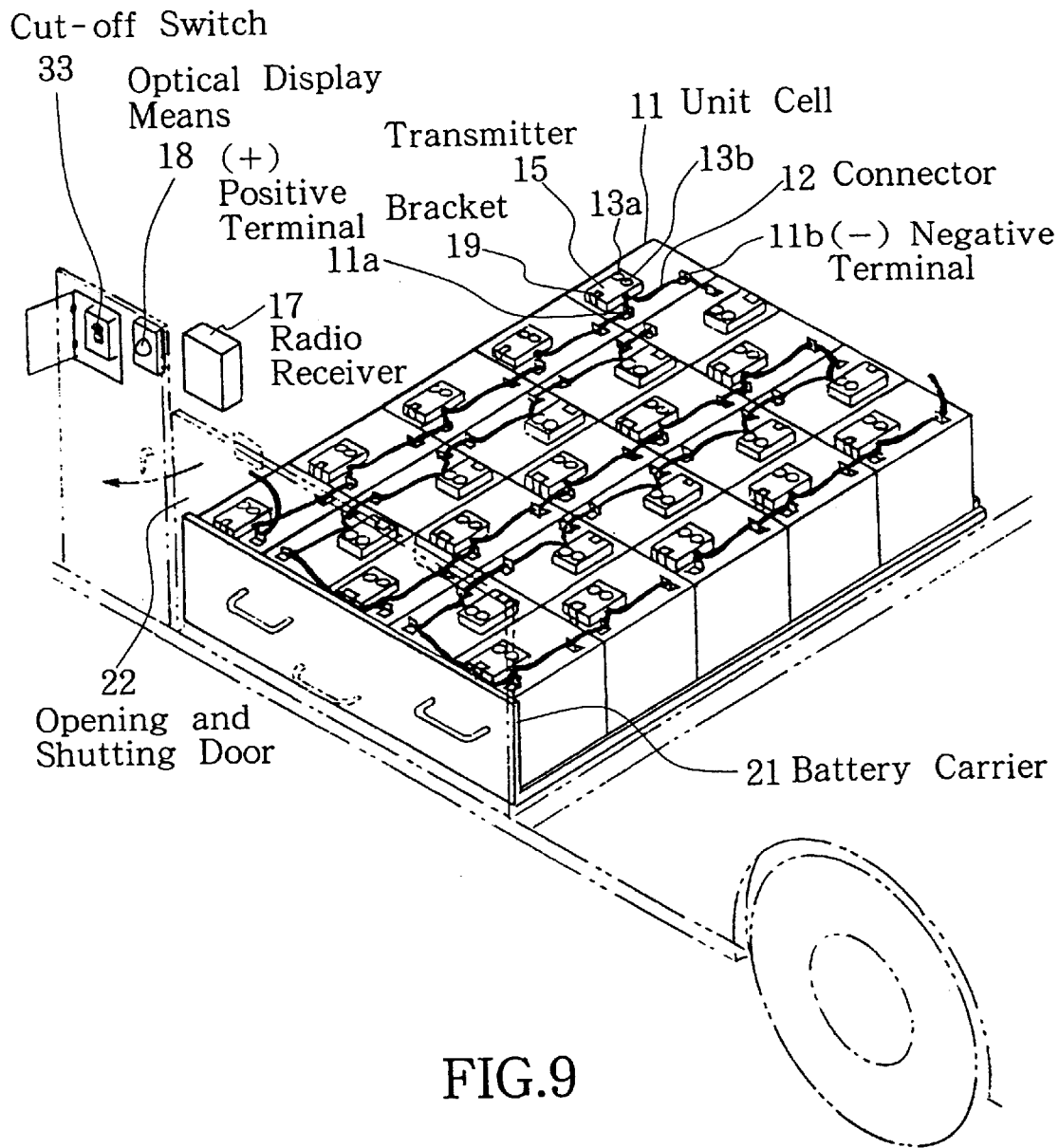
FIG. 9 shows the high-voltage battery pertaining to the second embodiment of the present invention after it has been mounted.

FIG. 9 is a perspective view showing the high-voltage battery pertaining to the second embodiment of the present invention after it has been mounted. Unit cells 11 are connected in series and as in the first embodiment are held by battery carrier 21 in a battery compartment which is provided in the lower part of the centre of the vehicle body. Radio receiver 17, optical display means 18 and cut-off switch 33 are disposed in the vicinity of this battery carrier 21, and battery carrier 21 is shielded from the outside by door 22 which can open and shut. Cut-off switch 33 is operated by a maintenance person when performing maintenance, and serves to cut the connection between the battery and inverter 4 and earth. Radio receiver 17 and optical display means 18 can also be disposed at the driver's seat, in which case radio receiver 17 and a power supply are connected by an antenna cable.

Battery sensors 6 detect the terminal voltage of unit cells 11 individually, and when the terminal voltage of any unit cell 11 is at or below a prescribed value, this detection output is sent to oscillator 16, whereupon oscillator 16 generates an electromagnetic wave in accordance with this detection output. This electromagnetic wave is received by radio receiver 17, demodulated, and the resulting output transmitted to optical display means 18. Optical display means 18 receives this output and lights up red, thereby giving notification of the fact that an abnormal situation has developed in some unit cell 11. Under these circumstances, a light-emitting display circuit 13 also operates in the manner as in the first embodiment, and causes first light-emitting circuit 13a and second light-emitting circuit 13b to light.

Program control circuit 7 receives the detection output from battery sensor 6 and controls the charging current during regenerative braking in accordance with the detected terminal voltage, and also controls the discharge current when the vehicle is being driven in accordance with this terminal voltage.

Thus, because the voltage detection operation is performed automatically and separately for each unit cell 11, when notification has been received by the lighting up of optical display means 18, it can be confirmed which unit cell 11 has developed an abnormal condition by simply opening door 22, and without pulling out battery carrier 21. If unit cell 11 which has developed an abnormality is replaced, the terminal voltage will exceed the preset value and therefore oscillator 16 will cease generating electromagnetic waves.

Third Embodiment

Figure 10:
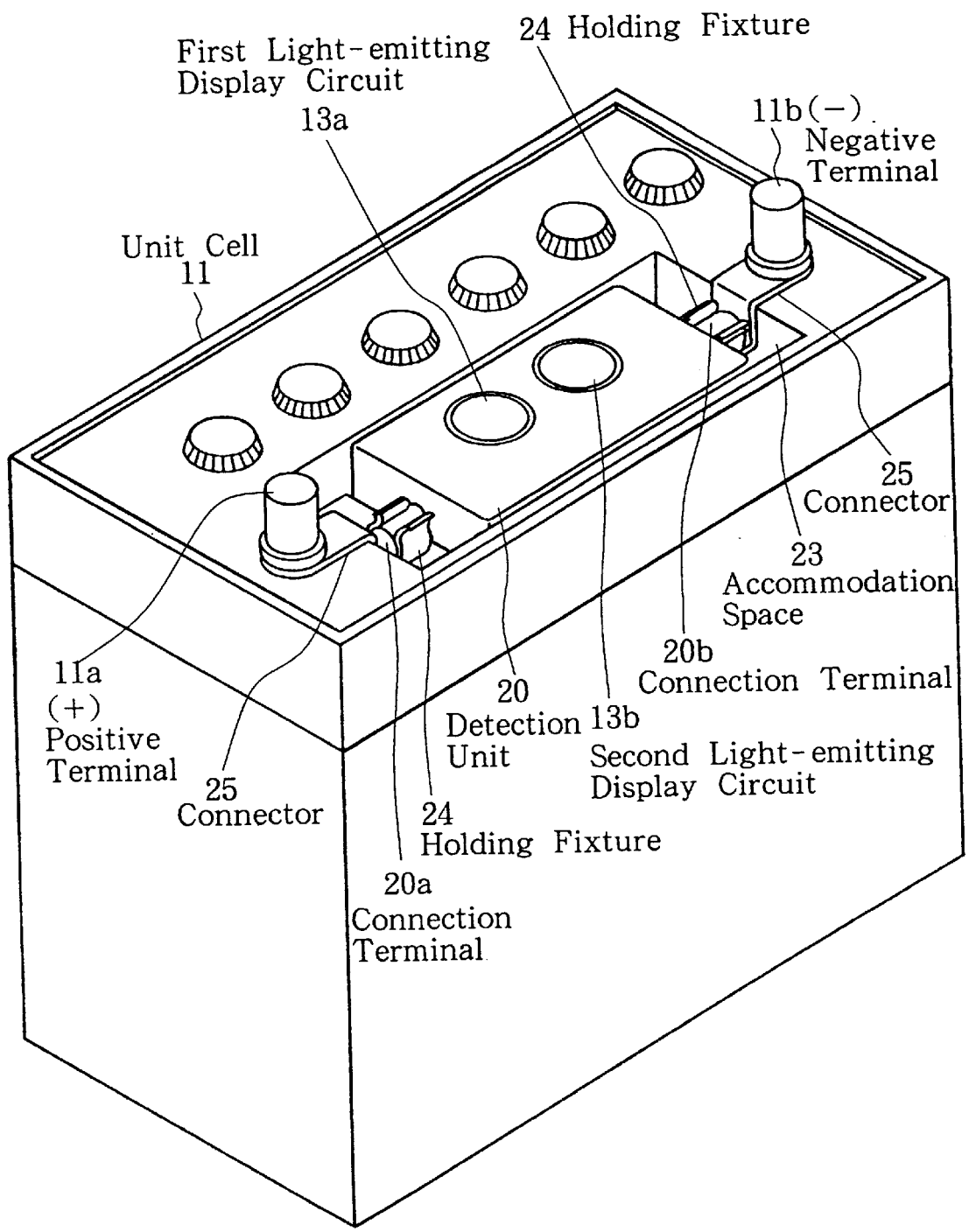
FIG. 10 is a perspective view showing the configuration of a third embodiment of the present invention.
Figure 11:
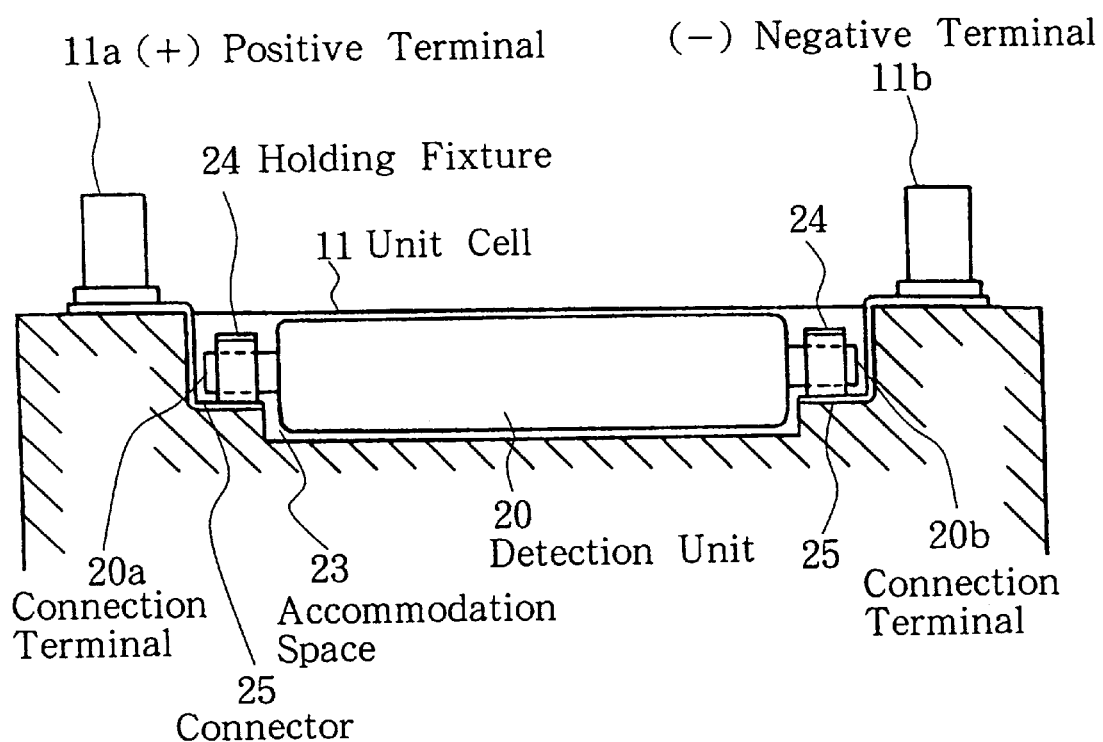
FIG. 11 is a partial sectional view showing the configuration of a third embodiment of the present invention.

FIG. 10 is a perspective view showing the configuration of a third embodiment of the present invention, while FIG. 11 is a partial sectional view showing said configuration.

In this third embodiment of the present invention, as in the second embodiment illustrated in FIG. 7, at least part of battery sensor 6 and interface circuit 30 is contained in a detection unit 20, and this detection unit 20 is set into the casing of unit cell 11 so as to be freely attachable and removable. In addition, at least part of interface circuit 30 comprises means for transmitting the output of battery sensor 6 by means of radio signals.

According to this configuration, accommodation space 23 for accommodating detection unit 20 is formed in the top surface of the casing of unit cell 11, and a pair of connectors 25 are disposed at the two ends of this accommodation space. One end of the connectors 25 is fixed to the positive terminal 11a and the negative terminal 11b respectively of unit cell 11, and holding fixtures 24 are fixed to the other ends of connectors 25. Connection terminals 20a and 20b are provided on detection unit 20 at positions corresponding to holding fixtures 24. These connection terminals 20a and 20b are formed as metallic cylinders, and holding fixtures 24 are formed of elastic metallic strip so as to grip the perimeter of these connection terminals 20a and 20b with a prescribed contact pressure. An opening to allow the fitting of connection terminals 20a and 20b is provided at the top of these holding fixtures. The remainder of the configuration is the same as the second embodiment shown in FIG. 7. Detection unit 20 is provided with battery sensor 6, and also, as part of the interface circuit, with oscillator 16 for generating electromagnetic waves in accordance with the detection output of battery sensor 6, and transmitter 15 for modulating and transmitting the electromagnetic waves.

Light-emitting display circuit 13 for indicating the abnormality or normality of unit cell 11 in accordance with this detection output is connected to battery sensor 6 as shown in the same figure. This light-emitting display circuit 13 comprises first light-emitting display circuit 13a which indicates by emitting a red light when the voltage between positive terminal 11a and negative terminal 11b has fallen to or below a first preset value $V_1$, and second light-emitting display circuit 13b which indicates by emitting a green light when the voltage exceeds a second preset value $V_2$.

The high-voltage battery in this third embodiment of the invention is housed in battery carrier 21 in the same manner as in the second embodiment illustrated in FIG. 9.

Figure 12:
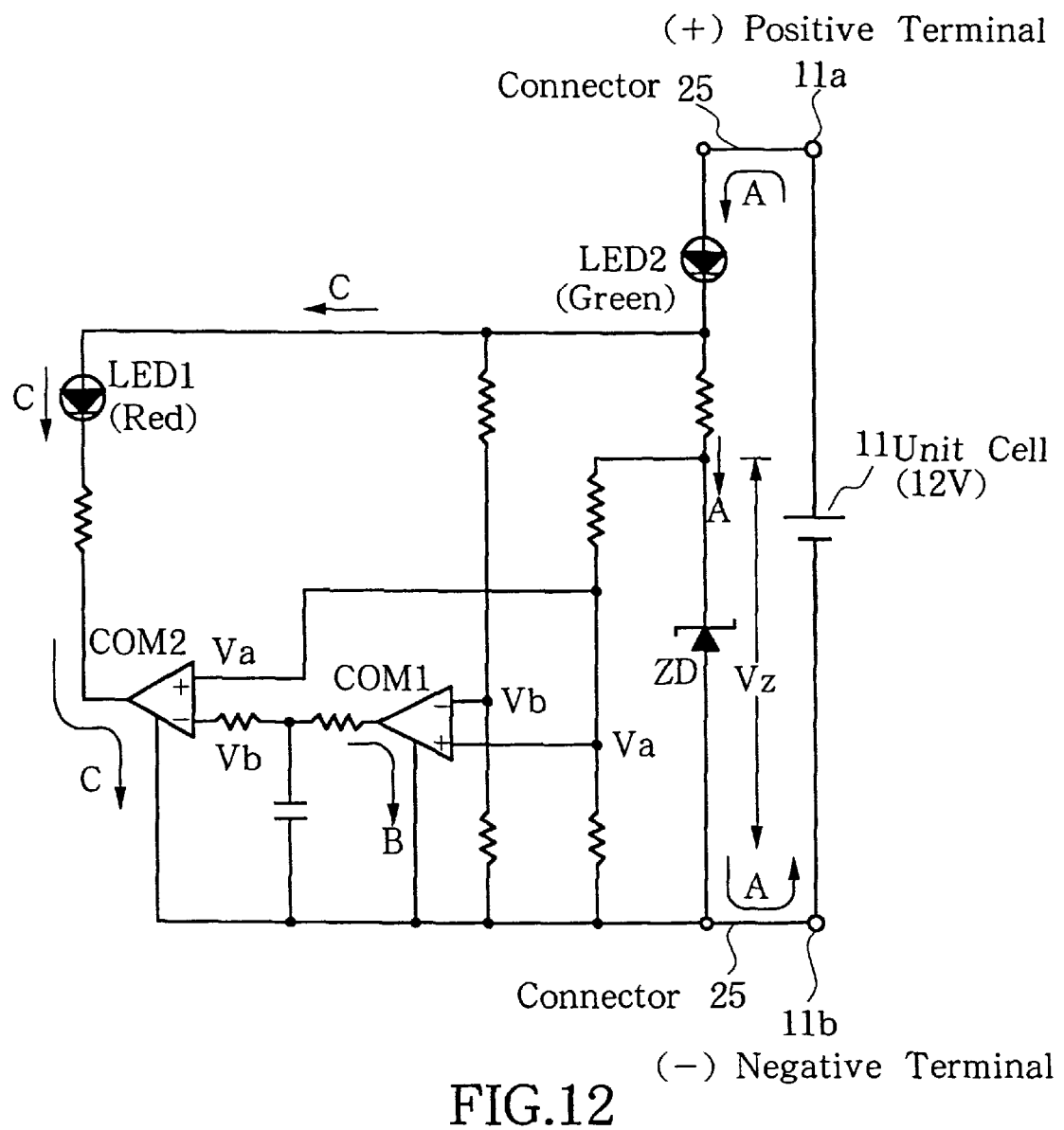
FIG. 12 shows an example of the configuration of a battery sensor in a third embodiment of the present invention.

FIG. 12 shows an example of the configuration of the battery sensor in this third embodiment of the invention.

In this example, battery sensor 6 uses red light-emitting diode LED1 and green light-emitting diode LED 2. In this same drawing, COM1 is a first comparator, COM2 is a second comparator, and ZD is a Zener diode. Although in this circuit configuration the aforementioned first preset value $V_1$ and second preset value $V_2$ of the terminal voltage have been set to the same value, it is also feasible to set second preset value $V_2$ below first preset value $V_1$.

An explanation will now be given of the display operation of battery sensor 6 shown in FIG. 12. On the assumption that first preset value $V_1$ second preset value $V_2$=Vz, then, when the voltage of 12V unit cell 11 is greater than preset value Vz, Zener diode ZD will be conductive and a current A will flow. As a result, green light-emitting diode LED2 will light, thereby indicating that there is no abnormality.

When the voltage of unit cell 11 is greater than preset value Vz, voltages Va and Vb which are applied to the input side of first comparator COM1 are in the relation Va<Vb, and therefore a current B flows through first comparator COM1. As a result, current C does not flow through second comparator COM2, and red light-emitting diode LED1 does not light.

If the voltage of unit cell 11 falls to or below preset value Vz, Zener diode ZD ceases to be conductive and consequently current A disappears. The voltages applied to the input side of first comparator COM1 will then be in the relation Va>Vb, and a current B flows in the negative direction through first comparator COM1. This flow of current B is accompanied by a flow of current C through second comparator COM2, and as a result red light-emitting diode LED lights, thereby indicating that the voltage of unit cell 11 has fallen to or below preset value Vz. Green light-emitting diode LED2 will also be lit at this time, thereby indicating that the voltage detection function has been performed normally, and that as a result an abnormality has been detected.

Voltage detection of this sort is performed automatically and separately for each of the twenty-five unit cells 11. The driver can therefore visually confirm the condition of the high-voltage battery simply by opening door 22 depicted in FIG. 6 or FIG. 9, and without pulling out battery carrier 21. If all light-emitting diodes LED1 and LED2 are unlit, the driver can conclude that a connector 25 is not adequately fitted, or that there is an abnormality in a battery sensor 6 etc.

As has been explained above, according to a third embodiment of the present invention the fitting of a detection unit incorporating a battery sensor can be accomplished by means of a simple operation, and a fitted condition which is stable against vibration can be maintained. As a result, the man-hours required for fitting and removing a multiplicity of detection units can be decreased, and because when fitted the detection unit is recessed within the casing of the unit cell, the operation of connecting and disconnecting the connection cables for connecting the unit cells together is made more efficient. Because detection units can be removed and re-fitted, it is possible to avoid the wastefulness of discarding a detection unit along with a cell when the cell is replaced.

Fourth Embodiment

Figure 13:
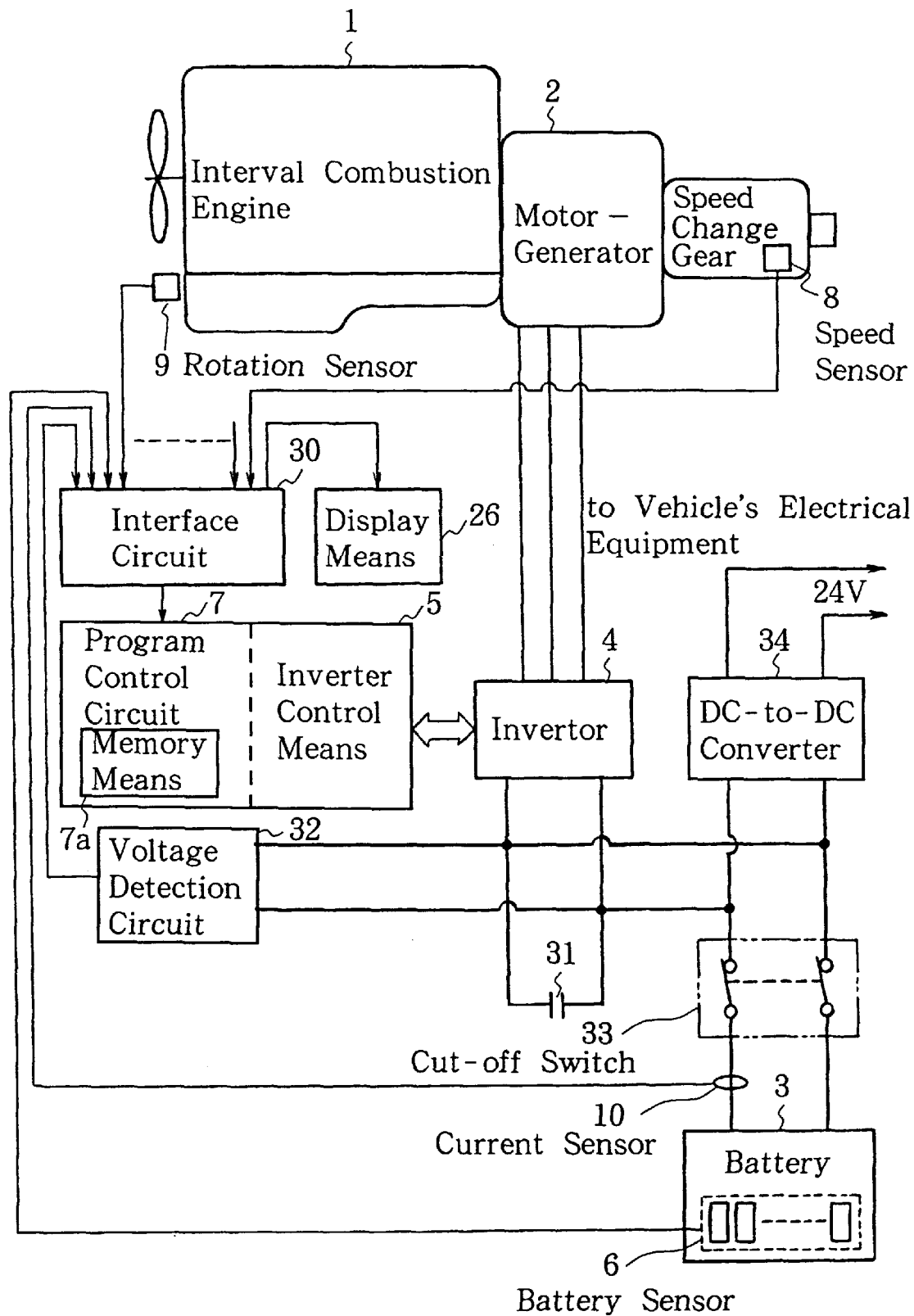
FIG. 13 is a block diagram showing the configuration of the essential parts of a fourth embodiment of the present invention.

FIG. 13 is a block diagram showing the configuration of the essential parts of a fourth embodiment of the present invention.

Figure 14:
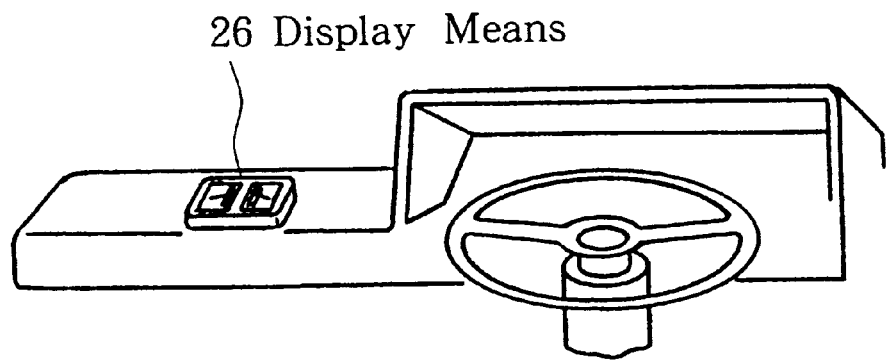
FIG. 14 shows an example of the disposition of the display means in a fourth embodiment of the present invention.

In this fourth embodiment of the present invention, display means 26 for displaying information relating to battery 3 is disposed at the driver's seat as shown in FIG. 14; program control circuit 7 has memory means 7a and means which acquires voltage and current information relating to the charging and discharging of battery 3 mounted in the vehicle and which calculates information relating to battery 3; and display means 26 is connected to the output of this program control circuit 7, said display means 26 relating to at least a charging warning, the residual amount of charging and the battery replacement time.

The standard charging and discharging volt-ampere characteristics and a plurality of charging and discharging volt-ampere characteristics corresponding to degrees of deterioration are stored in advance in memory means 7a of program control circuit 7, and program control circuit 7 comprises means which refers to the characteristics that have been stored in memory means 7a and calculates information relating to battery deterioration. Otherwise, the configuration is the same as the first embodiment.

Figure 15:
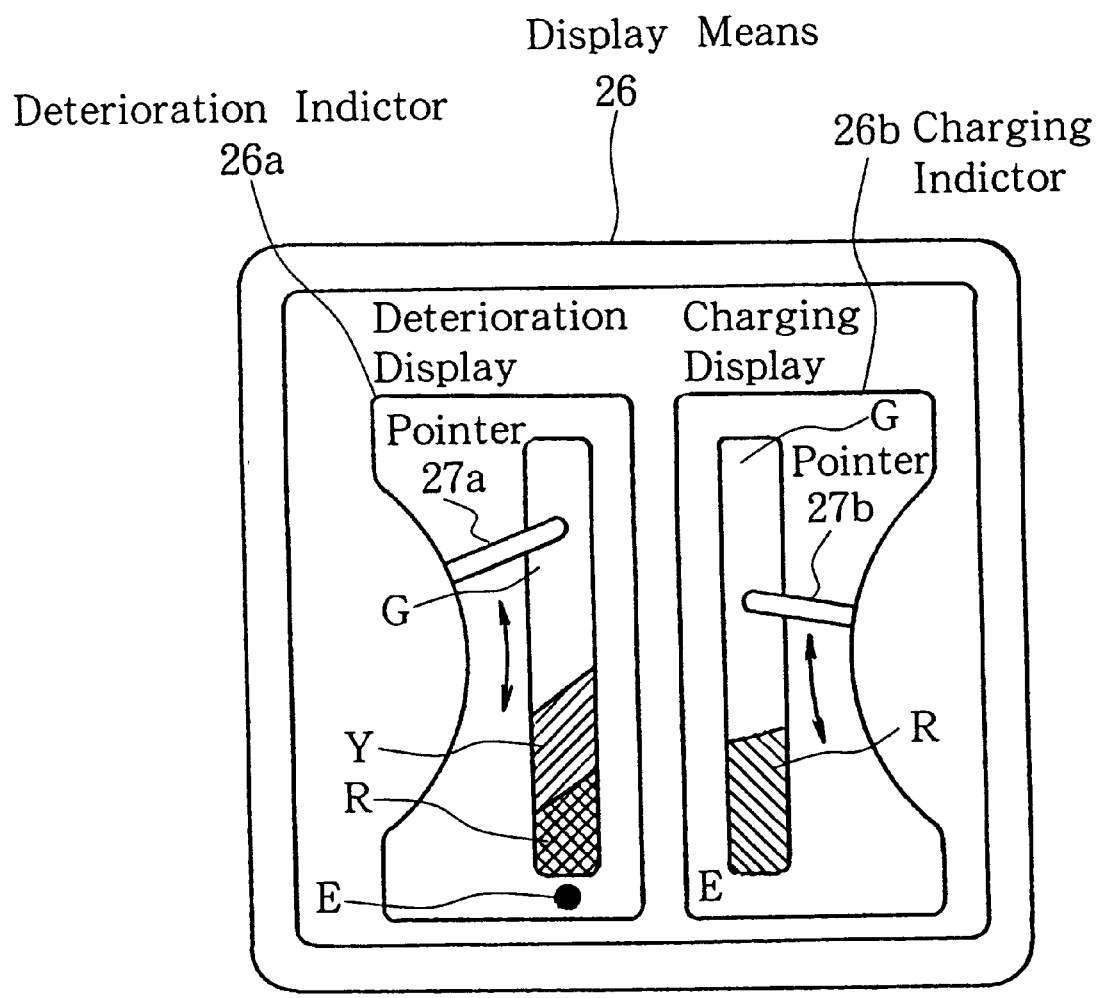
FIG. 15 shows an example of the display of the display means in a fourth embodiment of the present invention.

As shown in FIG. 15, display means 26 has deterioration indicator 26a which indicates the state of deterioration of unit cells 11, and charging indicator 26b which shows the state of charging of unit cells 11. Deterioration indicator 26a on the left gives an indication pertaining to battery life, while charging indicator 26b on the right gives an indication of the state of charging, or in other words it gives an indication with the same significance as a fuel gauge. A display such as given by charging indicator 26b has hitherto been widely adopted in electric vehicles.

Deterioration indicator 26a is subdivided in accordance with various states of deterioration, into state G (green) indicating that there is no deterioration, state Y (yellow) indicating that inspection is recommended, state R (red) indicating that battery replacement is recommended, and state E (lighting or flashing of a red lamp) indicating that battery replacement is necessary.

Furthermore, charging indicator 26b is subdivided into state G (green) indicating normal use, and state R (red) indicating that charging is necessary. There are additional indications according to the position of pointer 27b. If pointer 27b is close to the "F" mark in the G zone, a well charged state is being indicated, while if it is within the G zone but close to the R zone, the indication is that charging is advisable.

The indications of deterioration according to this invention are as follows. If pointer 27a is in the G zone, unit cells 11 are normal and can continue to be used without replacement if charging is carried out in accordance with the charging display. If pointer 27a is in the Y zone, inspection is necessary and travel should not be continued. If pointer 27b is in the R zone, inspection must be carried out without delay and any measures indicated by the results of the inspection must be followed. If the red lamp lights or flashes, this shows that the battery has completely deteriorated, and therefore immediate replacement of the battery is necessary.

Figure 16:
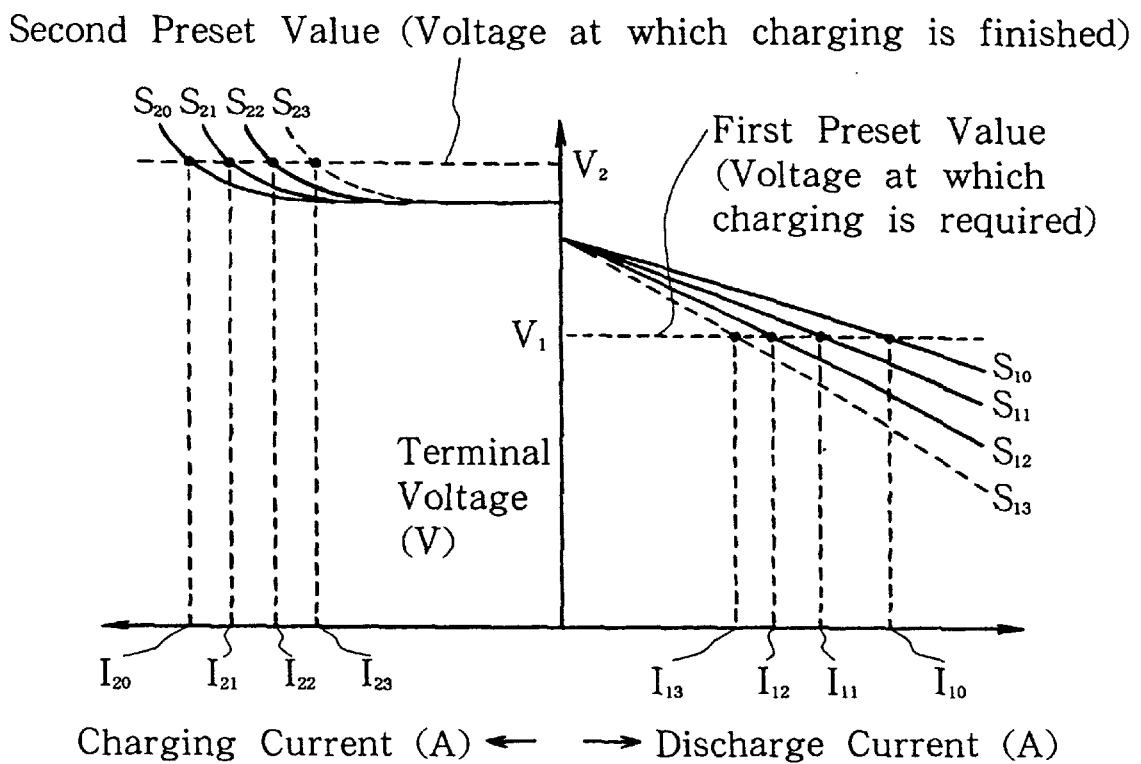
FIG. 16 shows the charging and discharging characteristics of a battery pertaining to a fourth embodiment of the present invention.

FIG. 16 shows the charging and discharging characteristics of a battery according to this fourth embodiment of the present invention. Battery deterioration can be observed by means of the relation between terminal voltage during use and the discharge current or charging current. In the case of the relation between terminal voltage and discharge current, as shown on the right-hand side of FIG. 16, if the voltage at which charging is required has been set to a first preset value $V_1$ and the battery has not deteriorated, its discharge characteristic will be $S_{10}$ and when the terminal voltage is $V_1$ the discharge current will be $I_{10}$. If the battery deteriorates a little and its characteristic is $S_{11}$, the discharge current will be $I_{11}$ which is smaller than $I_{10}$. When the battery further deteriorates and its characteristic is $S_{12}$, the discharge current will be $I_{12}$ which is smaller than $I_{11}$. If the battery has fully deteriorated its discharge characteristic will be $S_{13}$, and at an equivalent terminal voltage $V_1$ its discharge current will be $I_{13}$, which is smaller than $I_{12}$.

An explanation will now be given of charging characteristics. In the case of the relation between terminal voltage and charging current, if the battery is normal its charging characteristic will be $S_{20}$, and the charging current when the terminal voltage is $V_2$ will be $I_{20}$. If the battery deteriorates a little and its characteristic is $S_{21}$, the charging current when the terminal voltage is $V_2$ will be $I_{21}$, which is smaller than $I_{20}$. When the battery further deteriorates and its characteristic is $S_{22}$, the charging current at an equivalent terminal voltage $V_2$ will be $I_{22}$, which is smaller than $I_{21}$. If the battery has fully deteriorated its charging characteristic will be $S_{23}$ and the charging current when the terminal voltage is $V_2$ will be $I_{23}$, which is smaller than $I_{22}$.

Figure 17:
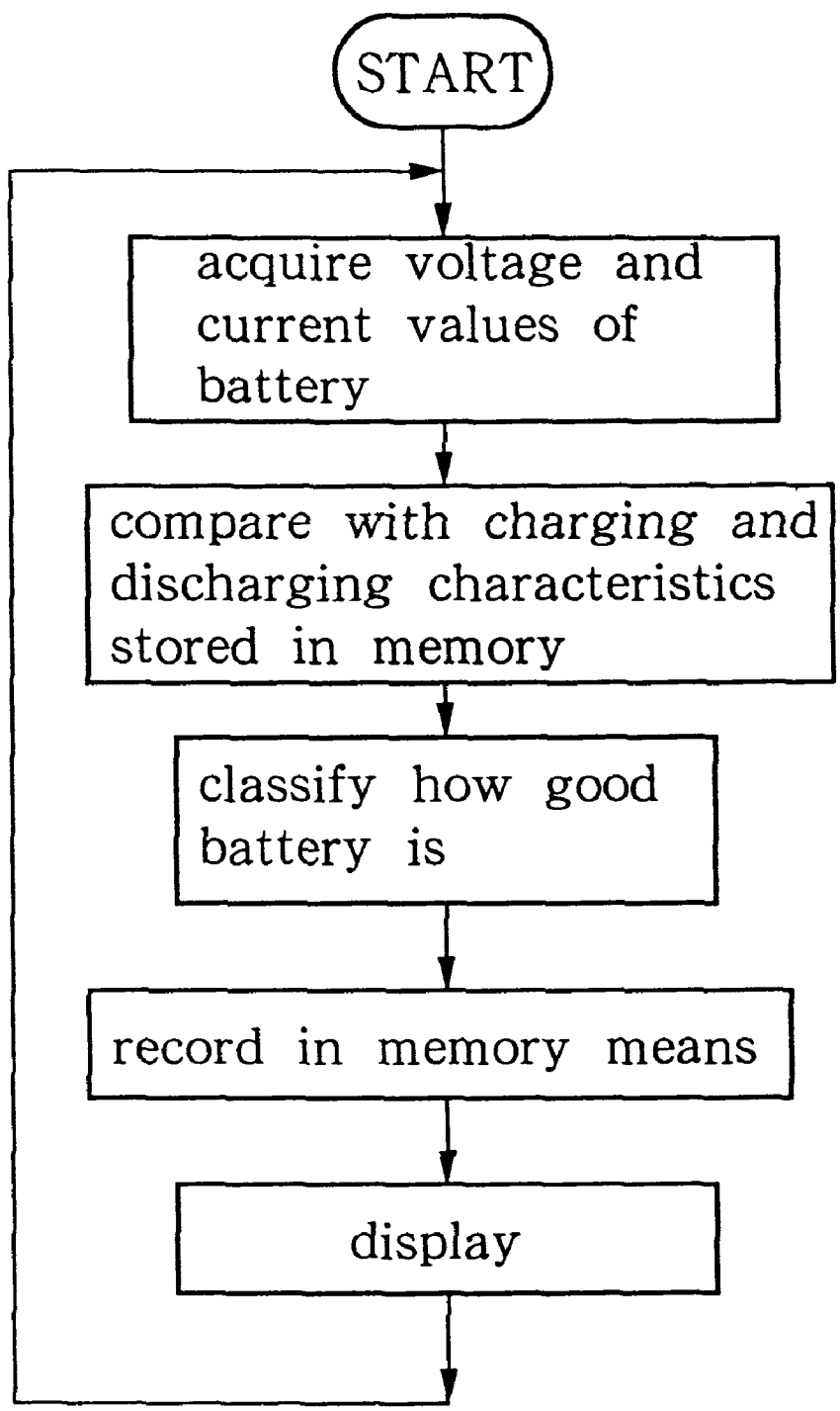
FIG. 17 is a flowchart showing the operation flow for battery information display in a fourth embodiment of the present invention.

An explanation will now be given of the operation of battery information display in the fourth embodiment of the present invention. FIG. 17 is a flowchart showing said operation flow for battery information display.

First of all, a plurality of charging and discharging characteristics which differ according to the degree of deterioration are stored in advance in memory means 7a of program control circuit 7. Program control circuit 7 acquires voltage and current values from voltage detection circuit 32 and current sensor 10, refers to the charging and discharging characteristics recorded in memory means 7a, and calculates information relating to the deterioration of the battery as a whole. On the basis of this calculated value it classifies how good the battery is, records this in memory means 7a, and displays it on display means 26. As mentioned previously, this display is subdivided and displays both the state of deterioration of the battery and its state of charging.

Fifth Embodiment

Figure 18:
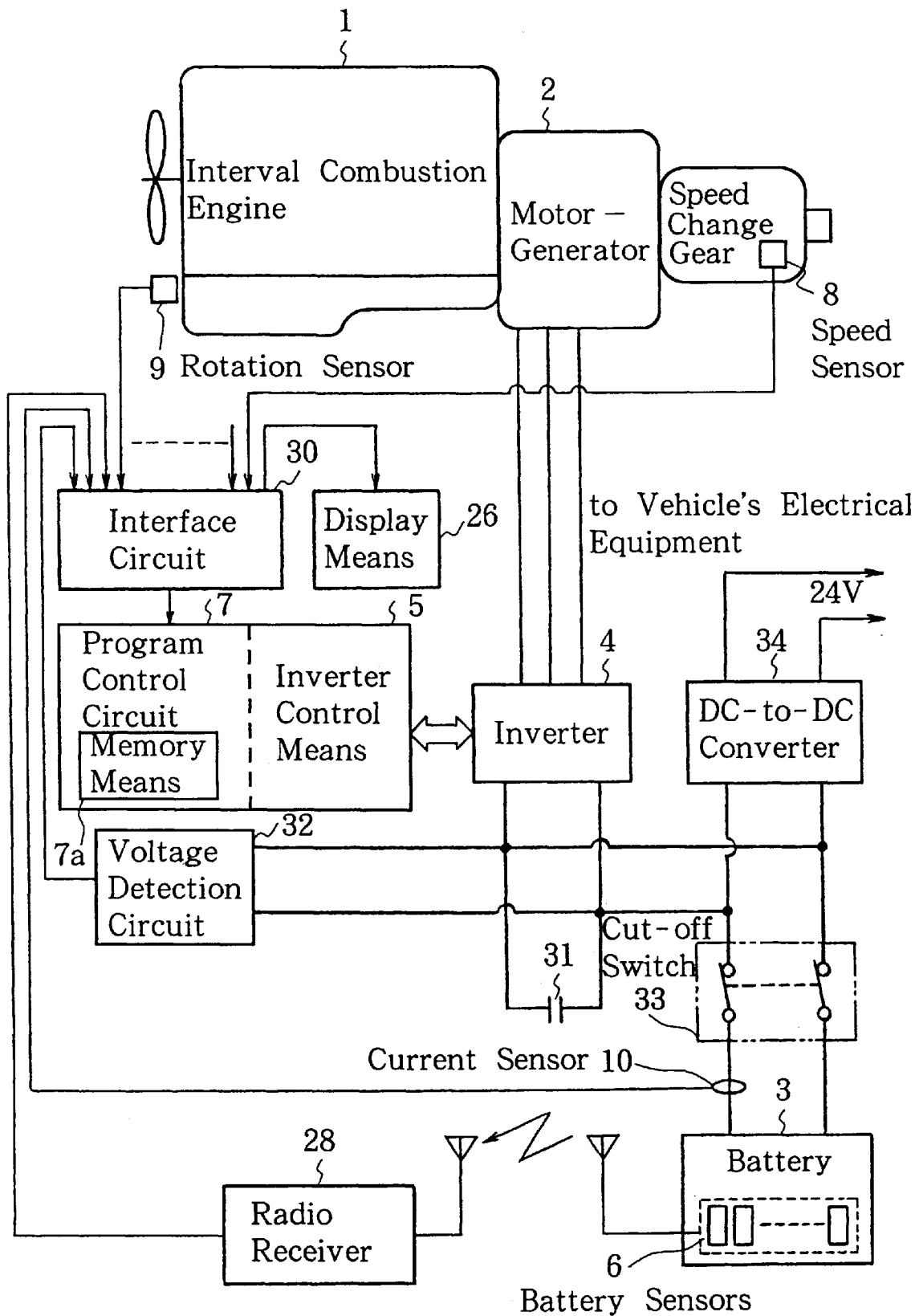
FIG. 18 is a block diagram showing the configuration of the essential parts of a fifth embodiment of the present invention.
Figure 19:
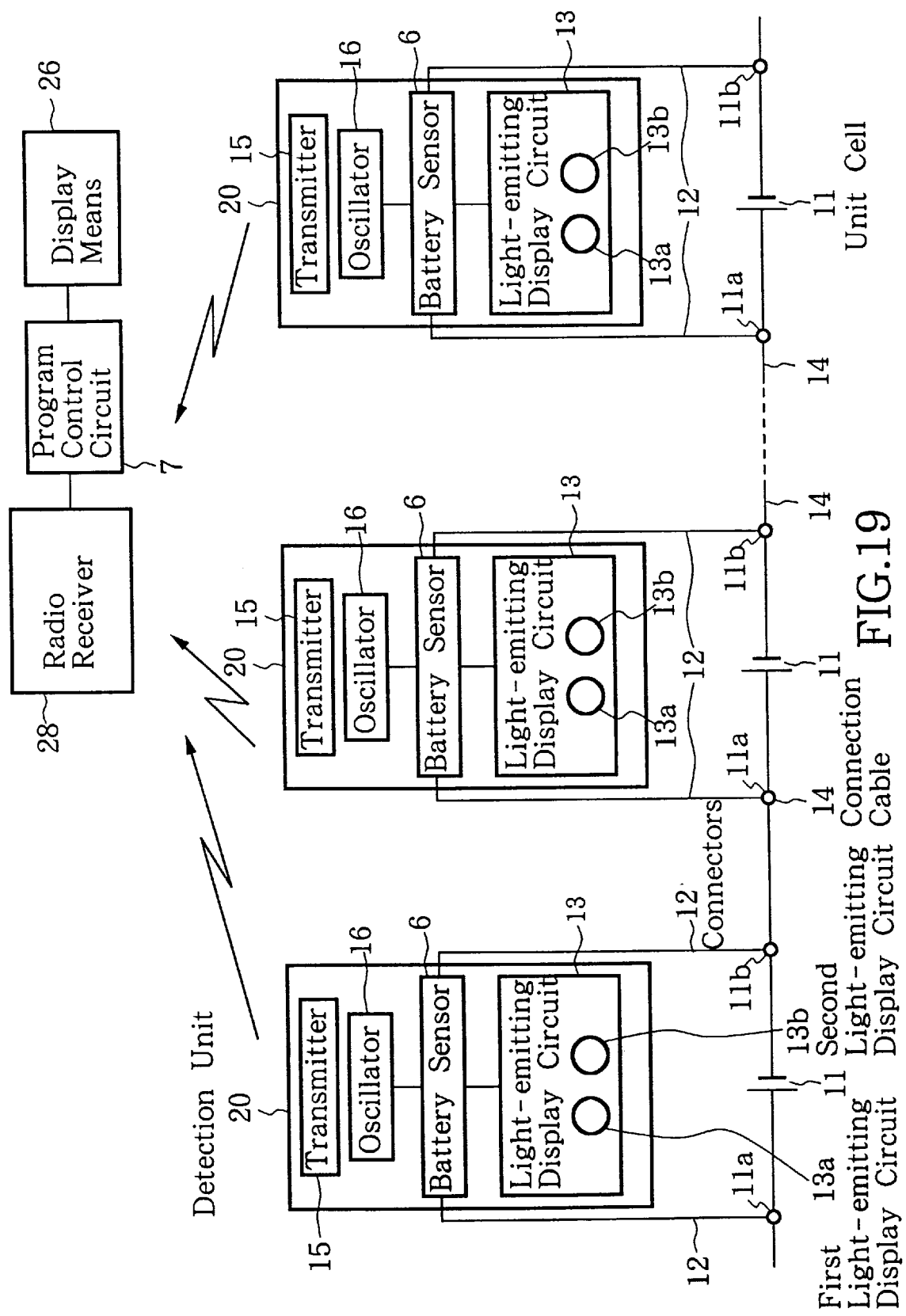
FIG. 19 is a block diagram showing the configuration of the essential parts of a fifth embodiment of the present invention.

FIG. 18 is block diagram showing the overall configuration of a fifth embodiment of the present invention, and FIG. 19 is a block diagram showing the configuration of the essential parts of this fifth embodiment.

Figure 20:
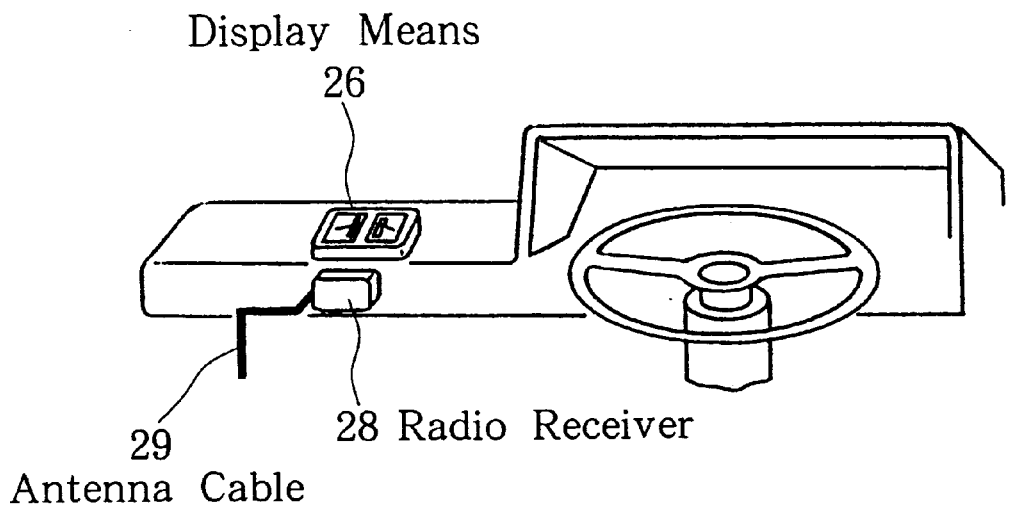
FIG. 20 is a perspective view showing an example of the disposition of the display means and radio receiver in a fifth embodiment of the present invention.
Figure 21:
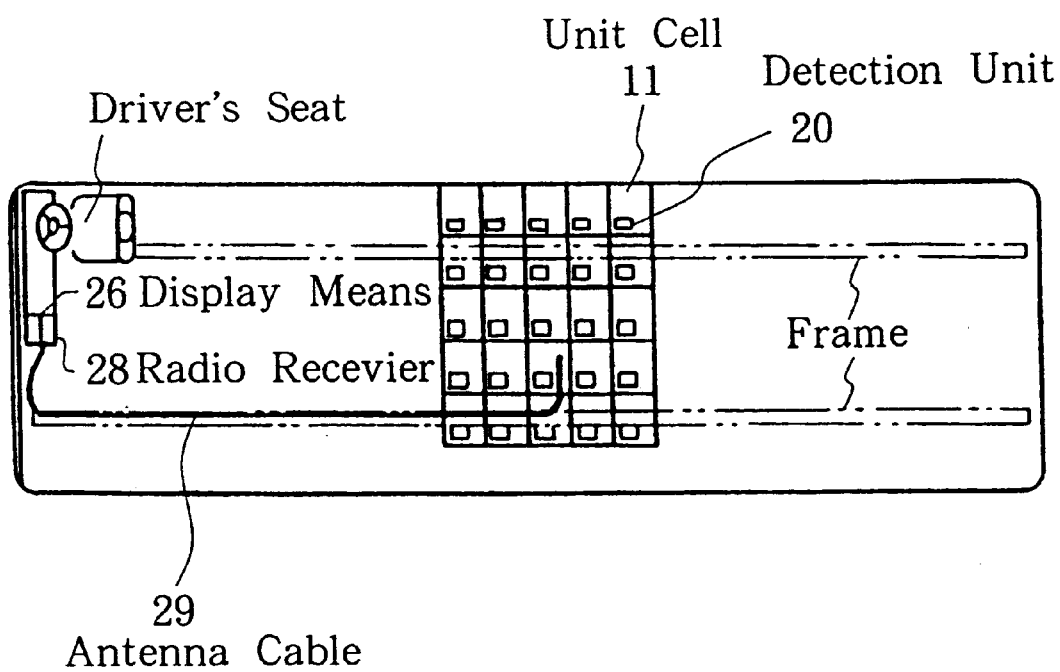
FIG. 21 shows the connection between a detection unit and the radio receiver in a fifth embodiment of the present invention.

In this fifth embodiment of the present invention, each unit cell 11 constituting the high-voltage battery is provided with detection unit 20 which has means for transmitting cell information by means of a radio signal. This fifth embodiment of the invention is also provided with radio receiver 28 for receiving radio signals. As shown in FIG. 20 and FIG. 21, radio receiver 28 and display means 26 are provided at the driver's seat, and radio receiver 28 is connected to each detection unit 20 by means of antenna cable 29.

In the case of this fifth embodiment, detection sensors 20 detect voltage information for individual unit cells 11, oscillators 16 generate electromagnetic waves in accordance with this detection output, and transmitters 15 transmit the detection information. The battery information thus transmitted is received by radio receiver 28, whereupon program control circuit 7 acquires this information, refers to the charging and discharging characteristics stored in memory means 7a, and calculates deterioration information for unit cells 11. The calculated information is displayed by display means 26. In this fifth embodiment, because battery information is detected individually from each of a multiplicity (twenty-five) of unit cells 11, the embodiment is constituted so that if all the unit cells 11 are in the normal ranges (S10–S12 and S20–S22) shown in FIG. 16, which was explained in connection with the fourth embodiment, pointer 27a shown in FIG. 15 will indicate the green region G. If the state of a small number of the twenty-five unit cells, for example from 1 to 5 cells, is such that replacement is required, pointer 27a will indicate the yellow region Y. In other words, if some of unit cells 11 exhibit early deterioration, continued use of these cells can result in this deterioration advancing further, leading to an increase in cell variability. It is therefore desirable to replace these deteriorated unit cells 11 at an early stage. If more unit cells 11 have deteriorated, the pointer will indicate the red zone R. The emergency light E will serve as a warning that deterioration is still more advanced and that the vehicle it in a state in which it will become unable to travel.

In the foregoing, a pointer-based display was explained using FIG. 15 as an exemplification. However, it is feasible to employ other display means. For example, the display means could use light-emitting diodes or other light-emitting elements, and could be configured so that the area of the light-emitting region changed in accordance with the quantity to be displayed.

According to the fifth embodiment explained above, a charging warning and information relating to the residual amount of charging and cell replacement time can be displayed at the driver's seat, this warning and information relating to cells, or to each unit cell, comprising a high-voltage battery mounted in an electric vehicle or hybrid car. As a result, the time or distance over which travel is possible before charging or battery replacement can be estimated, and a situation of the sort where the vehicle comes to a sudden stop while still on the road can be avoided. Moreover, because cells can receive frequent maintenance and battery life as a whole can be extended, the proportion of cells which are discarded can be decreased and pollution abated.

Sixth Embodiment

A sixth embodiment of the present invention is characterised in that it prevents the vehicle becoming unable to travel under its own power due to battery deterioration. This is prevented by displaying, at the driver's seat, information relating to the state of charging and replacement time of the battery mounted in the vehicle.

The configuration of the display means is the same as in the fifth embodiment illustrated in FIG. 20 and FIG. 21.

In addition to displaying the state of charging of the battery, this sixth embodiment displays, in subdivided manner at the driver's seat, the state of deterioration of the battery. In other words, it displays whether the battery is in a state where it can continue to be used on the basis of repeated charging and discharging, or whether it is in a state where deterioration has exceeded a limit and replacement is required. As a result, the driver can immediately take action in accordance with this information. It is therefore possible to avoid a situation of the sort where, due to having missed the time for battery replacement, the vehicle ends up coming to a stop while on the road. Moreover, because cells can receive frequent maintenance and battery life as a whole can be extended, the proportion of cells which are discarded can be decreased and pollution abated.

Furthermore, the charging indicator is subdivided into state G (green) indicating normal use, and state R (red) indicating that charging is necessary. There are additional indications according to the position of pointer 27b shown in FIG. 15. If the pointer is close to the top of the G zone, a well charged state is being indicated, while if it is within the G zone but close to the R zone, the indication is that charging is advisable.

Furthermore, the indications of deterioration are as follows. If pointer 27a is within the G zone, the battery is normal and can continue to be used if charging is carried out in accordance with the charging display. If pointer 27a is in the Y zone, inspection is necessary and travel should not be continued. If pointer 27a is in the R zone, inspection must be carried out without delay and any measures indicated by the results of the inspection must be followed. If the red lamp lights up or, flashes, this shows that the battery has deteriorated close to its ultimate life, and there is the possibility of breakdown on the road. Immediate replacement of the battery is therefore necessary.

Measurement of battery life can be performed in the same manner as in the fifth embodiment illustrated in FIG. 16 and FIG. 17, and the same results can be obtained.

Seventh Embodiment

The overall configuration of a seventh embodiment of the present invention is the same as that of the first embodiment shown in FIG. 1.

Figure 22:
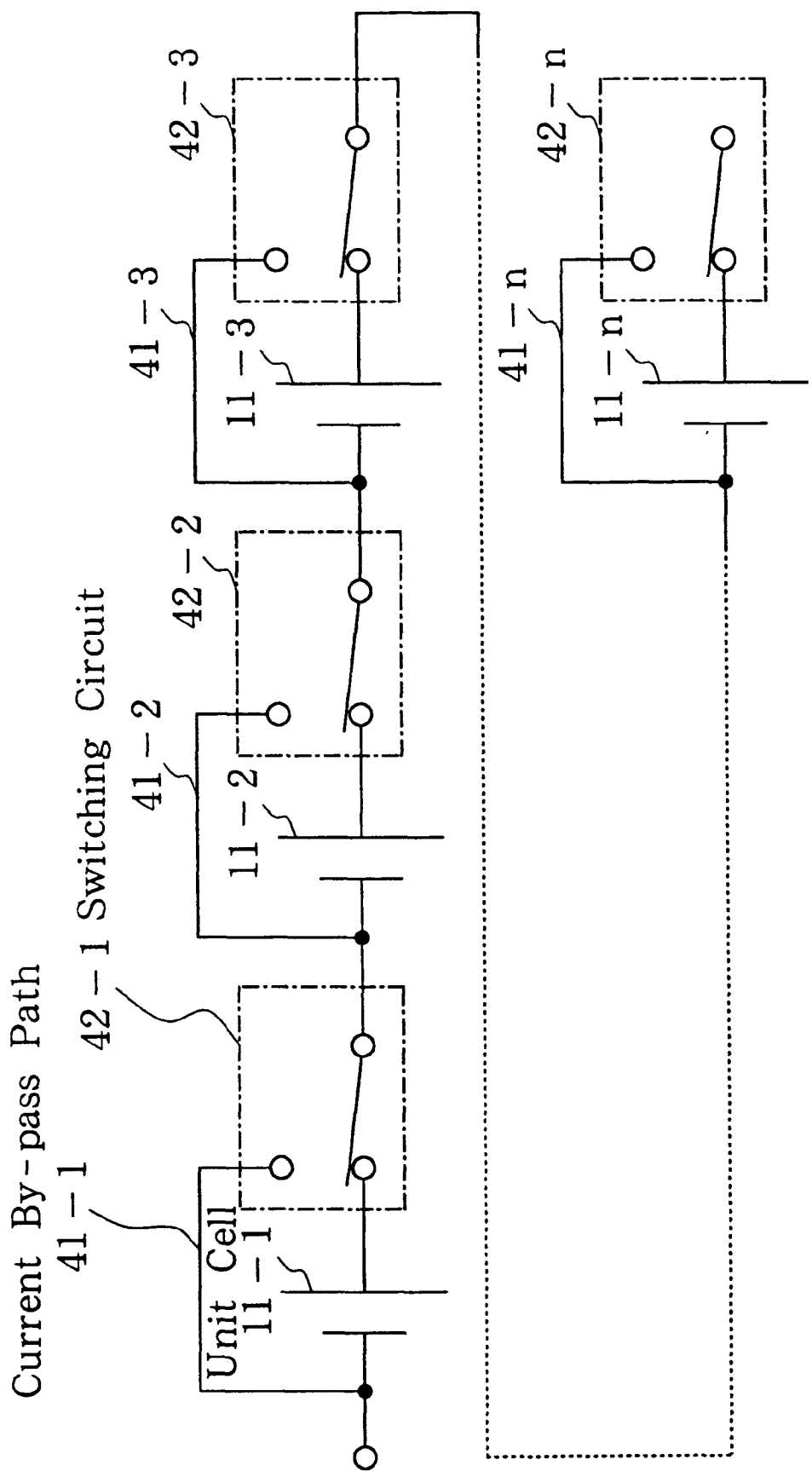
FIG. 22 shows the fundamental concept of a seventh embodiment of the present invention.
Figure 23:
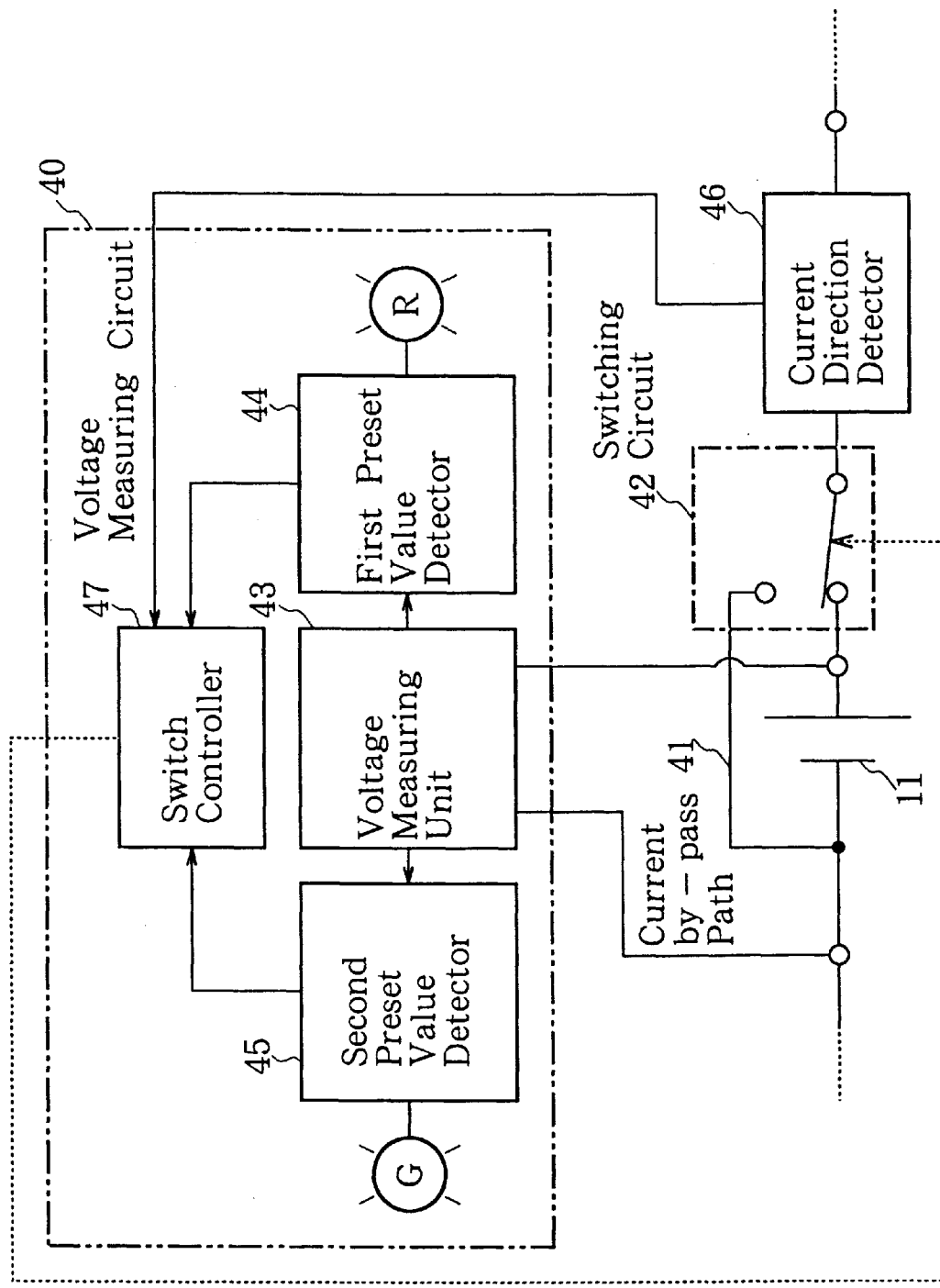
FIG. 23 shows the configuration of the essential parts of a seventh embodiment of the present invention.
Figure 24:
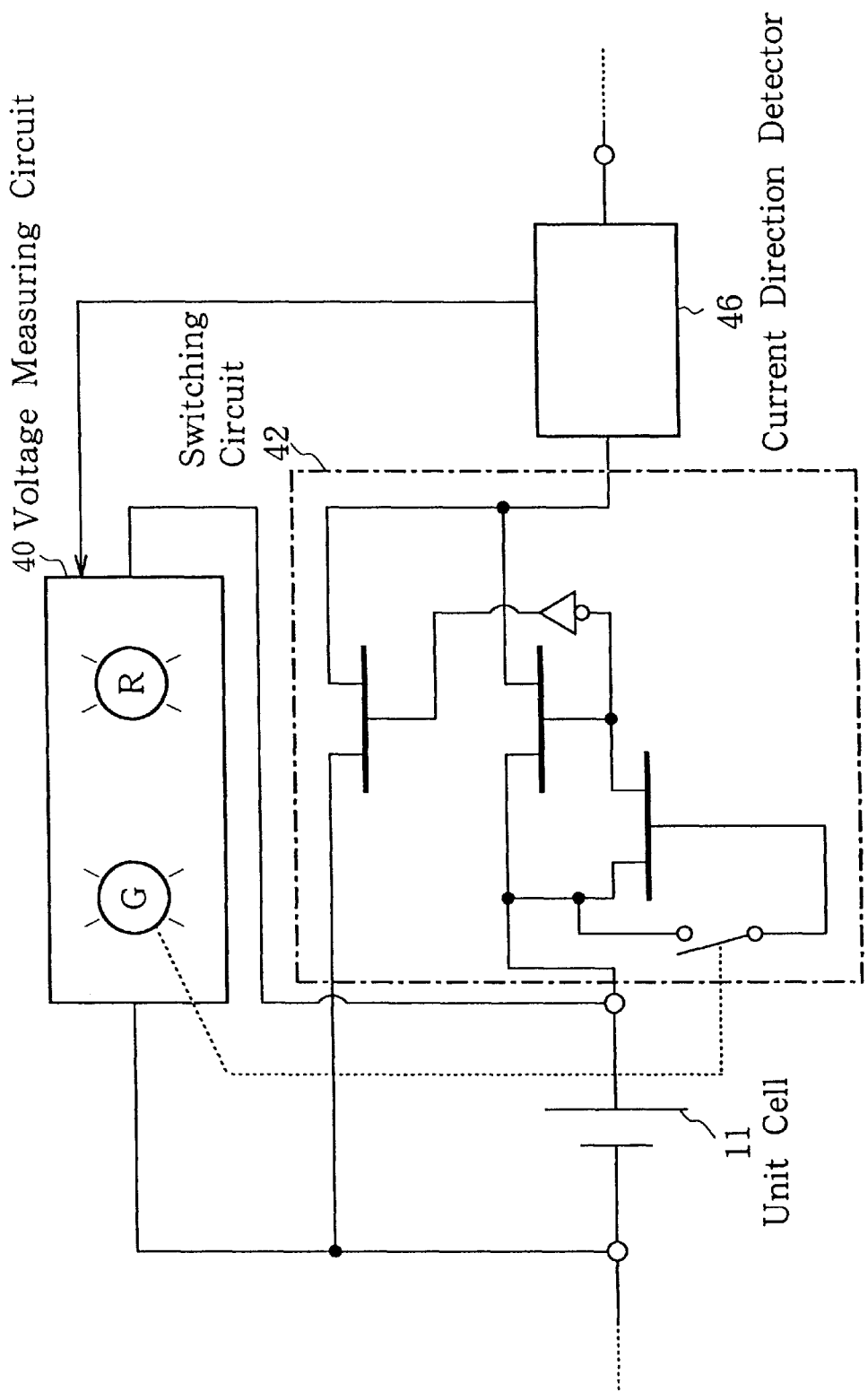
FIG. 24 shows the configuration of a semiconductor switching element used in a seventh embodiment of the present invention.

FIG. 22 shows the fundamental concept of the seventh embodiment of the present invention, FIG. 23 shows the configuration of the essential parts of the seventh embodiment, and FIG. 24 shows the configuration of the semiconductor switching element used in this seventh embodiment.

As shown in FIG. 22, in the seventh embodiment of the present invention each unit cell 11-1 to 11-n is provided with a current by-pass path 41-1 to 41-n and a switching circuit 42-1 to 42-n capable of selecting either the path given by a current by-pass path 41-1 to 41-n or the path given by a unit cell 11-1 to 11-n. As shown in FIG. 23, each unit cell 11-1 to 11-n is also provided with a measuring circuit for measuring the terminal voltage of that unit cell. This measuring circuit comprises voltage measuring unit 43, first preset value detector 44, second preset value detector 45, and switch controller 47 which controls, in accordance with the output information of first preset value detector 44 and second preset value detector 45, an individual switching circuit of 42-1 to 42-n, each such switching circuit serving to switch current direction detector 46.

As shown in FIG. 24, switching circuits 42-1 to 42-n comprise semiconductor switching elements, and a switch controller 47 is provided individually for each unit cell 11-1 to 11-n.

Next, the operation of this seventh embodiment of the invention will be explained. As shown in FIG. 22, each unit cell 11-1 to 11-n is provided with a current by-pass path 41-1 to 41-n and a switching circuit 42-1 to 42-n. When all of the n switching circuits 42-1 to 42-n are switched to the cell side, the n unit cells 11-1 to 11-n will all be connected in series. Under these circumstances, if for example switching circuit 42-1 is switched to the current by-pass path 41-1 side, unit cell 11-1 is opened and n-1 unit cells 11-2 to 11-n are connected in series.

Because charging time varies due to the variability in performance of unit cells 11-1 to 11-n, this seventh embodiment avoids performance deterioration due to overcharging by opening unit cells 11-1 to 11-n as soon as charging is completed. Unit cells 11-1 to 11-n can be opened by the switching action of switching circuits 42-1 to 42-n. In addition, the driver can be notified of the charging and discharging state of unit cells 11-1 to 11-n.

Figure 25:
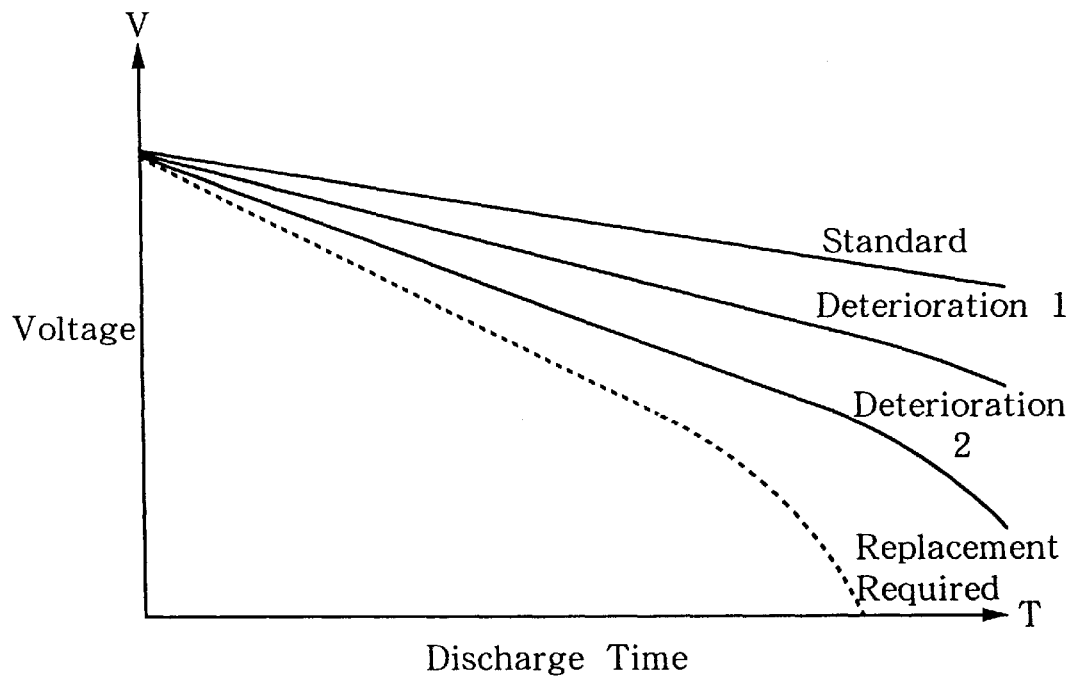
FIG. 25 shows the relation between unit cell discharge characteristics and deterioration in a seventh embodiment of the present invention.
Figure 26:
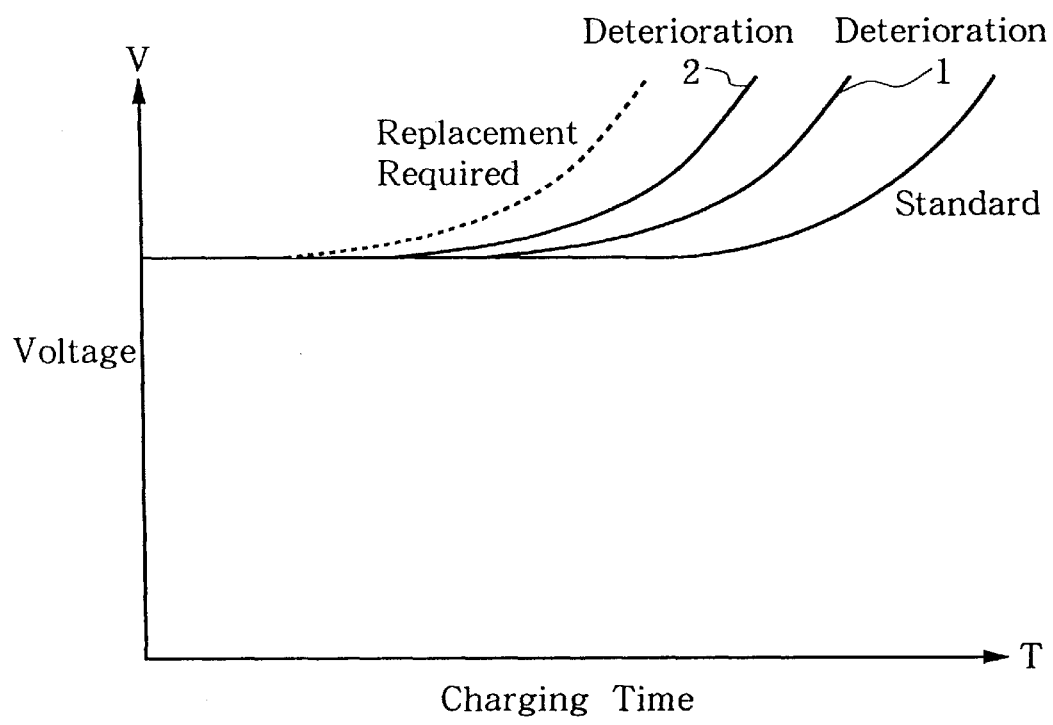
FIG. 26 shows the relation between unit cell charging characteristics and deterioration in a seventh embodiment of the present invention.

The relations between deterioration and charging and discharging characteristics in unit cells 11-1 to 11-n are shown in FIG. 25 and FIG. 26. FIG. 25 shows the relation between discharge characteristics and deterioration of unit cells 11-1 to 11-n, with discharge time (T) taken along the horizontal axis and voltage (V) taken along the vertical axis. The characteristics shown are based on obtaining a fixed discharge current at a fixed load. FIG. 26 shows the relation between charging characteristics and deterioration of unit cells 11-1 to 11-n, with charging time (T) taken along the horizontal axis and voltage (V) taken along the vertical axis. The characteristics shown are based on charging using a fixed charging current. FIG. 25 shows that as deterioration advances, discharge is accompanied by more rapid voltage drop. FIG. 26 shows that as deterioration advances, voltage increases and the completion of charging is reached within a shorter time.

An explanation will now be given of the first preset value and the second preset value. As shown in FIG. 25 and FIG. 26, the voltage of unit cells 11-1 to 11-n changes in accordance with the current during charging and discharging. Assuming that the standard voltage of unit cells 11-1 to 11-n is 12V, it is found that if charging and discharging are repeated in cells of a certain type with the cells in a normal state, their terminal voltage will vary between 11.4V and 13.2V. In this case it would for example be useful to set 11.4V as the voltage at which charging is required (i.e., the first preset value) and to set 13.2V as the voltage at which charging is finished (i.e., the second preset value). These two preset values should be set in accordance with the properties of the cells, and should also include a margin according to how the cells are used.

Figure 27:
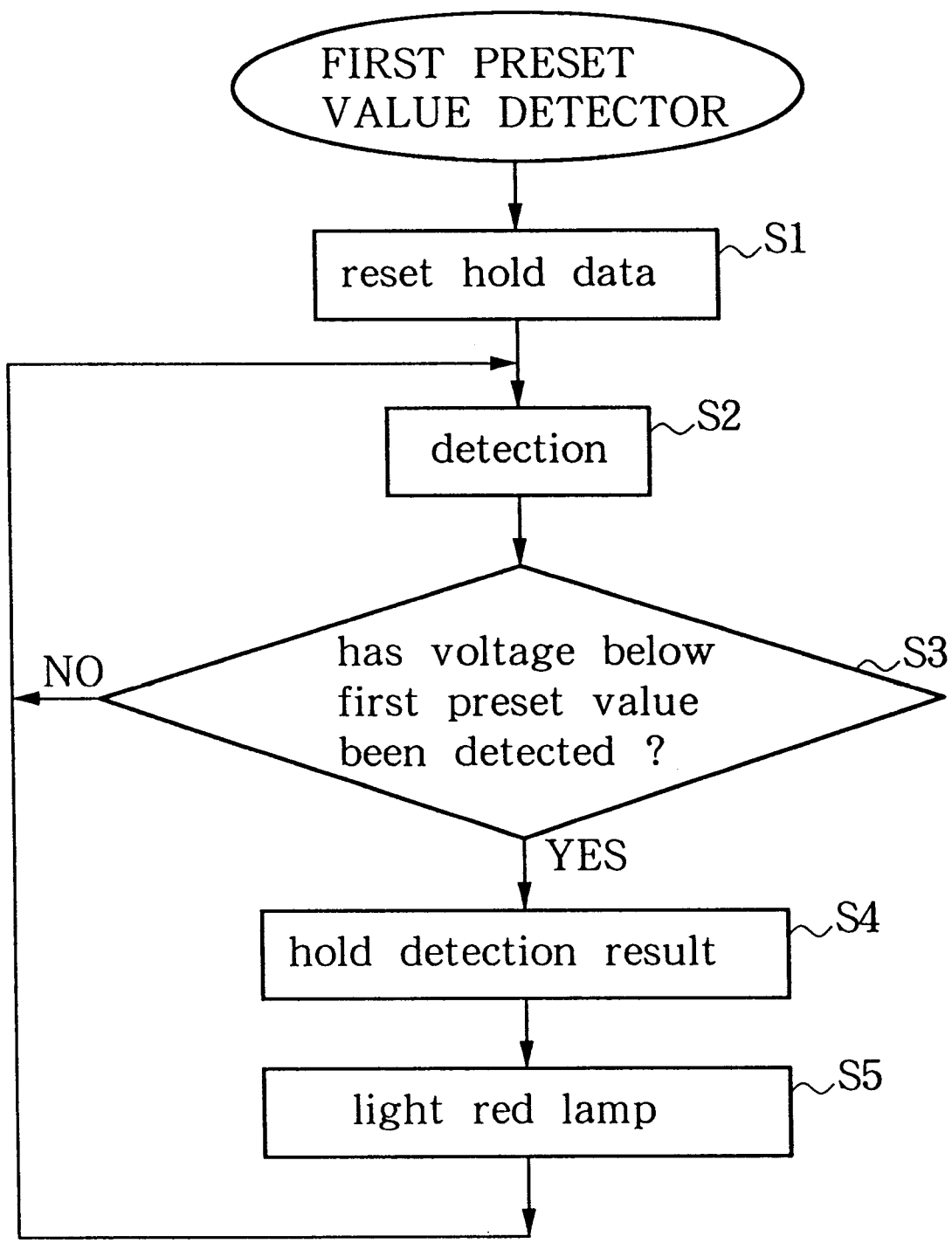
FIG. 27 is a flowchart showing the operation flow of the first preset value detector in a seventh embodiment of the present invention.
Figure 28:
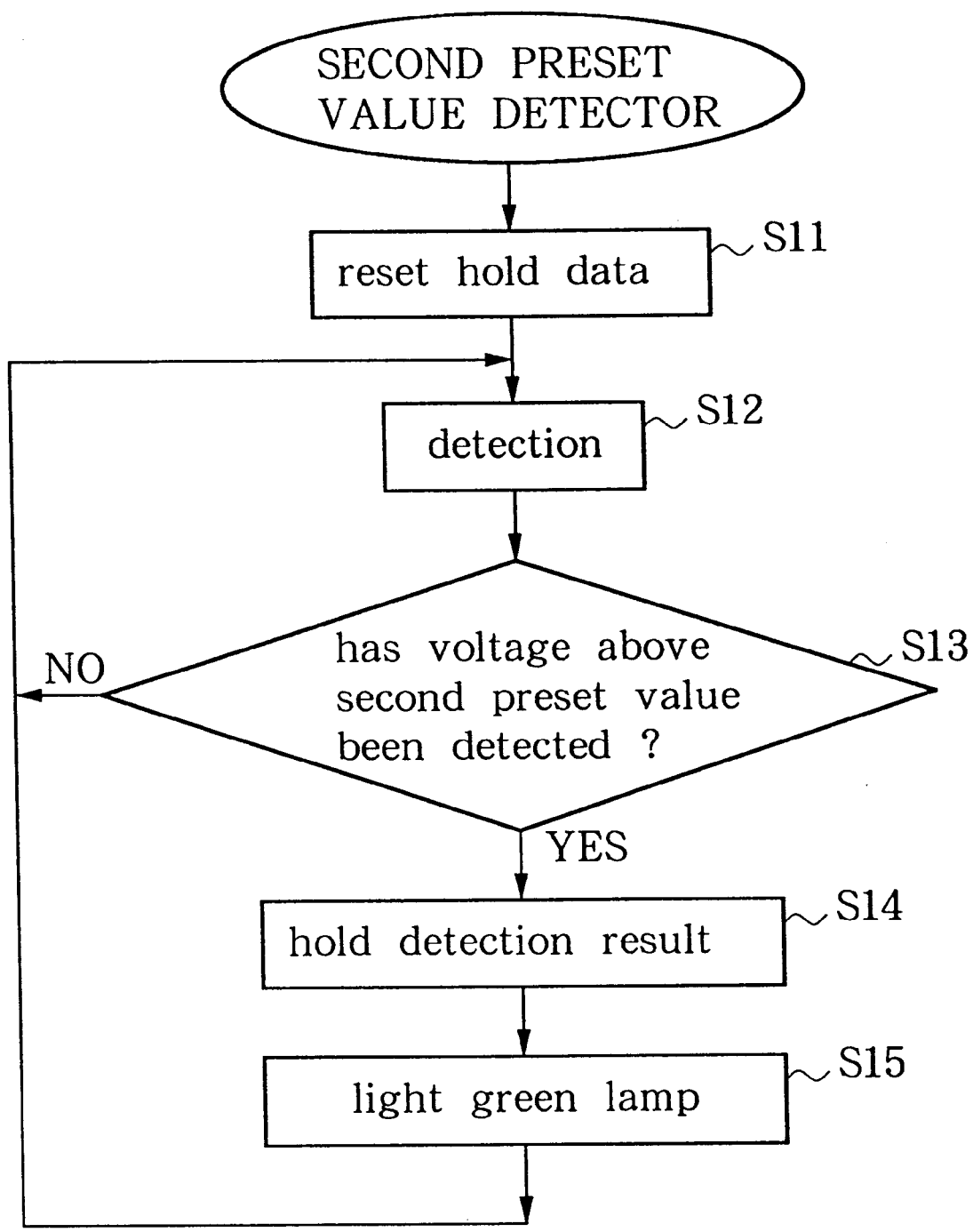
FIG. 28 is a flowchart showing the operation flow of the second preset value detector in a seventh embodiment of the present invention.

The operation of voltage measuring circuit 40 of this seventh embodiment of the present invention will be explained with reference to FIG. 27 and FIG. 28. FIG. 27 is a flowchart showing the operation of first preset value detector 44, while FIG. 28 is a flowchart showing the operation of second preset value detector 45. In the flowchart shown in FIG. 27, at startup, any currently held data is first of all reset (S1). The voltage values of each unit cell 11-1 to 11-n are then detected (S2) and when a voltage value equal to or below the first preset value has been detected (S3), this result is held (S4) and red lamp R lights (S5).

A voltage of below the first preset value (11.4V) is generally detected when a current is being extracted from a battery, or in other words when a load is applied to unit cells 11-1 to 11-n. This happens when the vehicle accelerates using squirrel-cage polyphase induction machine 2 and the load on unit cells 11-1 to 11-n has increased. Accordingly, because the terminal voltage reaches a value in excess of the first preset value when the load is reduced, if the detection history has not been held, there is a strong possibility that the detection result will have disappeared before it can be used as control data. In other words, red lamp R operates as follows. An overdischarge condition occurs in unit cells 11-1 to 11-n when a load is applied, and for any unit cells 11-1 to 11-n at which the voltage has decreased to below the first preset value, the red lamp will continue to light even though the terminal voltage rises again. Subsequently, if the voltage increases further and reaches the second preset value, the green lamp G will light, but even now the red lamp will continue to light.

In the flowchart shown in FIG. 28, at startup, any currently held data is first of all reset (S11). The voltage values of each unit cell 11-1 to 11-n are then detected (S12) and when a voltage value equal to or above the second preset value has been detected (S13), this result is held (S14) and green lamp G lights (S15).

The green lamp G lights when the terminal voltage of a unit cell 11-1 to 11-n exceeds the second preset value. In this example, the green lamp G also remains lit. Green lamp G lights when a condition of overcharge has occurred in a unit cell 11-1 to 11-n. Thereafter, even if discharge is carried out and the overcharge condition is removed, the green lamp G remains lit.

Although this red lamp R and green lamp G have no direct connection with the present invention, after a vehicle in which this control system is mounted has finished operating, the driver or supervisor can ascertain the state of unit cells 11-1 to 11-n by means of the lighting of the red lamp and the green lamp G. In particular, if deterioration is advanced in a certain unit cell 11-i, there will be a tendency for the red lamp and the green lamp G of that unit cell 11-i to light before those of other unit cells, and therefore the supervisor can perform an efficient inspection by inspecting unit cell 11-i on which the red lamp and the green lamp G are lit.

Figure 29:
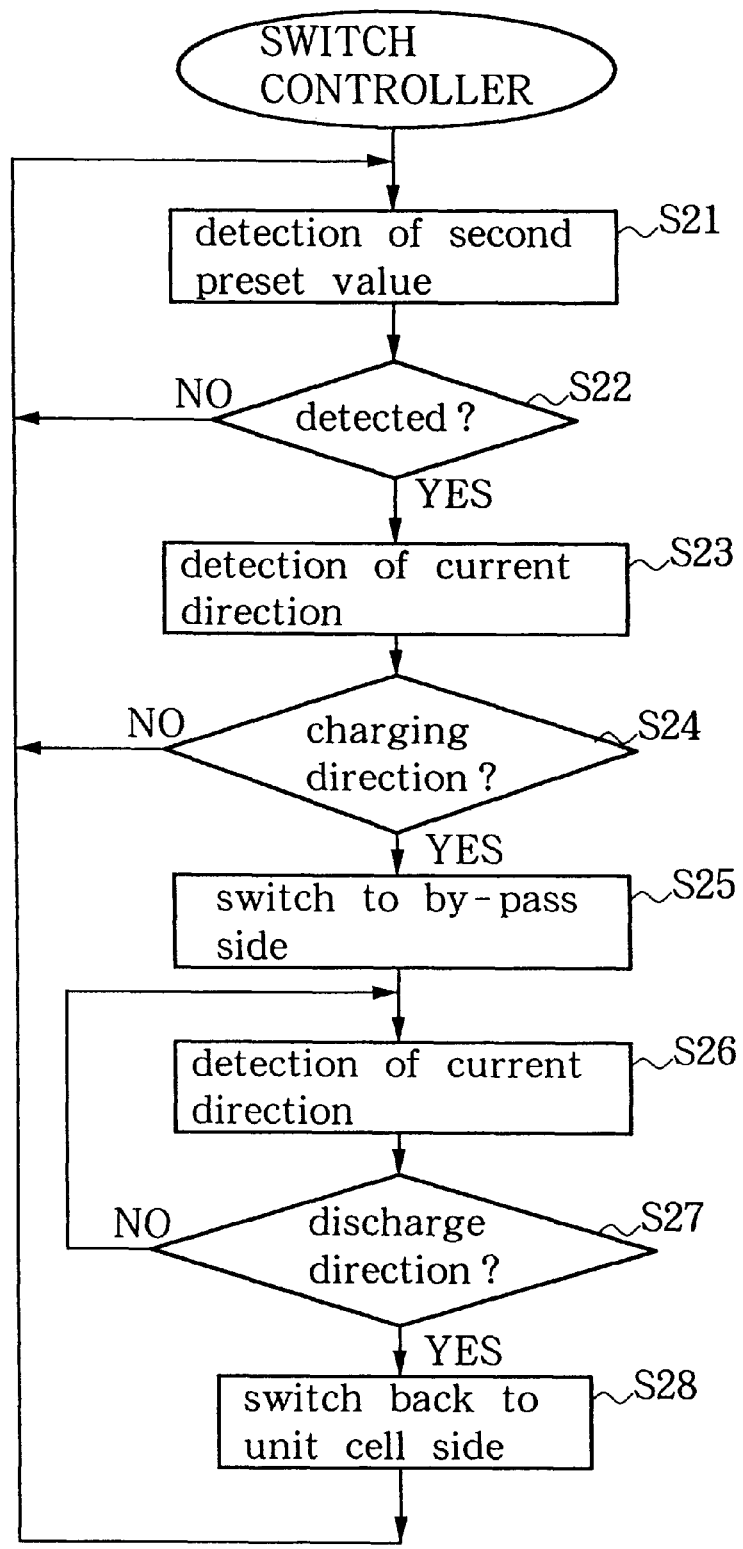
FIG. 29 is a flowchart showing the operation flow of the switch controller in a seventh embodiment of the present invention.

In this seventh embodiment of the invention, switching circuits 42-1 to 42-n are controlled automatically by switch controller 47 shown in FIG. 23. The operation of switch controller 47 of this seventh embodiment will be explained with reference to FIG. 29, which is a flowchart showing the operation of said switch controller. In this flowchart, the second preset value for unit cells 11-1 to 11-n is detected (S21), and when the second preset value has been detected (S22), the current direction is detected by current direction detector 46 (S23). If the current direction at this time is the charging direction (i.e., the direction of flow from the negative side to the positive side) (S24), switching circuit 42 is switched to the current by-pass path 41 (S25). The current direction is then detected by means of current direction detector 46 (S26), and if the current direction is the discharge direction (i.e., the direction of flow from the positive side to the negative side) (S27), switching circuit 42 is switched back to the unit cell 11-1 to 11-n side (S28). Current direction detector 46 was implemented using a Hall element.

In other words, when charging of unit cells 11-1 to 11-n is completed, the voltage of unit cells 11-1 to 11-n rises to the second preset value. Because there is a risk of overcharging if charging is continued when the current direction is the charging direction, overcharging can be avoided by switching circuit 42 to the current by-pass path 41. If the current direction changes to the discharge direction, switching circuit 42 rapidly switches back to the unit cell 11-1 to 11-n side.

Although the explanation given of this example assumed the use of the semiconductor switching element illustrated in FIG. 24, if the current flowing in the semiconductor switching element increases and the heat release from said element becomes large, or the heat sink becomes large, the following configuration using a contact switch is possible. Namely, switching circuit 42 shown in FIG. 23 is made into a contact switch, and when the current value being monitored by current direction detector 46 is nearly zero, this contact switch is operated. By means of this configuration, even if the current flowing in the contact switch increases, the contact switch will still be in a stable state, and since the contact resistance is small, heat release or switch damage will practically disappear.

Figure 30:
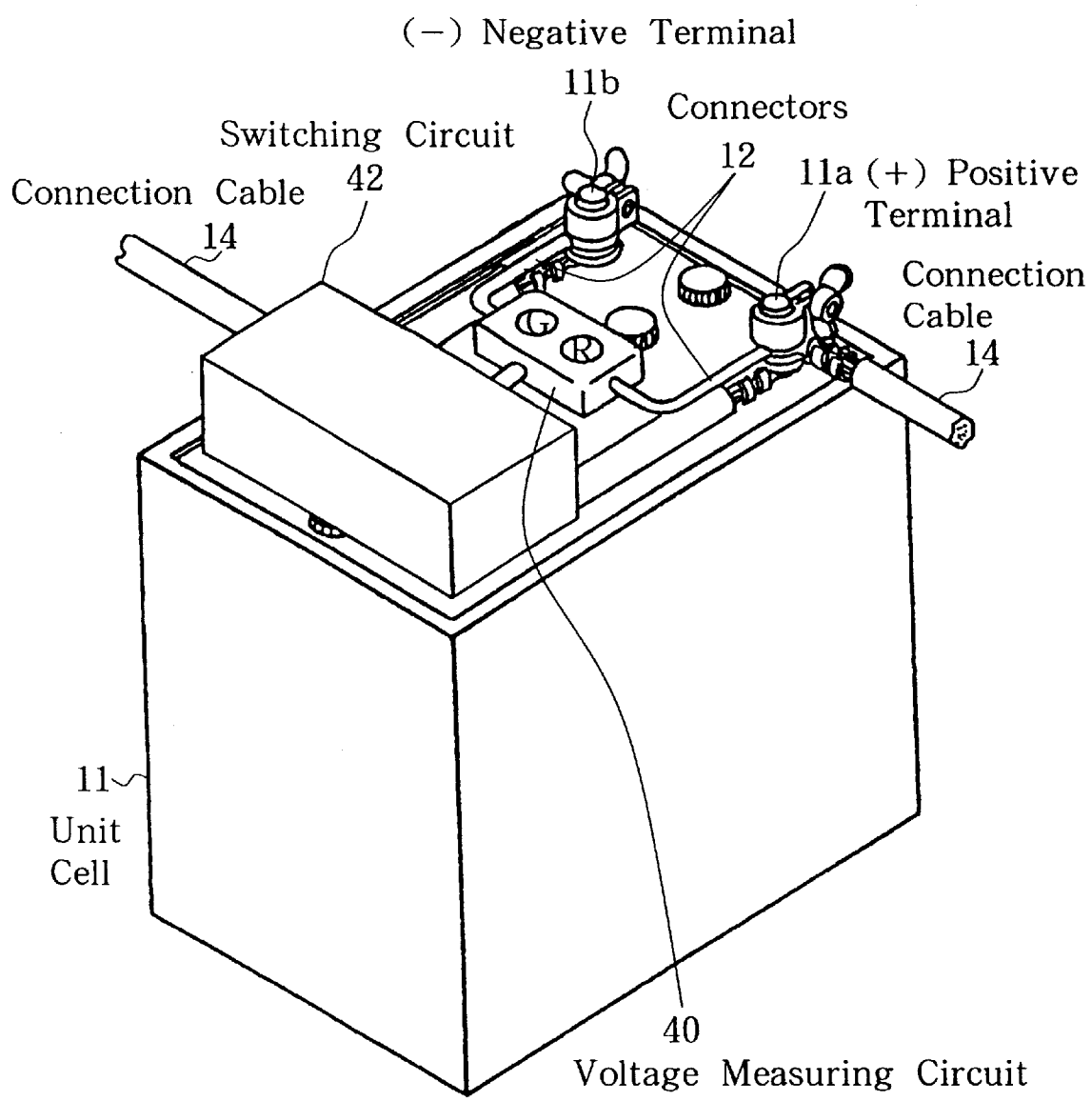
FIG. 30 is a perspective view showing the configuration of a unit cell in a seventh embodiment of the present invention.

An example of the external appearance of unit cell 11 in this seventh embodiment of the invention is shown in FIG. 30. Voltage measuring circuit 40 and switching circuit 42 are mounted on top of unit cell 11, and are each connected by connectors 12 to positive terminal 11a and negative terminal 11b. Unit cell 11 is connected to other adjacent unit cells 11 by connection cables 14.

Figure 31:
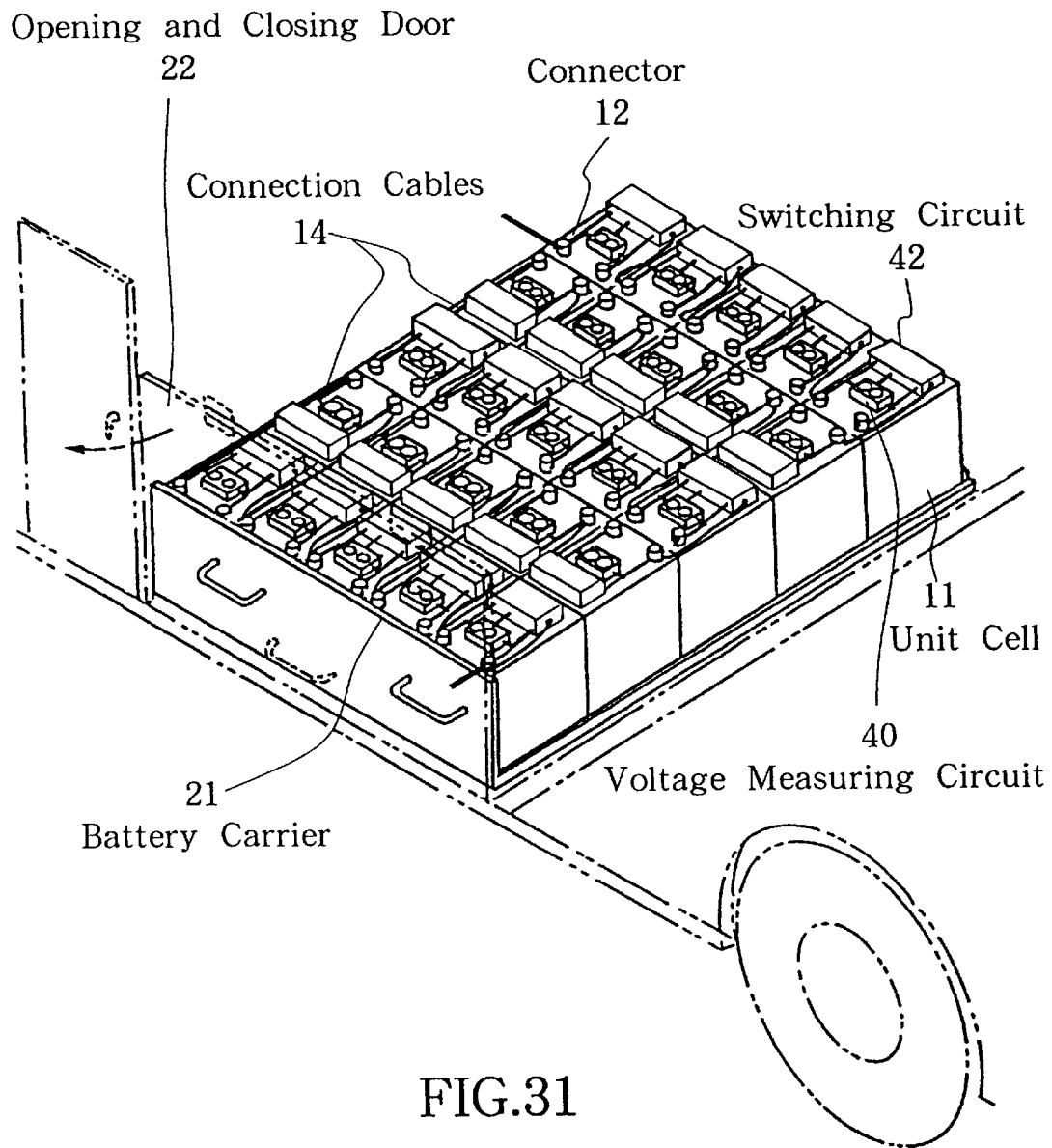
FIG. 31 is a perspective view showing an example of unit cells mounted on a vehicle in a seventh embodiment of the present invention.

An example of unit cells 11 mounted on a vehicle in this seventh embodiment of the invention is given in FIG. 31. As in the first embodiment, a plurality of unit cells 11 are mounted in centralised manner on battery carrier 21 and are housed in a battery compartment provided behind opening and closing door 22. The driver or supervisor can inspect unit cells 11 by drawing out battery carrier 21.

Figure 32:
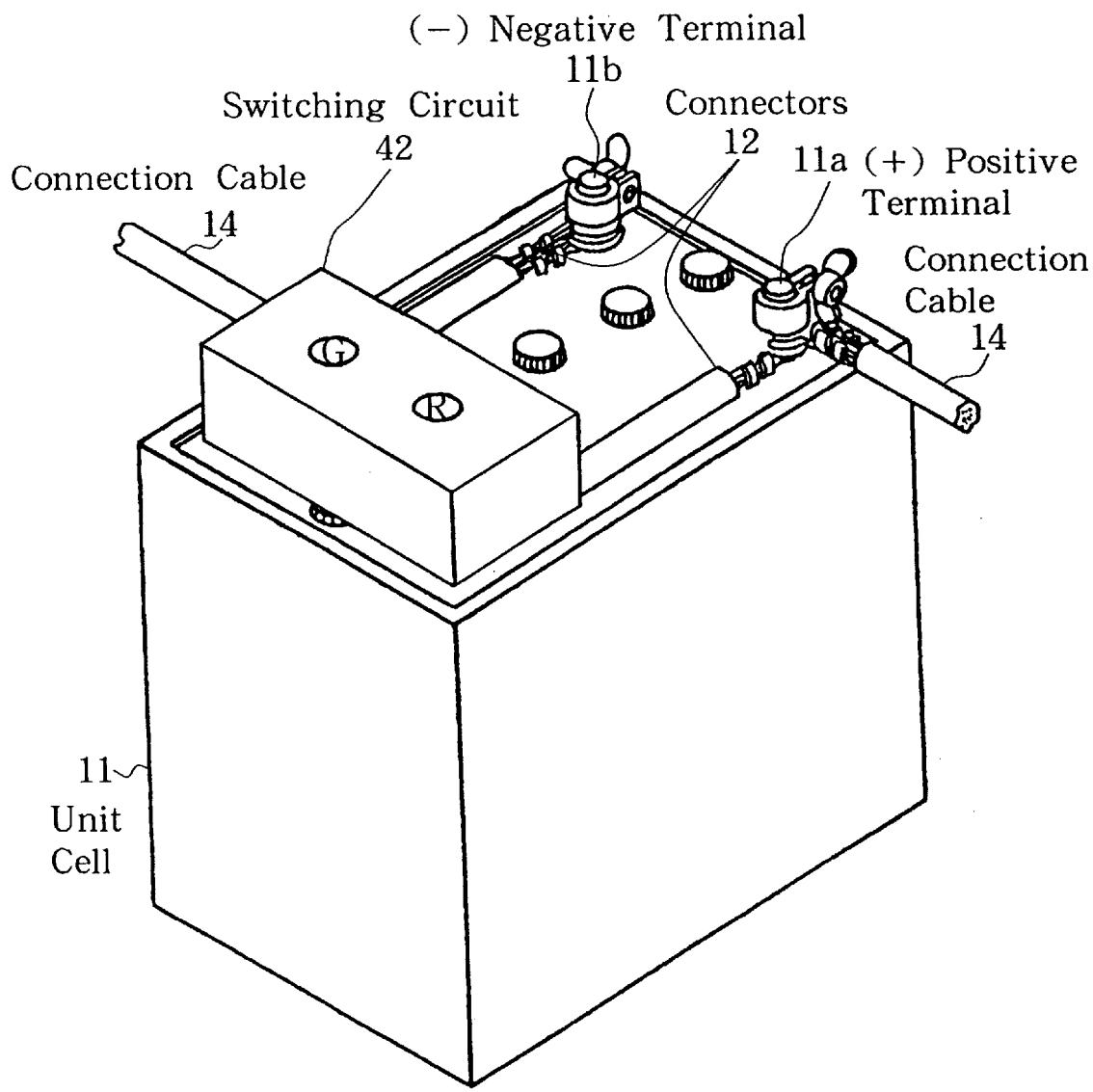
FIG. 32 is a perspective view showing an example of another configuration of a unit cell in a seventh embodiment of the present invention.

An example of another configuration of unit cell 11 in this seventh embodiment of the invention is shown in FIG. 32. In this example, voltage measuring circuit 40 is housed in the same unit as switching circuit 42. Although the work involved in wiring and the installation space can both be reduced compared with the example shown in FIG. 30, consideration has to be given to heat dissipation to ensure that heat release from the semiconductor switching element of switching circuit 42 does not affect switch controller 47 or other control circuits.

As explained above, this seventh embodiment can increase the service life of a battery. It can also control in such manner that, when a multiplicity of unit cells are used connected electrically in series, cell deterioration becomes uniform even if there is variability in the characteristics of these unit cells. It can also implement a control system such that, even if there is variability in the characteristics of the unit cells, this variability does not increase as a result of long-term use. The present invention can reduce battery costs for an electric vehicle. It can also implement a control system which simplifies battery maintenance.

Eighth Embodiment

Figure 33:
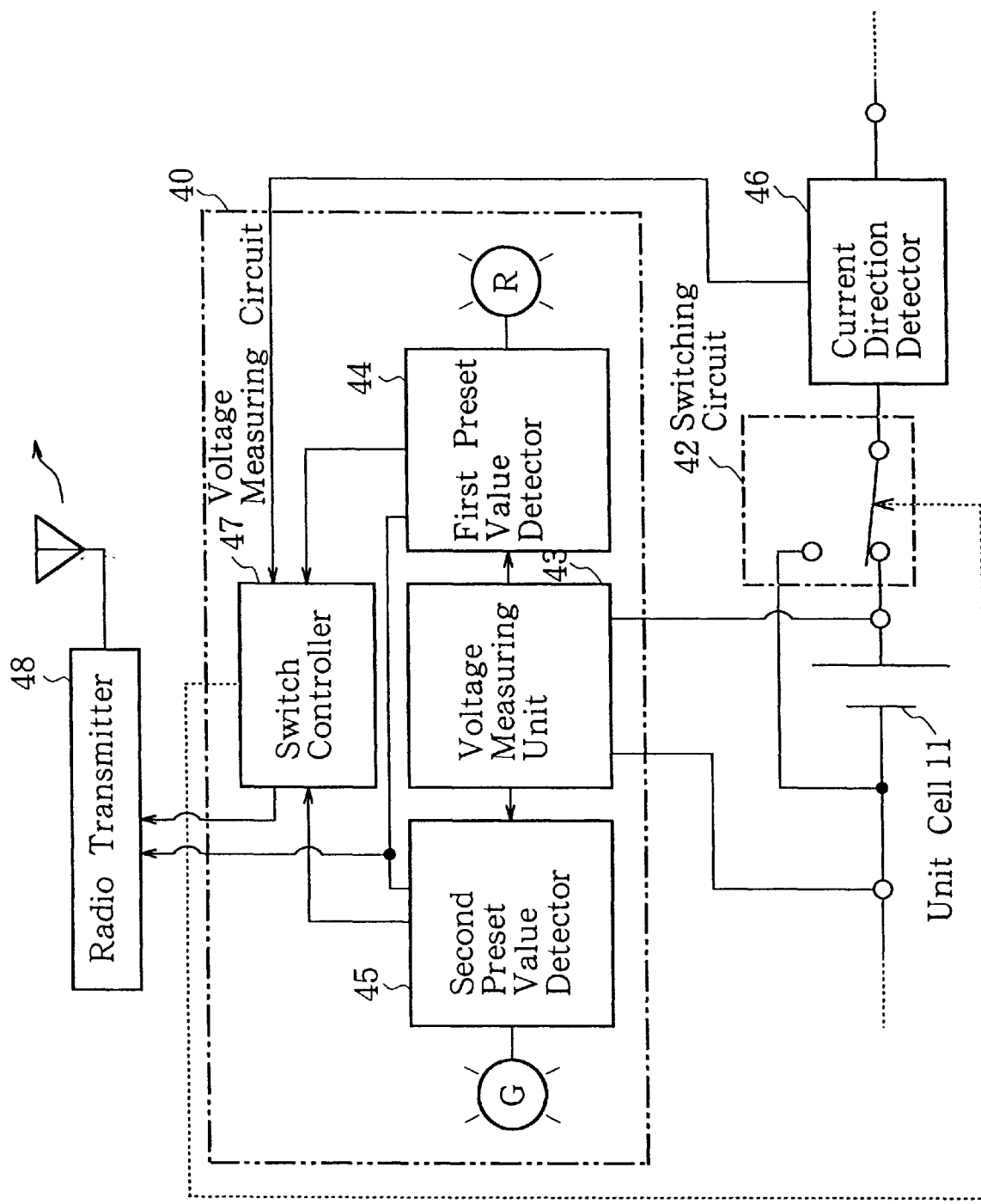
FIG. 33 is a block diagram showing the configuration of the essential parts of an eighth embodiment of the present invention.
Figure 34:
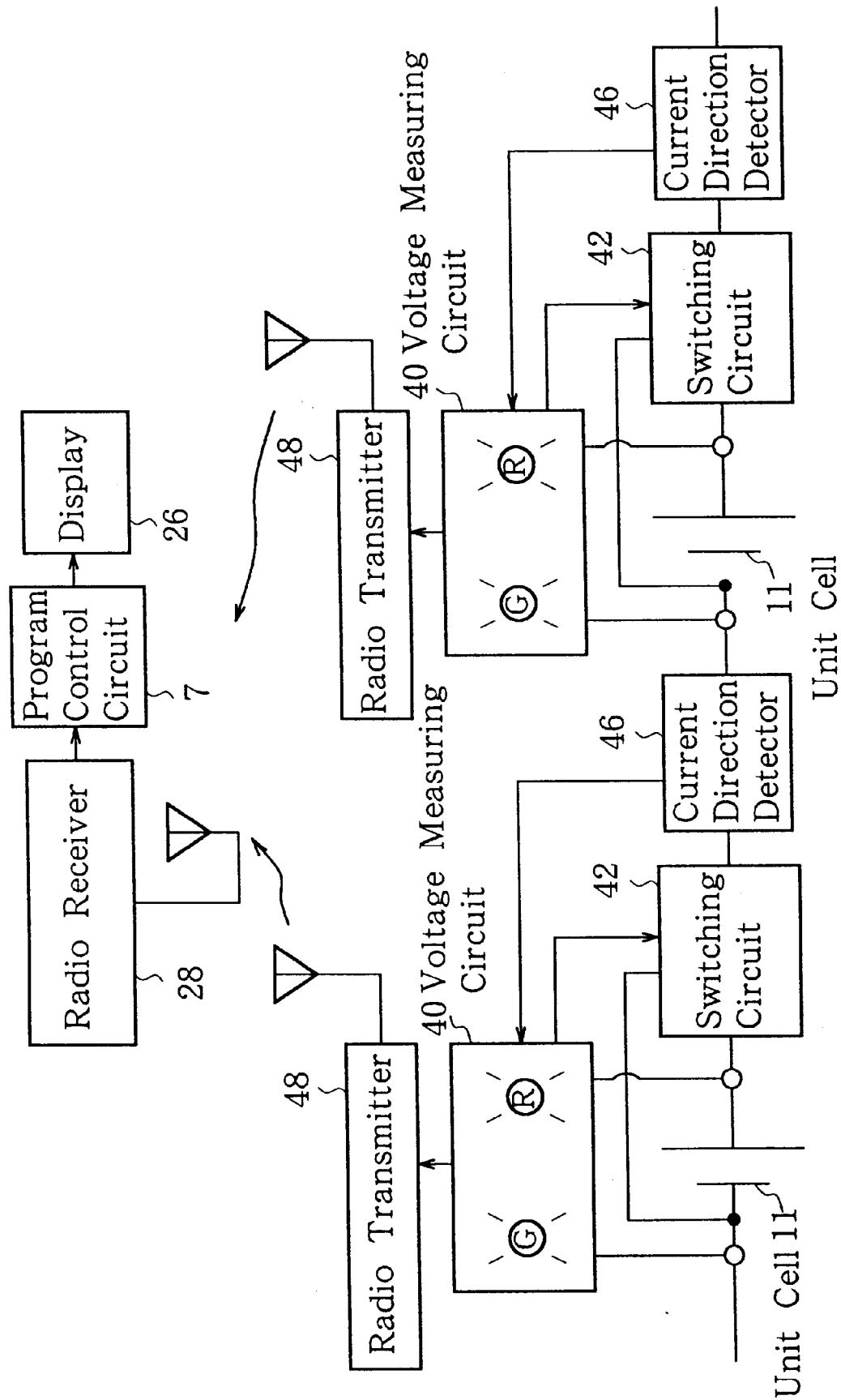
FIG. 34 is a block diagram showing the overall configuration of an eighth embodiment of the present invention.

The configuration of an eighth embodiment of the present invention will be explained with reference to FIG. 33 and FIG. 34. FIG. 33 is a block diagram showing the configuration of the essential parts of this eighth embodiment of the present invention, while FIG. 34 is a block diagram showing the overall configuration of this eighth embodiment. The distinguishing feature of this eighth embodiment of the present invention is that radio transmitter 48 is added to voltage measuring circuit 40. One radio transmitter 48 is fitted to each unit cell. In this embodiment, there are twenty-five. As opposed to this, only one radio receiver 28 is provided overall.

Each radio transmitter 48 transmits to radio receiver 28 the control state of switch controller 47 and the voltage measurement state of voltage measuring unit 43. As shown in FIG. 34, program control circuit 7 is connected to radio receiver 28. The aforementioned information is input to program control circuit 7, data processed, and displayed on display 26.

Figure 35:
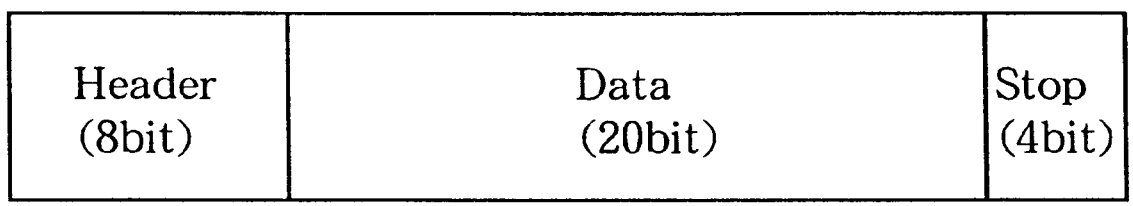
FIG. 35 shows the frame structure of the data signal transmitted by the radio transmitter in an eighth embodiment of the present invention.

Next, the operation of this eighth embodiment of the present invention will be explained. FIG. 35 shows the frame structure of the data signal transmitted by a radio transmitter 48. In every period t, radio transmitter 48 intermittently transmits, at 64 kb/s, a data signal with a 32-bit frame structure of the sort shown in FIG. 35. An ID which has been individually allocated to each radio transmitter 48 is transmitted in the header. Radio receiver 28 can therefore identify from which radio transmitter 48 the received frame has been transmitted. In this embodiment, a mobile phone cell was adapted and used for this arrangement. The aforementioned period t is set in advance to a different value for each radio transmitter 48. The time for one transmission is approximately 20 ms. Period t is set in the range from 20 to 60 seconds so as to differ slightly for each radio transmitter 48. By constituting in this manner, radio receiver 28 can receive the signal of each radio transmitter 48 separately even if the transmission timing of the plurality of radio transmitters 48 were to coincide, because in the next period the transmission timing would differ.

If a period is set to 20 seconds, then a time of 20 ms, within which one radio transmitter 48-i is transmitting, is one thousandth of the period. Accordingly, if radio transmitters 48-1 to 48-n respectively connected to twenty-five unit cells 11-1 to 11-n transmit with random timing, there is an approximately 1 in 400 chance of a collision. Even if there were a collision, because the period t varies for each transmitter, the two signals could be received separately in the next period without collision.

Figure 36:
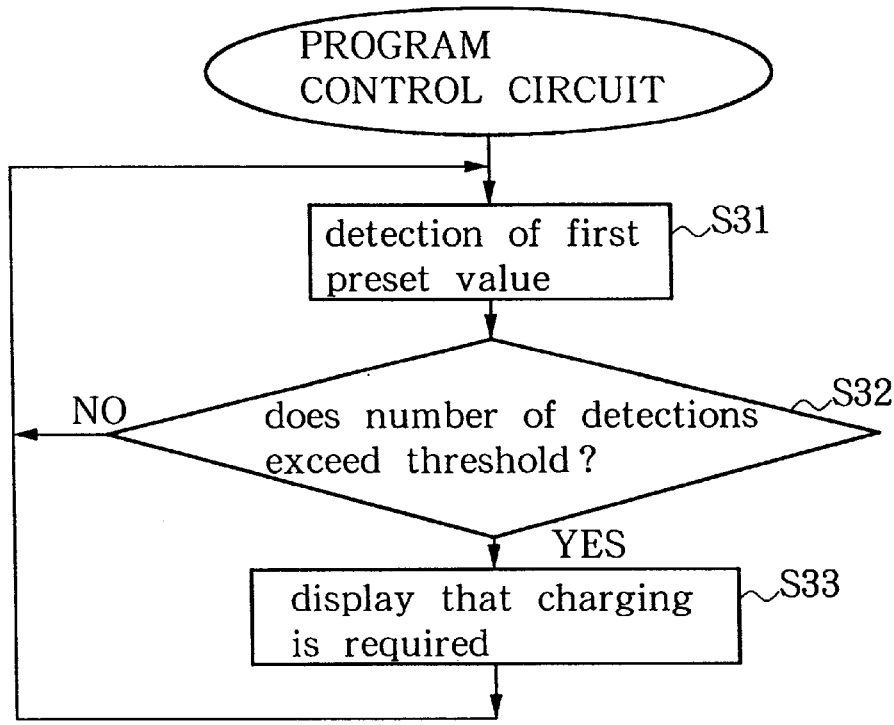
FIG. 36 is a flowchart showing the operating flow of the program control circuit relating to detection of the first preset value, in an eighth embodiment of the present invention.

The operation of program control circuit 7 will be explained with reference to FIG. 36 to FIG. 38. FIG. 36 is a flowchart showing the operation of program control circuit 7 relating to detection of the first preset value. If information to the effect that the first preset value has been detected is input to program control circuit 7 (S31), it is decided whether the number of unit cells at which the first preset value has been detected exceeds a threshold (S32). If the threshold is exceeded, an indication that charging is required is output to display 26 (S33). Display 26 is a liquid crystal display panel provided at the driver's seat.

In other words, it is known that the performance of a plurality of unit cells 11 has variability in the manner already explained, and that the voltage of a unit cell 11-i in which deterioration is advanced falls to the first preset value sooner than other unit cells 11. However, if the number of unit cells 11 at which the voltage has fallen to the first preset value is a large proportion of the total number of unit cells, it can be decided that on the whole charging is necessary. Program control circuit 7 outputs to display 26 a display for making information to this effect known to the driver or supervisor.

Figure 37:
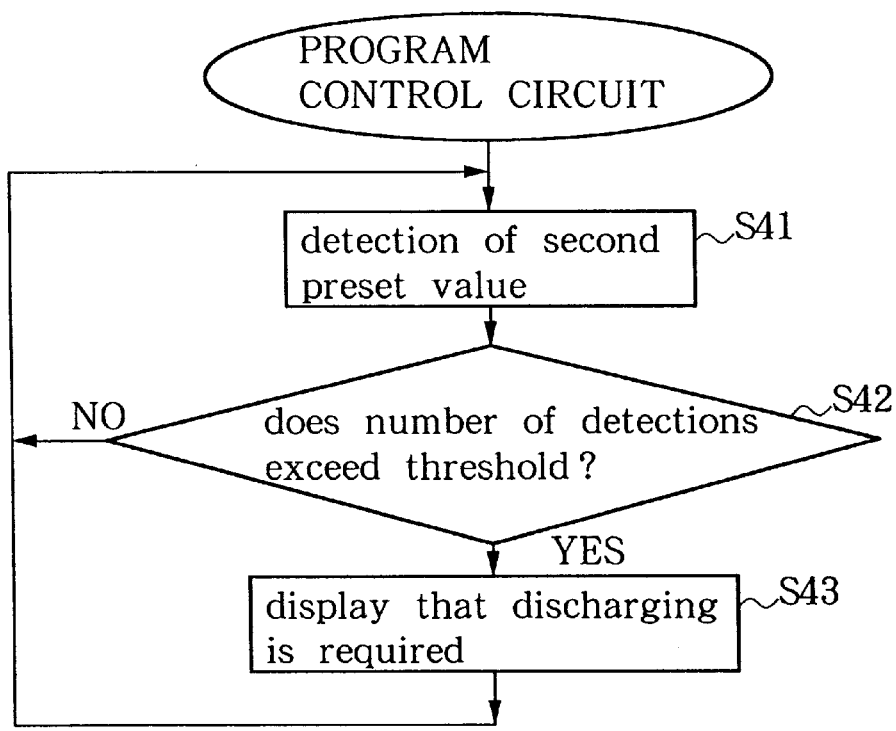
FIG. 37 is a flowchart showing the operating flow of the program control circuit relating to detection of the second preset value, in an eighth embodiment of the present invention.

FIG. 37 is a flowchart showing the operating flow of the program control circuit relating to detection of the second preset value. If information to the effect that the second preset value has been detected is input to program control circuit 7 (S41), it is decided whether the number of unit cells at which the second preset value has been detected exceeds a threshold (S42). If the threshold is exceeded, an indication that discharging is required is output to display 26 (S43).

In other words, if the number of unit cells 11 at which the voltage has risen to the second preset value is a large proportion of the total number of unit cells, it can be decided that on the whole charging has been completed. Program control circuit 7 outputs to display 26 a display for making information to this effect known to the driver or supervisor.

Figure 38:
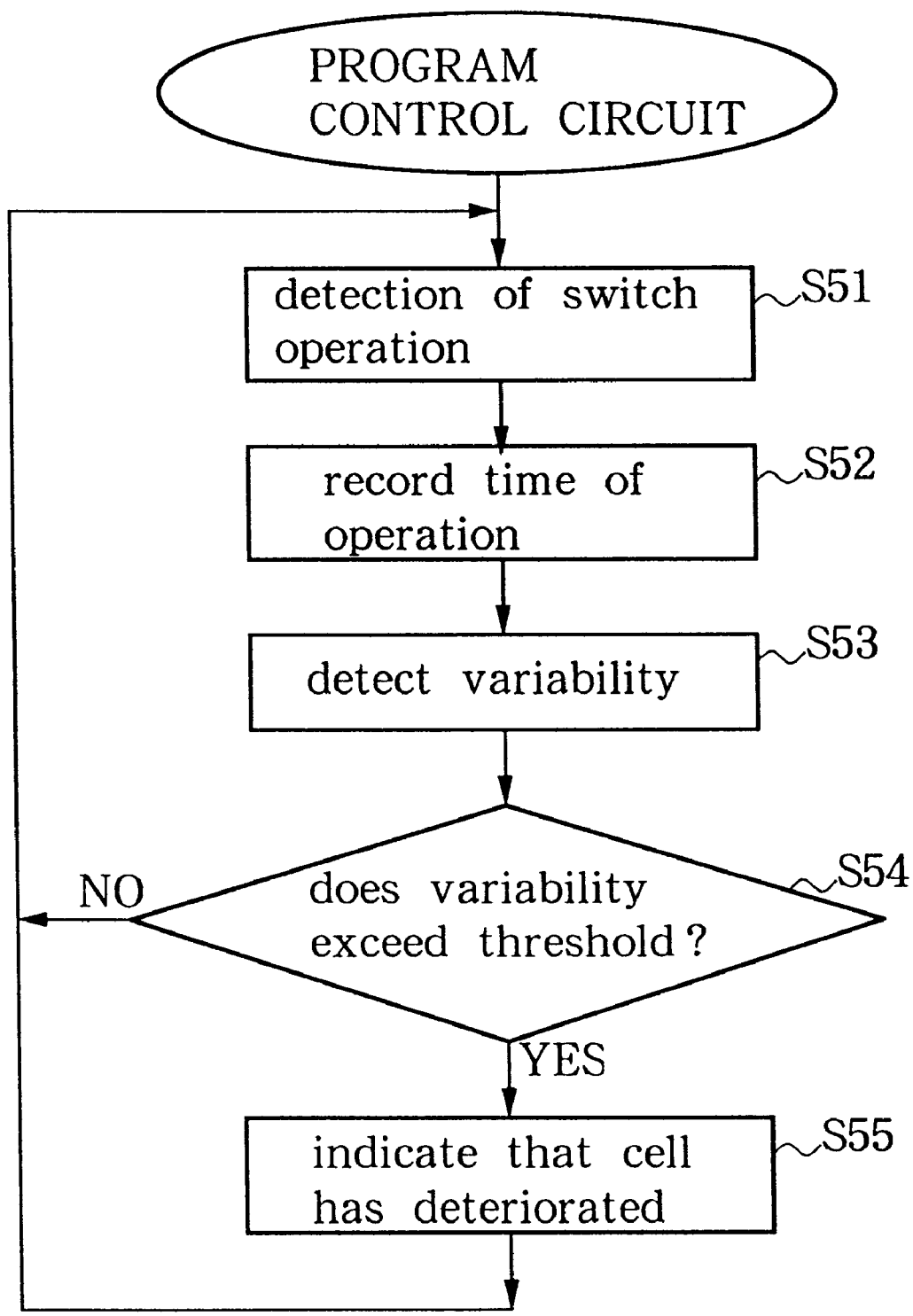
FIG. 38 is a flowchart showing the operating flow of the program control circuit relating to detection of switch operation, in an eighth embodiment of the present invention.

FIG. 38 is a flowchart showing the operating flow of the program control circuit relating to detection of switch operation. If information to the effect that switch operation has been detected is input to program control circuit 7 (S51), the time at which this operation took place is recorded (S52). Any variability in these operation times over a plurality of unit cells 11 is also detected (S53). If there is a unit cell 11-i for which this variability deviates from the average range of variability within which the great majority of other unit cells 11 are contained, and the magnitude of this deviation is greater than a threshold (S54), it is indicated for this unit cell 11-i that there is battery deterioration (S55).

Figure 39:
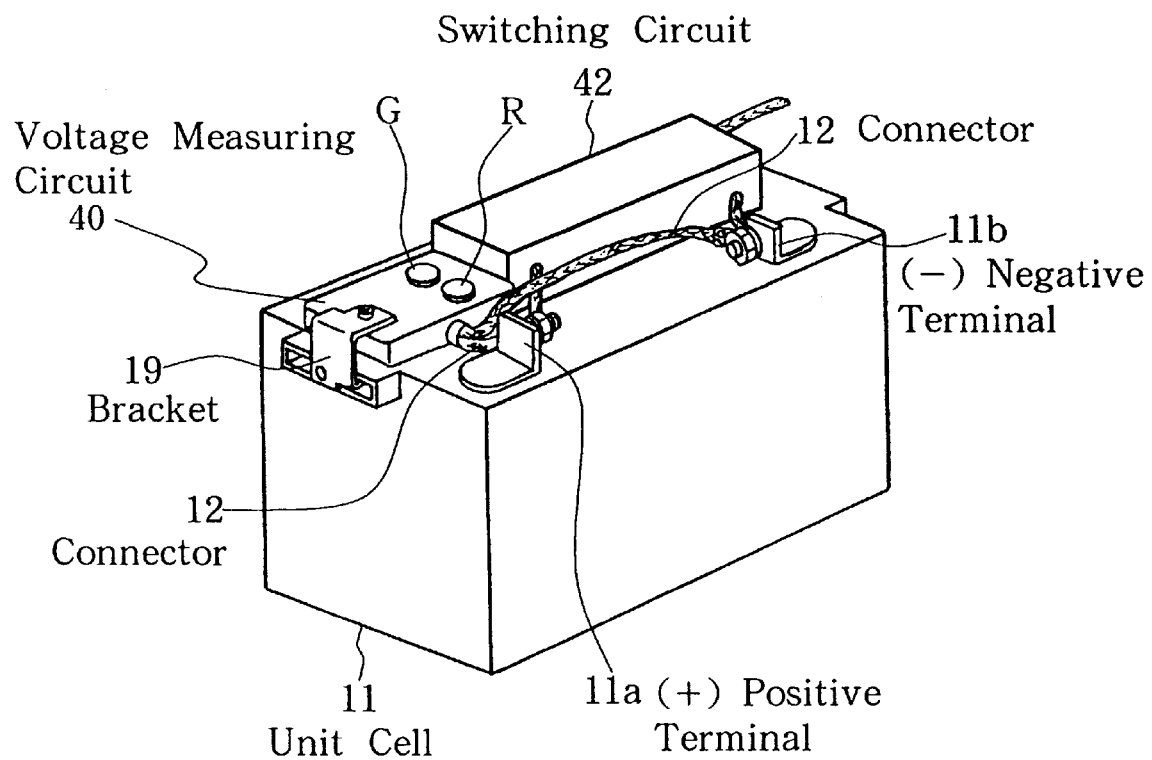
FIG. 39 is a perspective view showing an example of the external appearance of a unit cell in an eighth embodiment of the present invention.

In other words, a cell in which deterioration is advanced will generally have a shorter charging and discharging time than a cell which has not deteriorated. Cells in which deterioration is advanced can therefore be extracted by noticing any cells where the time required for completion of charging is especially short compared with other cells. In this embodiment, the time at which charging is completed can be detected by detecting the operation timing of switching circuit 42. Accordingly, this can be utilised to make a cell with a specific deterioration known to the driver or supervisor, by indicating on display 26 any cell where the time required for completion of charging is considerably shorter than other cells. The same notification can be made by recording the time at which the second preset value was reached. An example of the external appearance of a unit cell 11 according to this eighth embodiment of the present invention is shown in FIG. 39. Switching circuit 42 and voltage measuring circuit 40 incorporating radio transmitter 48 are provided on top of unit cell 11, connected to positive terminal 11a and negative terminal 11b by connectors 12, and fixed to the casing of unit cell 11 by means of bracket 19.

Figure 40:
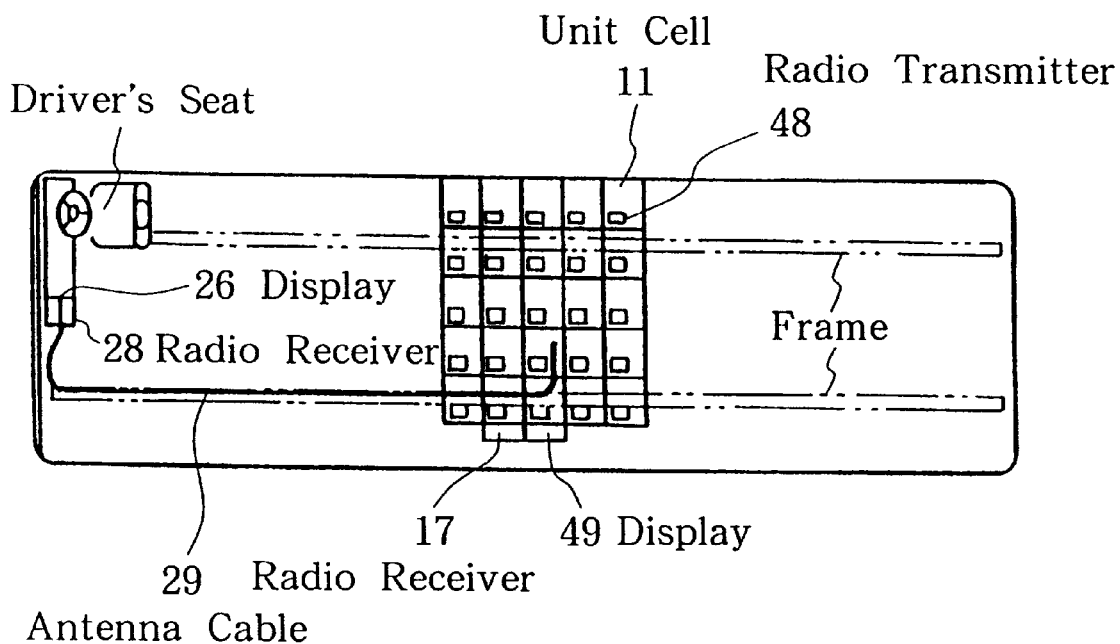
FIG. 40 is a plan view showing an example of the disposition of the display in an eighth embodiment of the present invention.
Figure 41:
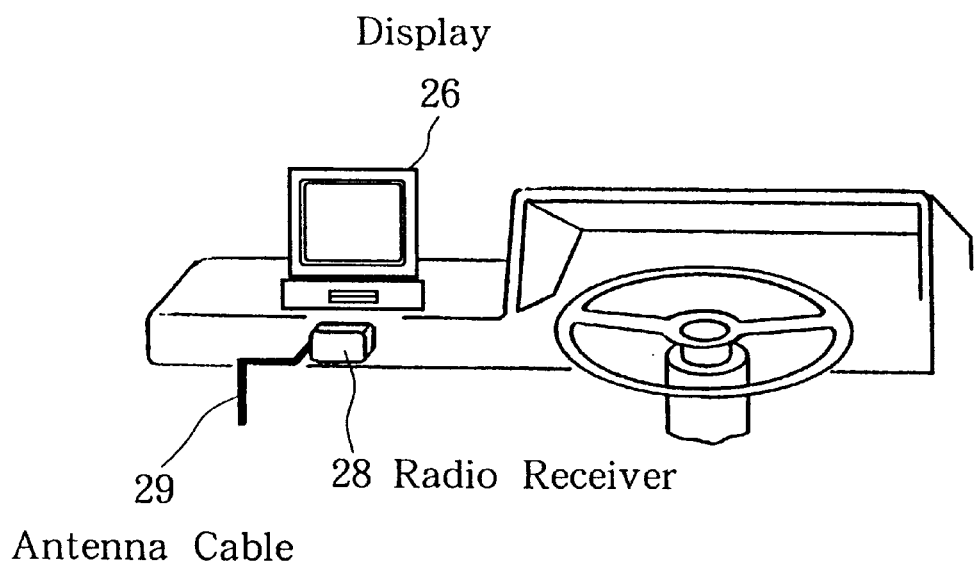
FIG. 41 shows an example of the installation of the display in an eighth embodiment of the present invention.
Figure 42:
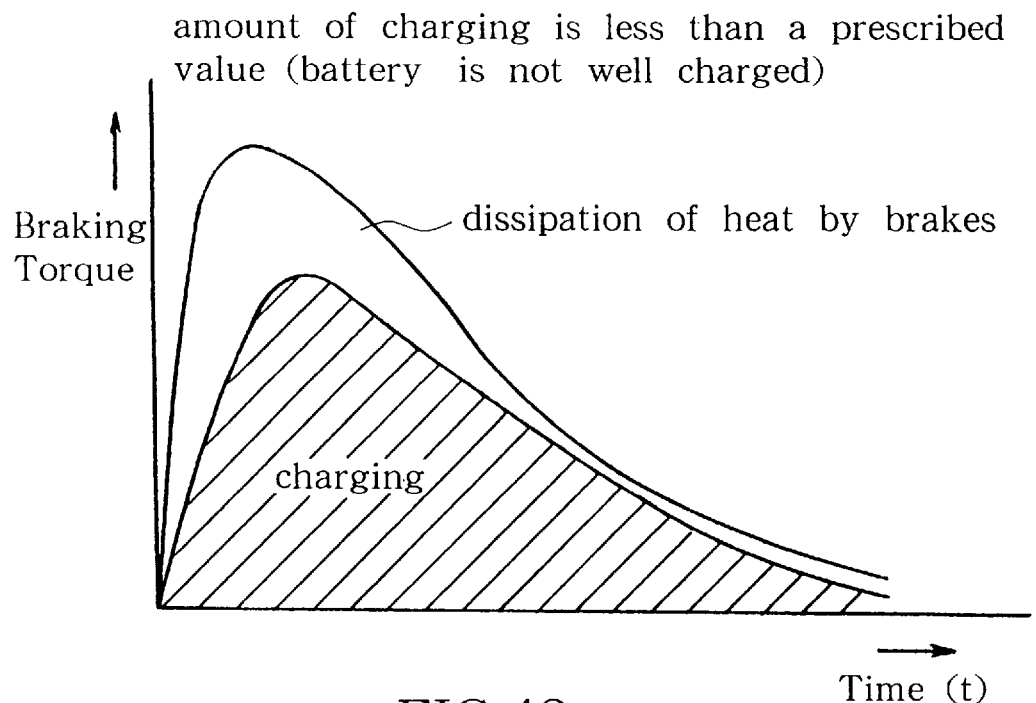
FIGS. 42($a$) and (b) serve to explain the regeneration of electrical energy which has been generated by electric braking.
Figure 42:
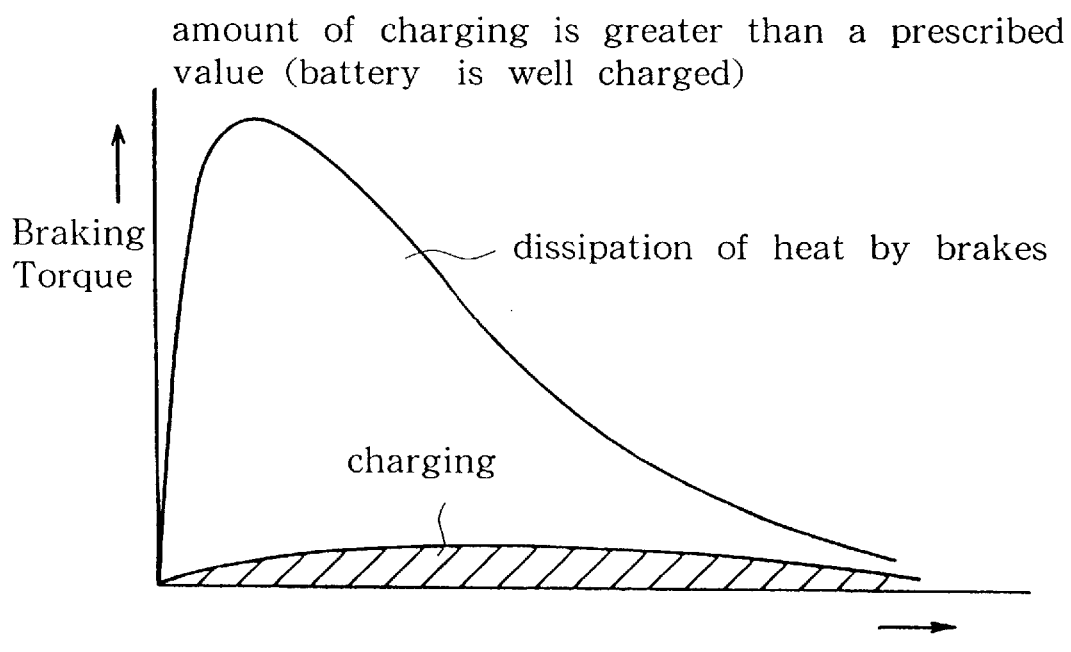
Figure 43:
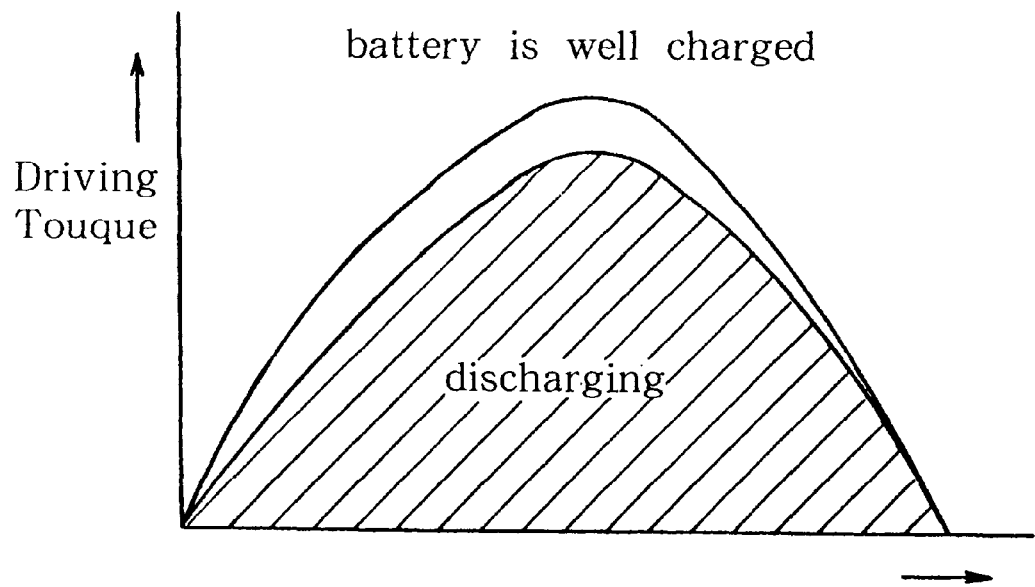
FIGS. 43($a$) and (b) serve to explain the generation of drive torque by discharge.
Figure 43:
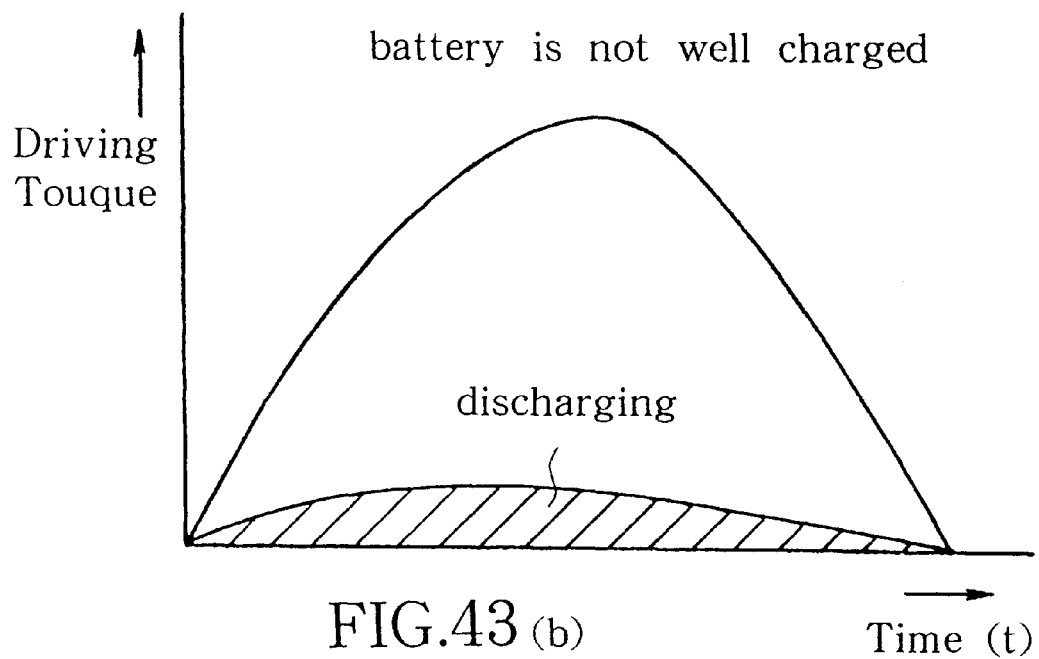

An example of the installation of display 26 in this eighth embodiment of the invention is shown in FIG. 40 and FIG. 41. As shown in FIG. 40, the driver or supervisor can ascertain the state of unit cells 11, without opening the battery compartment, by means of radio receiver 17 and display 49 installed in the battery compartment, and, via antenna cable 29, by means of radio receiver 28 and display 26 installed at the driver's seat.

This enables the management of unit cells to be carried out easily and rapidly. In particular, display 26 set up at the driver's seat as shown in FIG. 41 enables the driver to ascertain, while driving, the state of deterioration of unit cells 11, and whether or not charging and discharging is required.

We claim:

1. A control system for a vehicle-mounted battery, said system comprising:

a motor-generator coupled to a drive shaft of a vehicle;

a battery mounted on said vehicle;

an inverter provided between said battery and said motor-generator, said inverter being configured to transmit energy from said battery to said motor-generator and from said motor-generator to said battery;

inverter control means for controlling said inverter;

a battery sensor for detecting a battery current i of said battery;

a program control circuit comprising means for calculating a time integral $I=\int i \, dt + C$ of said battery current i, where C is an integration constant corresponding to an initial amount of charging; and current control means for controlling said battery current, said battery current comprising a charging current during regenerative braking and comprising a discharging current when said vehicle is being driven, said battery current being controlled in accordance with a function of said time integral I;

said battery comprising plural unit cells, said battery sensor comprising means for individually detecting respective terminal voltages of said unit cells, and said program control circuit comprising means for controlling said charging current during regenerative braking in accordance with said terminal voltages and for controlling said discharge current during driving of said vehicle in accordance with said terminal voltages.

2. The control system according to claim 1, further comprising a speed sensor for detecting a speed at which said vehicle is traveling and a rotation sensor for detecting a speed of rotation of said motor-generator;

said motor-generator comprising a polyphase alternating current rotating machine; and said inverter control means comprising means for sending a control output to said inverter in accordance with outputs of said speed sensor and said rotation sensor and in accordance with driver-operated inputs.

3. The system according to claim 1, wherein said battery sensor comprises means for detecting a temperature θ of said battery, and wherein said current control means controls said battery current in accordance with ηI, where η comprises a charging efficiency of said battery, said charging efficiency being determined as a function ηθ of said temperature.

4. The system according to claim 1, further comprising an interface circuit disposed between said battery sensor and said program control circuit, said interface circuit transmitting, with a radio signal, information output from said battery sensor.

5. The system according to claim 1, wherein said battery comprises a battery casing and wherein at least a portion of said battery sensor and a portion of said interface circuit are each set into said battery casing.

6. The system according to claim 5, wherein said at least a portion of said battery sensor and said at least a portion of said interface circuit form one unit, said unit being adapted to be freely detachably mounted to said battery casing.

7. The system according to claim 1, further comprising a display for displaying a charge warning, a residual amount of charging, and a battery replacement time, said display being connected to an output of said program control circuit.

8. The control system according to claim 7, wherein said program control circuit comprises a memory, said memory holding characteristic data representing standard battery charging and discharging volt-ampere characteristics and a plurality of sets of battery charging and discharging volt-ampere characteristics each set corresponding to a respective degree of battery deterioration;

said program control circuit further comprising means for referring to said characteristic data stored in said memory and for calculating information relating to battery deterioration.

9. The system according to claim 7, wherein said display is provided at a vehicle driver's seat, and where said display comprises means for indicating, in broad subdivisions, when said battery is in certain states including (i) a charged state (ii) a state of normal use, (iii) a state in which a charge is advisable, and (iv) a state in which a charge is necessary.

10. The system according to claim 9, wherein said display is provided at a vehicle driver's seat, and wherein said display comprises means for indicating, in broad subdivisions, when said battery is in certain states, including (i) a state of no deterioration, (ii) a state in which inspection is recommended, (iii) a state in which battery replacement is recommended, and (iv) a state in which battery replacement is necessary, said state in which inspection is recommended being indicated when a deterioration has been detected in some unit cells of said battery.

11. The system according to claim 7, wherein said display is provided at a vehicle driver's seat, and wherein said display comprises means for indicating, in broad subdivisions, when said battery is in certain states, including (i) a state of no deterioration, (ii) a state in which inspection is recommended, (iii) a state in which battery replacement is recommended, and (iv) a state in which battery replacement is necessary, said state in which inspection is recommended being indicated when a deterioration has been detected in some unit cells of said battery.

12. The system according to claim 7, wherein said display comprises at least two subdivisions, including a first subdivision and a second subdivision, said first subdivision comprising means for indicating that said battery is in good condition and said second subdivision comprising means for indicating that said battery is in a condition in which it should be replaced.

13. The system according to claim 12, wherein said display further comprises an intermediate subdivision located between said first subdivision and said second subdivision.

14. The system according to claim 13, wherein said display further comprises lighting display means for indicating that a degree of battery deterioration is large.

15. A control system for a battery mounted on a vehicle comprising a drive shaft, a driving system, an internal combustion engine forming part of said driving system, and a braking system, said control system comprising:

a motor-generator coupled to said drive shaft of said vehicle;

a battery mounted on said vehicle, said battery comprising plural unit cells, each said unit cell comprising a terminal set;

a power direction controller directing charging electrical energy to said battery when said braking system is actuated, and directing discharging electrical energy from said battery to said motor-generator when said driving system is actuated, said motor-generator applying an auxiliary driving force to said internal combustion engine when said motor-generator receives said discharging electrical energy from said battery; and a battery sensor for detecting respective terminal voltages across respective ones of said terminal sets, said power direction controller directing charging electrical energy to said battery or directing discharging electrical energy from said battery in accordance with said detected respective terminal voltages.

* * * * *